US008975127B2

(12) United States Patent
Terada et al.

(10) Patent No.: US 8,975,127 B2
(45) Date of Patent: *Mar. 10, 2015

(54) SEMICONDUCTOR DEVICE AND METHOD OF MANUFACTURING THE SAME

(71) Applicant: Renesas Electronics Corporation, Kawasaki (JP)

(72) Inventors: Yusuke Terada, Tokyo (JP); Shigeya Toyokawa, Tokyo (JP); Atsushi Maeda, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/060,464

(22) Filed: Oct. 22, 2013

(65) Prior Publication Data

US 2014/0051219 A1 Feb. 20, 2014

Related U.S. Application Data

(63) Continuation of application No. 13/281,454, filed on Oct. 26, 2011, now Pat. No. 8,604,526, which is a continuation of application No. 12/133,362, filed on Jun. 4, 2008, now Pat. No. 8,072,035.

(30) Foreign Application Priority Data

Jun. 11, 2007 (JP) ................................. 2007-153840
Mar. 19, 2008 (JP) ................................... 2008-71291

(51) Int. Cl.
*H01L 29/66* (2006.01)
*H01L 21/8234* (2006.01)
(Continued)

(52) U.S. Cl.
CPC .. *H01L 29/66477* (2013.01); *H01L 21/823456* (2013.01); *H01L 21/823462* (2013.01);
(Continued)

(58) Field of Classification Search
USPC ............... 257/4, 288, 409, 500, 758; 438/197
See application file for complete search history.

(56) References Cited

U.S. PATENT DOCUMENTS 6,528,848 B1  3/2003  Hoshino et al.
6,780,717 B2  8/2004  Yasuoka et al.
(Continued)

FOREIGN PATENT DOCUMENTS

JP         4-171938 A    6/1992
JP        11-067904 A    3/1999
(Continued)

OTHER PUBLICATIONS

Japanese Office Action dated Feb. 12, 2013 issued in Japanese Patent Application No. 2008-071291 (Along with English Translation).
(Continued)

*Primary Examiner* — Whitney T Moore
(74) *Attorney, Agent, or Firm* — Miles & Stockbridge P.C.

(57) ABSTRACT

In an LCD driver, in a high voltage resistant MISFET, end portions of a gate electrode run onto electric field relaxing insulation regions. Wires to become source wires or drain wires are formed on an interlayer insulation film of the first layer over the high voltage resistant MISFET. At this moment, when a distance from an interface between a semiconductor substrate and a gate insulation film to an upper portion of the gate electrode is defined as "a", and a distance from the upper portion of the gate electrode to an upper portion of the interlayer insulation film on which the wires are formed is defined as "b", a relation of a>b is established. In such a high voltage resistant MISFET structured in this manner, the wires are arranged so as not to be overlapped planarly with the gate electrode of the high voltage resistant MISFET.

16 Claims, 37 Drawing Sheets

(51) Int. Cl.
  H01L 29/06 (2006.01)
  H01L 29/78 (2006.01)
  H01L 21/762 (2006.01)
  H01L 21/768 (2006.01)
  H01L 23/532 (2006.01)

(52) U.S. Cl.
  CPC ...... *H01L21/823475* (2013.01); *H01L 21/823481* (2013.01); *H01L 29/0653* (2013.01); *H01L 29/7836* (2013.01); H01L 21/76229 (2013.01); H01L 21/76837 (2013.01); H01L 23/53295 (2013.01)
  USPC .......................................................... 438/197

(56) References Cited

U.S. PATENT DOCUMENTS

| | | | |
|---|---|---|---|
| 7,176,520 B2 | 2/2007 | Miyake et al. |
| 7,235,849 B2 | 6/2007 | Takami |
| 7,259,054 B2 | 8/2007 | Yasuoka et al. |
| 7,867,867 B2 | 1/2011 | Jeong et al. |
| 2001/0050386 A1 | 12/2001 | Suzuki et al. |
| 2002/0000633 A1 | 1/2002 | Miyashita |
| 2002/0190295 A1 | 12/2002 | Suzuki et al. |
| 2003/0104671 A1 | 6/2003 | Yasuoka et al. |
| 2004/0251505 A1 | 12/2004 | Yasuoka et al. |
| 2006/0050566 A1 | 3/2006 | Shiba et al. |
| 2007/0029676 A1 | 2/2007 | Takaura et al. |
| 2007/0096247 A1 | 5/2007 | Yasuoka et al. |
| 2007/0102757 A1 | 5/2007 | Miyake et al. |
| 2007/0224761 A1 | 9/2007 | Takami |
| 2008/0056011 A1 | 3/2008 | Shiba et al. |
| 2009/0154253 A1 | 6/2009 | Shiba et al. |
| 2009/0209078 A1 | 8/2009 | Yasuoka et al. |
| 2010/0258876 A1 | 10/2010 | Miyake et al. |
| 2011/0163386 A1 | 7/2011 | Jeong et al. |
| 2011/0254087 A1 | 10/2011 | Miyake et al. |

FOREIGN PATENT DOCUMENTS

| | | |
|---|---|---|
| JP | 2001-244436 (A) | 9/2001 |
| JP | 2002-170888 A | 6/2002 |
| JP | 2004-096119 A | 3/2004 |
| JP | 2004-288763 A | 10/2004 |
| JP | 2005-045147 A | 2/2005 |
| JP | 2005-093887 A | 4/2005 |
| JP | 2005-116744 A | 4/2005 |
| JP | 2005-244250 A | 9/2005 |
| JP | 2006-080247 (A) | 3/2006 |
| JP | 2007-042804 (A) | 2/2007 |
| JP | 2007-067436 A | 3/2007 |
| JP | 2007-134712 A | 5/2007 |
| JP | 2007-141934 A | 6/2007 |
| JP | 2007-173314 A | 7/2007 |
| WO | WO 2005/024931 | 3/2005 |

OTHER PUBLICATIONS

Korean Office Action dated Mar. 25, 2014 issued in Korean Patent Application No. 10-2008-46782 with English Translation.
English language translation of Korean Office Action dated Oct. 2, 2014 issued in Korean Patent Application No. 10-2013-26571.

FIG. 29

| PHOTOLITHOGRAPHY PROCESS | INSPECTION ITEM | UNEVENNESS (nm) |
|---|---|---|
| GATE ELECTRODE 10b | DIMENSIONAL ERROR | 40 |
| PLUG PLG1 | STACK GAP (VS GATE ELECTRODE) | 40 |
| WIRE HL1 | DIMENSIONAL ERROR | 40 |
| WIRE HL1 | STACK GAP (VS PLUG) | 70 |

SEMICONDUCTOR DEVICE AND METHOD OF MANUFACTURING THE SAME

CROSS-REFERENCE TO RELATED APPLICATION

The present application claims priority from Japanese Patent Application No. JP 2007-153840 filed on Jun. 11, 2007, and No. JP 2008-71291 filed on Mar. 19, 2008, the content of which is hereby incorporated by reference into this application.

TECHNICAL FIELD OF THE INVENTION

The present invention relates to a semiconductor device and a method of manufacturing the same, and particularly, it relates to an effective technology when applied to a semiconductor device equipped with a relatively high voltage resistant MISFET such as a Liquid Crystal Display (LCD) driver and the like and a method of manufacturing the same.

BACKGROUND OF THE INVENTION

In Japanese Patent Application Laid-Open Publication No. 2005-116744 (Patent Document 1), a technology of forming a high voltage resistant transistor and a low voltage resistant transistor on a same substrate is described. In this Patent Document 1, it is said that the high voltage resistant transistor has an offset insulating layer for relaxing an electric field. A guard ring formed in the high voltage resistant transistor formation region is connected to a wire (a wire of the lowest layer) formed on an interlayer insulation film of the first layer. In contrast, a source region or a drain region of the high voltage resistant transistor is connected to a wire (not the wire of the lowest layer) formed on an interlayer insulation film of a second layer. In other words, the source region or the drain region of the high voltage resistant transistor is connected to a wire arranged on the interlayer insulation film of the second layer by a plug that penetrates both the interlayer insulation film of the first layer and the interlayer insulation film of the second layer at once.

In Japanese Patent Application Laid-Open Publication No. 4-171938 (Patent Document 2), a technology of forming a high voltage resistant n-channel FET and a low voltage resistant n-channel FET on a same substrate is described. In this Patent Document 2, in the low voltage resistant n-channel FET, a source region or a drain region thereof is connected to a wire of the lowest layer formed on an interlayer insulation film of the first layer. In contrast, in the high voltage resistant n-channel FET, a source region or a drain region thereof is connected to, not the wire of the lowest layer, but a wire formed on an interlayer insulation film of a second layer.

SUMMARY OF THE INVENTION

In recent years, the LCD that uses liquid crystal as a display element has been spreading rapidly. This LCD is controlled by a driver to drive the LCD. The LCD driver is configured with a semiconductor chip, and it is mounted on, for example, a glass substrate. The semiconductor chip configuring the LCD driver has a structure in which a plurality of transistors and multilayer wirings are formed over a semiconductor substrate, and a bump electrode is formed on the surface. The semiconductor chip is mounted on the glass substrate via the bump electrode formed on the surface.

In the plurality of transistors (MISFETs) formed in the LCD driver, there are low voltage resistant MISFETs and high voltage resistant MISFETs. That is, in the LCD driver, there are usually a logic circuit configured with a low voltage resistant MISFET drove at a voltage of approximately 5 V, and a circuit that applying a voltage of approximately 20 V to 30 V to the electrode of the LCD. In order to apply the voltage of approximately 20 V to 30 V to the electrode of the LCD, a level shift circuit is connected to the logic circuit drove at a voltage of approximately 5 V, and a switching element is connected thereto via the level shift circuit. This switching element is configured with an MISFET drove at a voltage of 20 V to 30 V, so called as a high voltage resistant MISFET.

As described above, the LCD driver comprises a low voltage resistant MISFET and a high voltage resistant MISFET on the same semiconductor substrate. An interlayer insulation film is formed on the low voltage resistant MISFET and the high voltage resistant MISFET formed on the same semiconductor substrate, and wires are formed on this interlayer insulation film. The wires and the MISFETs are connected by a plug penetrating the interlayer insulation film. Generally, the wire connecting to a source region or a drain region of the high voltage resistant MISFET is not formed on an interlayer insulation film of a first layer, but is formed on an interlayer insulation film of a second layer which is further formed on the interlayer insulation film of the first layer. In other words, since in the high voltage resistant MISFET, a relatively high voltage of approximately 20 V to 30 V is used, in order to secure voltage resistance between the wire and the high voltage resistant MISFET (gate electrode), the wire is not arranged on the interlayer insulation film of the first layer, but the wire is arranged on the interlayer insulation film of the second layer to secure the voltage resistance of the high voltage resistant MISFET. Therefore, the high voltage resistant MISFET and the wire are connected via a plug penetrating the interlayer insulation film of the first layer, and successively, via a plug penetrating the interlayer insulation film of the second layer.

In recent years, miniaturization of the LCD driver is demanded. For this purpose, a diameter of the plug (contact plug) to connect the MISFET and the wire of the LCD driver is reduced. For example, concretely, the diameter of the plug is largely reduced to 0.24 µm or 0.14 µm. However, when the diameter of the plug is reduced, a problem that the resistance of the plug becomes large conspicuously occurs. In particular, in the high voltage resistant MISFET, since the high voltage resistant MISFET and the wire are connected each other by the plug penetrating both the interlayer insulation film of the first layer and the interlayer insulation film of the second layer, when the diameter of the plug is reduced, an aspect ratio of the plug becomes large and the resistance increases. Therefore, in the LCD driver, the wire is formed on the interlayer insulation film of the first layer, and a wire width of the wire formed on the interlayer insulation film of the first layer is made wide and the number of plugs to connect the interlayer insulation film of the first layer and the interlayer insulation film of the second layer is increased, whereby the low resistance of the plug is secured. By forming the wire on the interlayer insulation film of the first layer, there is no need to directly connect the plug penetrating the interlayer insulation film of the first layer and the plug that penetrates the interlayer insulation film of the second layer, so that the aspect ratio of the plug can be reduced. Therefore, the high resistance due to reduction of the plug diameter can be suppressed.

Further, by thinning a film thickness of the interlayer insulation film of the first layer, the aspect ratio of the plug formed in the interlayer insulation film of the first layer is made small. In this manner, in chip shrinking of the LCD driver, the film thickness of the interlayer insulation film of the first layer is made thin, and the wire is formed on the interlayer insulation film of the first layer. The wire width of the wire formed on the interlayer insulation film of the first layer is made wide, and the number of plugs to connect the interlayer insulation film of the first layer and the interlayer insulation film of the second layer is increased. Since the wire width of the wire formed on the interlayer insulation film of the first layer is made wide, a source wire to be connected to the source region of the high voltage resistant MISFET or a drain wire to be connected to the drain area of the high voltage resistant MISFET is formed so as to have a region which is planarly overlapped with the gate electrode of the high voltage resistant MISFET.

In this manner, the high resistance of the plug with the miniaturization of the LCD driver can be restrained, but another problem newly occurs. In other words, since the film thickness of the interlayer insulation film of the first layer is made thin, and the LCD driver is configured so that the source wire and the drain wire and the gate electrode of the high voltage resistant MISFET should be overlapped planarly, voltage resistance failures occur between the gate electrode of the high voltage resistant MISFET and the source wire, or between the gate electrode of the high voltage resistant MISFET and the drain region. As causes of an occurrence of the voltage resistance failure, firstly, there is the fact that the interlayer insulation film of the first layer to be formed on the gate electrode of the high voltage resistant MISFET tends to become extremely thin due to variation in the film formation step of the interlayer insulation film of the first layer and the polishing step by Chemical Mechanical Polishing (CMP) and the like. For this fact, it is considered that the voltage resistance failure occurs between the gate electrode and the source wire or the drain wire formed on the interlayer insulation film of the first layer.

As the second cause, there is the fact that, in the high voltage resistant MISFET, the film thickness of the gate insulation film is thick. In the high voltage resistant MISFET, an electric field relaxing insulation region protruding slightly from the semiconductor substrate is formed in the source region or the drain region; an end portion of the gate electrode runs onto this electric field relaxing insulation region; and accordingly, the height of the gate electrode is higher than that of the low voltage resistant MISFET.

Further, as the third cause, there is the fact that a drive voltage of the high voltage resistant MISFET is approximately 20 V to 30 V, and is higher than that of the low voltage resistant MISFET. From the facts, in the structure of the present LCD driver, it is understood that it is difficult to realize both of suppressing the high resistance of the plug due to the size reduction and of improving the voltage resistance failure between the gate electrode of the high voltage resistant MISFET and the wire at the same time.

The object of the present invention is to provide a technology to suppress the high resistance of the plug due to the miniaturization in a semiconductor device comprising the high voltage resistant MISFET and the low voltage resistant MISFET such as the LCD driver and the like, and to improve the voltage resistance failure between the gate electrode of the high voltage MISFET and the wire.

The above and other objects and novel characteristics of the present invention will be apparent from the description of this specification and the accompanying drawings.

The typical ones of the inventions disclosed in this application will be briefly described as follows.

A semiconductor device according to the present invention comprises: (a1) a gate insulation film formed on a semiconductor substrate; (a2) a gate electrode formed on the gate insulation film; (a3) a MISFET having a source region and a drain region to align with the gate electrode; (b) an insulation film formed over the MISFET; (c) a first plug penetrating the insulation film and electrically connected to the source region; and (d) a second plug penetrating the insulation film and electrically connected to the drain region. The semiconductor device further comprises: (e) a source wire formed over the insulation film and electrically connected to the first plug; and (f) a drain wire formed on the insulation film and electrically connected to the second plug. Herein, when a distance from an interface between the semiconductor substrate and the gate insulation film to an upper surface of the gate electrode is defined as "a", and a distance from the upper surface of the gate electrode to an upper portion of the insulation film on which the source wire and the drain wire are formed is defined as "b", a relation of a>b is established. At this time, the semiconductor device is characterized by that the gate electrode and the source wire are arranged not to be overlapped planarly with each other, and the gate electrode and the drain wire are arranged not to be overlapped planarly with each other.

In addition, a method of manufacturing a semiconductor device according to the present invention comprises the steps of: (a) forming an element isolation region and an electric field relaxing insulation region in a semiconductor substrate; (b) forming a gate insulation film over the semiconductor substrate; and (c) forming a pair of low concentration impurity diffusion regions so that each of the impurity regions contains the electric field relaxing insulation region. The method further comprises the steps of: (d) forming a gate electrode over the gate insulation film; and (e) forming a side-wall on a side wall of both sides of the gate electrode. The method further includes the step of (f) forming a pair of high concentration impurity diffusion regions in each region contained in the pair of low concentration impurity diffusion regions and existing outside the electric field relaxing insulation region, and forming a source region configured with one of the pair of low concentration impurity diffusion regions and one of the pair of high concentration impurity diffusion regions included therein, and a drain region configured with the other one of the pair of low concentration impurity diffusion regions, and the other one of the pair of high concentration impurity diffusion regions included therein. The method further comprises the steps of: (g) forming an insulation film so as to cover the gate electrode; and (h) forming a first plug penetrating the insulation film and reaching the source region, and a second plug penetrating the insulation film and reaching the drain region. The method further comprises the step of (i) forming a source wire connected to the first plug over the insulation film, and a drain wire connected to the second plug over the insulation film. Herein, when a distance from an interface between the semiconductor substrate and the gate insulation film to an upper portion of the gate electrode is defined as "a", and a distance from the upper portion of the gate electrode to an upper surface of the insulation film on which the source wire and the drain wire are formed is defined as "b", a relation of a>b is established. In this situation, the method is characterized by that the gate electrode and the source wire are formed not to be overlapped planarly with each other, and the gate electrode and the drain wire are formed not to be overlapped planarly with each other.

The effects obtained by typical aspects of the present invention will be briefly described below.

In a semiconductor device comprising the high voltage resistant MISFET and the low voltage resistant MISFET such as the LCD driver and the like, it is possible to suppress the high resistance of the plug due to the miniaturization of a semiconductor device, and to improve the voltage resistance failure between the gate electrode of the high voltage resistant MISFET and the wire.

BRIEF DESCRIPTIONS OF THE DRAWINGS

FIG. 29 is a table concretely showing a dimensional error of a pattern in the photolithography process and a stack gap between patterns;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted. Also, hatching is used even in a plan view so as to make the drawings easy to see.

(First Embodiment)

Figure 1:
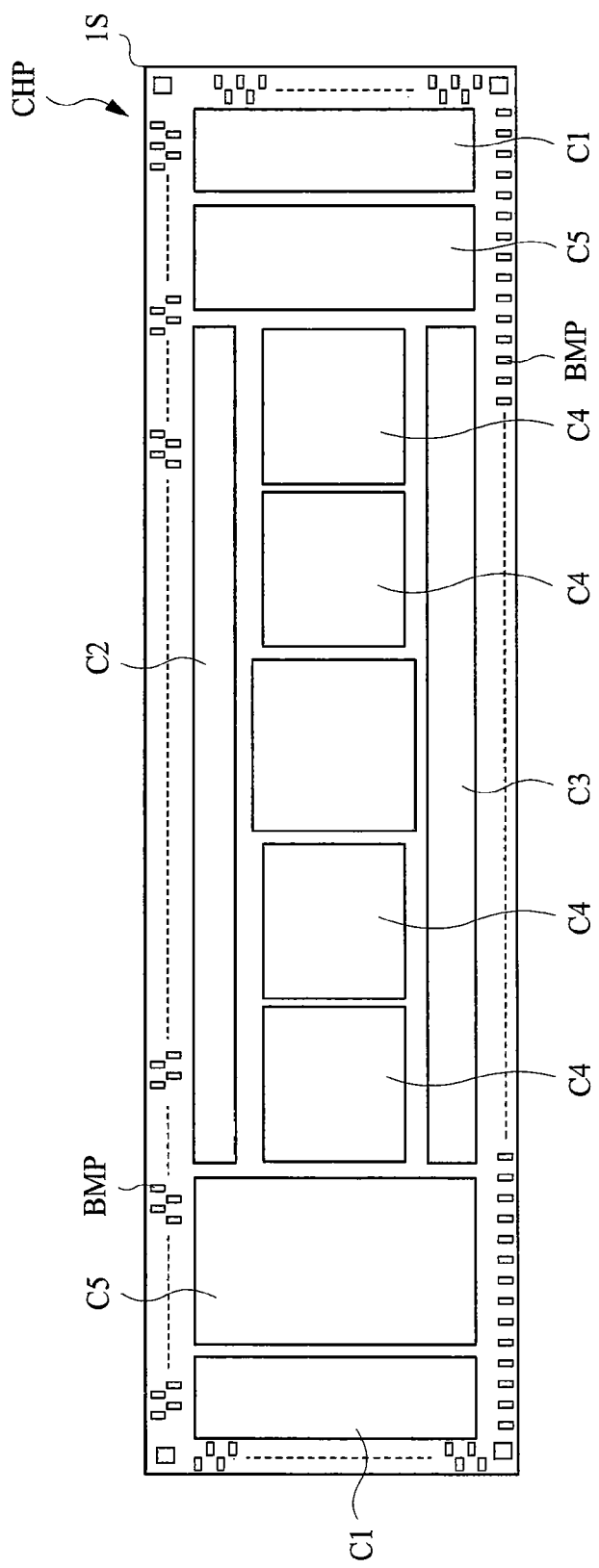
FIG. 1 is a plan view showing a semiconductor chip (LCD driver) according to an embodiment of the present invention.

First, a semiconductor chip for an LCD driver according to the present embodiment will be explained. FIG. 1 is a plan view showing a structure of a semiconductor chip CHP (semiconductor device) according to the present embodiment. The semiconductor chip CHP according to the present embodiment is an LCD driver. In FIG. 1, the semiconductor chip CHP has a semiconductor substrate 1S formed into, for example, an elongated rectangle shape, and the LCD driver to drive, for example, a liquid crystal display device is formed on a main surface of the semiconductor substrate 1S. This LCD driver has a function to supply a voltage to each pixel of cell arrays constituting the LCD and control directions of liquid crystal molecules, and includes gate drive circuits C1, a source drive circuit C2, a liquid crystal drive circuit C3, graphic Random Access Memories (RAM) C4 and peripheral circuits C5.

In the vicinity of the outer circumference of the semiconductor chip CHP, a plurality of bump electrodes BMP are arranged along an outer circumference of the semiconductor chip CHP at specified intervals. The plurality of bump electrodes BMP are arranged on an active region on which elements and wires of semiconductor chip CHP are formed. In the plurality of bump electrodes BMP, there are bump electrodes for integrated circuits that are necessary for a structure of the integrated circuit, and dummy bump electrodes that are not necessary for the structure of the integrated circuit. In the vicinities of one long side and two short sides of the semiconductor chip CHP, the bump electrodes BMP are arranged in a zigzag shape. The plurality of bump electrodes BMP arranged in a zigzag shaped are mainly bump electrodes for gate output signals or source output signals. The bump electrodes BMP arranged in a zigzag shape at a center in the long side of the semiconductor chip CHP are bump electrodes for the source output signals, and the bump electrodes BMP arranged in a zigzag shape in the vicinities of both corners of the long side of the semiconductor chip CHP and both the short sides of the semiconductor chip CHP are bump electrodes for the gate output signals. By adopting such a zigzag arrangement, it is possible to arrange the bump electrodes BMP for the gate output signals and the bump electrodes BMP of the source output signals that need many numbers, while suppressing increase of the size of the semiconductor chip CHP. In other words, it is possible to increase the number of the bump electrodes while reducing the chip size.

In addition, in the vicinity of the other long side of the semiconductor chip CHP, bump electrodes BMP are arranged in a straight line arrangement rather than in the zigzag arrangement. The bump electrodes BMP arranged in the straight line arrangement are bump electrodes BMP for digital input signals or analog input signals. Further, in the vicinity of the four corners of the semiconductor chip CHP, dummy bump electrodes are formed. Note that, in FIG. 1, the example where the bump electrodes BMP for the gate output signals or source output signals are arranged in the zigzag arrangement and the bump electrodes BMP for the digital input signals or the analog input signals are arranged in the straight line arrangement is described. However, it is also possible to make a structure where the bump electrodes BMP for the gate output signals or source output signals are arranged in straight line arrangement, and the bump electrodes BMP for the digital input signals or analog input signals are arranged in the zigzag arrangement.

As for external dimensions of the semiconductor chip CHP, there are, for example, a chip whose length in the short side direction is 1.0 mm, and a length in the long side direction is 12.0 mm, and another chip whose length in the short side direction is 1.0 mm, and a length in the long side direction is 10.0 mm. Furthermore, there is, for example, still another chip whose length in the short side direction is 2.0 mm, and a length in the long side direction is 20.0 mm. The semiconductor chip CHP that is used in the LCD driver is in the rectangle shape as above-mentioned. Concretely, there are many chips whose ratio of the length of the short side to the length of the long side is 1:8 to 1:12. Furthermore, there are chips whose length in the long side direction is 5 mm or more.

In the inside of the semiconductor chip CHP being the LCD driver configured as shown in FIG. 1, there are low voltage resistant MISFETs used for the logic circuits, and high voltage resistant MISFETs used for the liquid crystal drive circuits and the like. For example, in the present specification, a MISFET working at a drive voltage of approximately 5 V to 6 V is referred to as a low voltage resistant MISFET, and a MISFET working at a drive voltage of approximately 20 V to 30 V is referred to as a high voltage resistant MISFET.

Figure 2:
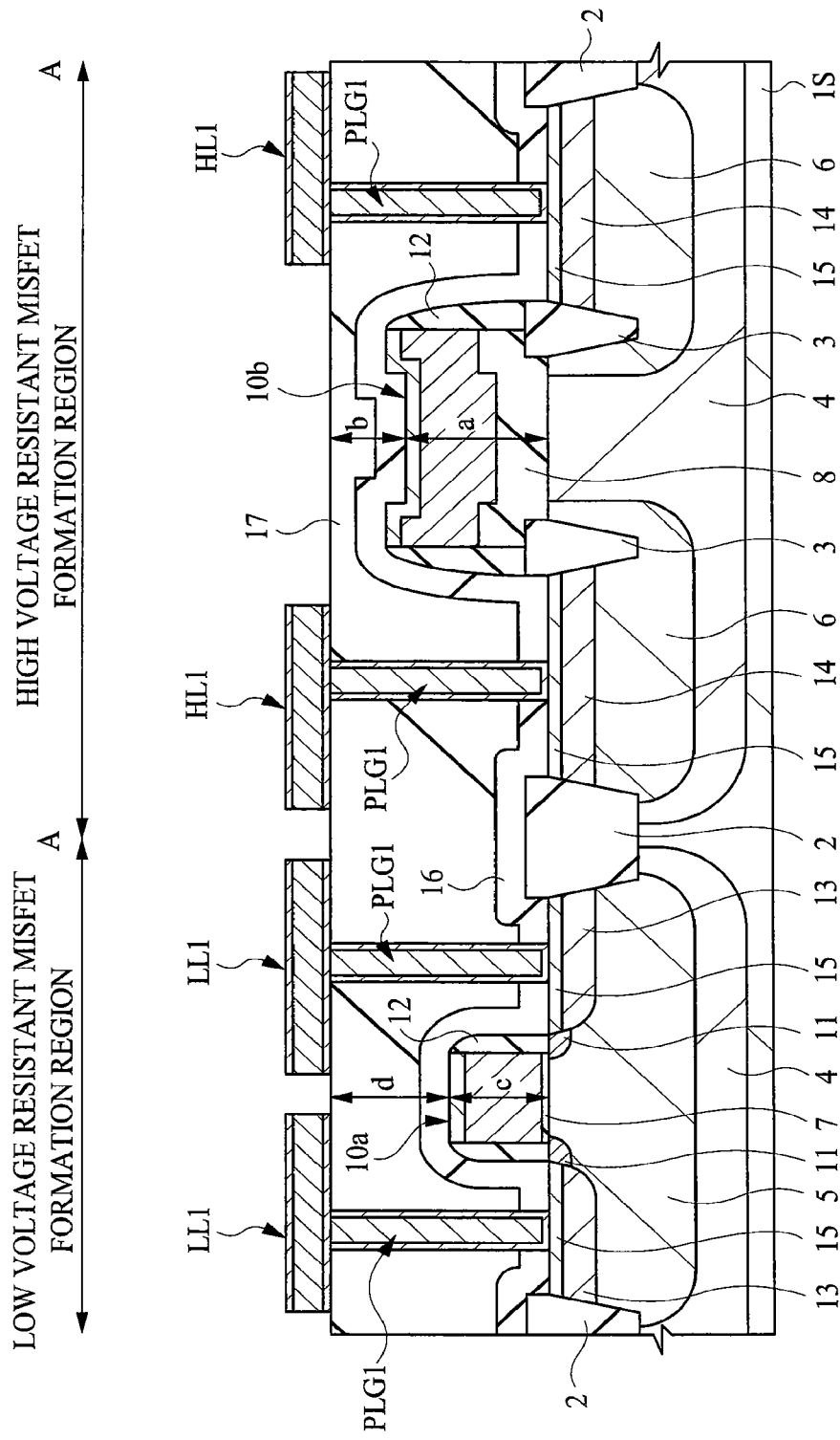
FIG. 2 is a cross sectional view showing an example of an internal structure of the semiconductor chip shown in FIG. 1.

FIG. 2 is a cross sectional view of a MISFET existing inside the semiconductor chip CHP shown in FIG. 1. In FIG. 2, the low voltage resistant MISFET and the high voltage resistant MISFET are shown.

First, a structure of the high voltage resistant MISFET will be explained. In FIG. 2, in the high voltage resistant MISFET formation region, element isolation regions 2 are formed over a semiconductor substrate 1S. In other words, the high voltage resistant MISFET is formed in an active regions isolated by the element isolation regions 2. In the inside of the semiconductor substrate 1S sandwiched between the plurality of element isolation regions 2, a p-type well 4 is formed. This p-type well 4 is a well formed for the high voltage resistant MISFET. Furthermore, in the high voltage resistant MISFET formation region, electric field relaxing insulation regions 3 are formed in regions sandwiched between the plurality of element isolation regions 2. The electric field relaxing insulation regions 3 have, for example, the same structure of the element isolation regions 2, and are formed by the Shallow Trench Isolation (STI) method.

In the inside of the p-type well 4, a pair of high voltage resistant low concentration impurity diffusion regions (n-type semiconductor regions) 6 are formed, and each of the high voltage resistant low concentration impurity diffusion regions is formed so as to contain the electric field relaxing insulation region 3. On the surface of the semiconductor substrate 1S between the pair of high voltage resistant low concentration impurity diffusion regions 6, a gate insulation film 8 is formed, and a gate electrode 10b is formed over this gate insulation film 8. The gate insulation film 8 is formed with, for example, a silicon oxide film, and the gate electrode 10b is formed with, for example, a stacked film of a polysilicon film and a cobalt silicide film. By forming the cobalt silicide film on the polysilicon film as the gate electrode 10b, it is possible to realize the low resistance of the gate electrode 10b.

The gate insulation film 8 is formed so that the end portions thereof run onto the electric field relaxing insulation regions 3. In other words, in the high voltage resistant MISFET formation region, since occupancy of the element isolation regions 2 and the electric field relaxing insulation regions 3 becomes high, the element isolation regions 2 and the electric field relaxing insulation regions 3 tend to protrude from the surface of the semiconductor substrate 1S. Therefore, the end portions of the gate insulation film 8 are shaped so as to run onto the electric field relaxing insulation regions 3. Accordingly, as for the gate electrode 10b formed on the gate insulation film 8, the end portions thereof are formed so as to swell.

Next, side walls 12 are formed on side walls of both sides of the gate electrode 10b, and these side walls 12 are also formed over the electric field relaxing insulation regions 3. Outside the electric field relaxing insulation regions 3 and inside high voltage resistant low concentration impurity diffusion regions 6, high voltage resistant high concentration impurity diffusion regions (n-type semiconductor regions) 14 are formed. On the surface of this high voltage resistant high concentration impurity diffusion region 14, a cobalt silicide film 15 is formed. As described above, the source region of the high voltage resistant MISFET is formed with one of a pair of the high voltage resistant low concentration impurity diffusion region 6, the high voltage resistant high concentration impurity diffusion region 14 formed inside this high voltage resistant low concentration impurity diffusion region 6, and the cobalt silicide film 15. In the same manner, the drain region of the high voltage resistant MISFET is formed with the other one of the pair of the high voltage resistant low concentration impurity diffusion region 6, the high voltage resistant high concentration impurity diffusion region 14 formed inside this high voltage resistant low concentration impurity diffusion region 6, and the cobalt silicide film 15.

In the present embodiment, since the electric field relaxing insulation regions 3 are formed at the end portions of the gate electrode 10b, the electric field formed under the end portions of the gate electrode 10b can be relaxed. Therefore, it is possible to secure voltage resistance between the gate electrode 10b and the source region or between the gate electrode 10b and the drain region. In other words, in the high voltage resistant MISFET, by forming the electric field relaxing insulation regions 3, it is possible to secure the voltage resistance even if a drive voltage becomes 20 V to 30 V.

The high voltage resistant MISFET according to the present embodiment is configured as mentioned above, and hereinafter, a structure of the low voltage resistant MISFET in the present embodiment will be explained.

In FIG. 2, in the low voltage resistant MISFET formation region, element isolation regions 2 are formed over the semiconductor substrate 1S. In other words, a low voltage resistant MISFET is formed in the active region isolated by the element isolation regions 2. A p-type well 4 is formed inside the semiconductor substrate 1S sandwiched between the plurality of element isolation regions 2. In the p-type well 4, a p-type well 5 that is a well for the low voltage resistant MISFET is formed. Incidentally, the electric field relaxing insulation region 3 is not formed in the low voltage resistant MISFET formation region.

A gate insulation film 7 is formed on the p-type well 5, and a gate electrode 10a is formed on this gate insulation film 7. The gate insulation film 7 is formed with, for example, a silicon oxide film. The gate electrode 10a is formed with, for example, a stacked film of a polysilicon film and a cobalt silicide film. By forming the cobalt silicide film on the polysilicon film as the gate electrode 10a, it is possible to realize low resistance of the gate electrode 10a. In the low voltage resistant MISFET, since a drive voltage is lower than that of the high voltage resistant MISFET, a film thicknesses of the gate insulation film 7 of the low voltage resistant MISFET is thinner than that of the gate insulation film 8 of the high voltage resistant MISFET.

Side walls 12 are formed on side walls of both sides of the gate electrode 10a, and a pair of low voltage resistant low concentration impurity diffusion regions (n-type semiconductor regions) 11 is formed immediately under this side walls 12 in the p-type well 5. Low voltage resistant high concentration impurity diffusion regions 13 (n-type semiconductor regions) are formed outside the pair of low voltage resistant low concentration impurity diffusion regions 11. On the surface of this low voltage resistant high concentration impurity diffusion region 13, the cobalt silicide film 15 is formed. As described above, a source region of the low voltage resistant MISFET is formed with one of the low voltage resistant low concentration impurity diffusion regions 11, the low voltage resistant high concentration impurity diffusion region 13 formed outside this low voltage resistant low concentration impurity diffusion region 11, and the cobalt silicide film 15 formed on the surface of the low voltage resistant high concentration impurity diffusion region 13. In the same manner, a drain region of the low voltage resistant MISFET is formed with the other one of the low voltage resistant low concentration impurity diffusion regions 11, the low voltage resistant high concentration impurity diffusion region 13 formed outside this low voltage resistant low concentration impurity diffusion region 11, and the cobalt silicide film 15 formed on the surface of the low voltage resistant high concentration impurity diffusion region 13. As mentioned above, the low voltage resistant MISFET is configured.

Next, a wiring structure formed over the high voltage resistant MISFET and the low voltage resistant MISFET will be explained. In the present embodiment, the wiring structure formed over the high voltage resistant MISFET has one of the characteristics thereof. First, the wiring structure on the high voltage resistant MISFET that is a characteristic of the present embodiment will be explained.

As shown in FIG. 2, an interlayer insulation film of the first layer is formed on the high voltage resistant MISFET. Concretely, the interlayer insulation film of the first layer is formed with a stacked film of a silicon nitride film 16 and a silicon oxide film 17. In the interlayer insulation film of the first layer made of the silicon nitride film 16 and the silicon oxide film 17, a plug (first plug) PLG1 penetrating this interlayer insulation film and reaching the source region of the high voltage resistant MISFET, and a plug (second plug) PLG1 penetrating this interlayer insulation film and reaching the drain region of the high voltage resistant MISFET are formed. On the interlayer insulation film of the first layer on which the plug PLG1 is formed, wires (source wire and drain wire) HL1 are formed. The wires HL1 are formed on the interlayer insulation film of the first layer, but further, an interlayer insulation film of the second layer and an interlayer insulation film of the third layer are formed over the interlayer insulation film of the first layer including the wires HL1, and wires are formed on the respective interlayer insulation films. In other words, multilayer wirings are formed on the high voltage resistant MISFET, but in FIG. 2, only the first layer wires HL1 that is the characteristic of the present invention are shown.

One of the characteristics of the present embodiment is that the wires HL1 to become the source wires and the drain wires are formed on the interlayer insulation film of the first layer, and the wires HL1 are arranged so that the wires HL1 and the gate electrode 10b of the high voltage resistant MISFET should not be overlapped planarly.

In the conventional LCD driver, in the high voltage resistant MISFET formation region, wires are not formed on the interlayer insulation film of the first layer, but formed on the interlayer insulation film of the second layer for the first time.

This is made from the viewpoint to secure the voltage resistance between the gate electrode of the high voltage resistant MISFET and the source wire or the voltage resistance between the gate electrode of the high voltage resistant MISFET and the drain wire. In this case, with the plug penetrating two kinds of the interlayer insulation films which are the interlayer insulation film of the first layer and the interlayer insulation film of the second layer, the source wire and the source region of the high voltage resistant MISFET or the drain wire and the drain region of the high voltage resistant MISFET are connected. Therefore, there is a concern that the resistance may increase due to the plug penetrating the interlayer insulation of the first layer and the interlayer insulation film of the second layer, but the diameter (for example, 0.24 μm) of the plug has been relatively secured, and accordingly, the resistance of the plug has not been so conspicuous as a problem.

However, the diameter of the plug has been largely reduced along with miniaturization of the LCD driver. For example, the plug diameter of 0.24 μm has been reduced to the plug diameter of 0.14 μm. In this case, with the plug penetrating both of the interlayer insulation film of the first layer and the interlayer insulation film of the second layer at once, the aspect ratio becomes large, and the high resistance of the plug becomes conspicuous as a problem.

Therefore, while the plug diameter is reduced, the wire HL1 to become the source wire or the drain wire is formed on the interlayer insulation film of the first layer. By doing this, even if the plug diameter is reduced, since the wire HL1 is formed on the interlayer insulation film of the first layer, it is possible to lower the aspect ratio of the plug PLG1, so that the high resistance of plug PLG1 is suppressed. In other words, the wire HL1 is provided on the interlayer insulation film of the first layer without forming the plug penetrating both of the interlayer insulation film of the first layer and the interlayer insulation film of the second layer at once, whereby the plug PLG1 penetrating only the interlayer insulation film of the first layer can be formed. Further, in order to lower the aspect ratio of the plug PLG1, the interlayer insulation film of the first layer is made thin. Furthermore, the wire width of the wire HL1 formed on the interlayer insulation film of the first layer is made thick, and the wire HL1 formed on the interlayer insulation film of the first layer and a wire formed on the interlayer insulation film of the second layer are connected by a plurality of plugs, and thereby lowering the resistance of the plugs and the wires. In other words, since a gate length (gate width) of the gate electrode 10b of the high voltage resistant MISFET is as comparatively large as approximately 2 μm to 3 μm, the wire HL1 is formed on the interlayer insulation film of the first layer so as to be planarly overlapped with the gate electrode 10b of the high voltage resistant MISFET.

However, in the case where the wire HL1 is formed on the interlayer insulation film of the first layer so as to be planarly overlapped with the gate electrode 10b of the high voltage resistant MISFET, voltage resistance failures occur between the gate electrode 10b of the high voltage resistant MISFET and the wire HL1 constituting the source wire or the drain wire. As causes of the voltage resistance failures, there are the fact that the film thickness of the interlayer insulation film of the first layer is made thin, and the fact that in the high voltage resistant MISFET, as mentioned above, the gate electrode 10b runs onto the electric field relaxing insulation region 3 protruding from the semiconductor substrate 1S, and further, the fact that the film thickness of the gate insulation film 8 is thick. Accordingly, it is thought that a distance between the wire HL1 and the gate electrode of the high voltage resistant MISFET that are overlapped planarly becomes short, so that the voltage resistance failures occur. Further, in the high voltage resistant MISFET, the fact that the drive voltage is as comparatively high as 20 V to 30 V is thought to be one of the causes.

Therefore, in the present embodiment, the wire HL1 to become the source wire and the drain wire are formed on the interlayer insulation film of the first layer, and the wires HL1 are arranged so that the wires HL1 and the gate electrode 10b of the high voltage resistant MISFET should not be overlapped planarly. With this structure, first, even if the semiconductor chip that is an LCD driver is miniaturized, the aspect ratio of the plug PLG1 connecting the source region or the drain region of the high voltage resistant MISFET and the wire HL1 can be made small. In other words, since the wires HL1 are formed on the interlayer insulation film of the first layer, it is possible to form the plug PLG1 penetrating only the interlayer insulation film of the first layer without forming a plug penetrating both the interlayer insulation film of the first layer and the interlayer insulation film of the second layer at once. Accordingly, even if the diameter of the plug PLG1 is reduced, it is possible to restrain the aspect ratio of the plug PLG1 from becoming large.

Furthermore, as shown in FIG. 2, the wires HL1 formed on the interlayer insulation film of the first layer are arranged so that the wires HL1 and the gate electrode 10b of the high voltage resistant MISFET should not be overlapped planarly. With this structure, since the wire HL1 is not formed immediately over the gate electrode 10b of the high voltage resistant MISFET, even if the interlayer insulation film of the first layer is made thin, it is possible to make large a distance between the wire HL1 and the gate electrode 10b. Therefore, it is possible to secure the voltage resistance between the gate electrode 10b of the high voltage resistant MISFET and the wire HL1 becoming the source wire or the drain wire. In other words, according to the present embodiment, it is possible to obtain remarkable effects to restrain the high resistance of the plug due to miniaturization of the semiconductor device, and to improve the voltage resistance failures between the gate electrode of the high voltage resistant MISFET and the wires.

For example, the high voltage resistant MISFET has a structure in which voltage resistance failures between the wire (source wire or drain wire) HL1 formed on the interlayer insulation film of the first layer and the gate electrode 10b easily occur due to the thin film thickness of the interlayer insulation film of the first layer, the thick film thickness of the gate insulation film, existence of the electric field relaxing insulation region, and the high voltage of the drive voltage. However, by arranging the wires HL1 formed on the interlayer insulation film of the first layer so that the wires HL1 and the gate electrode 10b should not be overlapped planarly, it is possible to form the wires HL1 on the interlayer insulation film of the first layer, and to make large the distance between the wires HL1 and the gate electrode 10b. Therefore, even if the LCD driver is miniaturized, it is possible to obtain remarkable effects to restrain the high resistance of the plug, and to improve the voltage resistance failures between the gate electrode of the high voltage resistant MISFET and the wires.

In addition, the wires HL1 formed on the interlayer insulation film of the first layer, and the gate electrode 10b are arranged not to be overlapped planarly, and whereby the following effect is obtained. That is, since, the interlayer insulation film of the first layer on which the wires HL1 are arranged is made thin, the wire HL1 and the channel region that is an interface between the gate insulation film of the high voltage resistant MISFET and the semiconductor substrate 1S become close. In the case where the wires HL1 are arranged to be overlapped with the gate electrode 10b planarly, the wires HL1 are overlapped planarly with the channel region of the high voltage resistant MISFET. At this moment, if a high voltage is applied to the wires HL1, there is a possibility that the wires HL1 function as a gate electrode since the interlayer insulation film of the first layer is made thin. In other words, when the wires HL1 have a region that is overlapped with the channel region planarly, and a distance between the wires HL1 and the channel region becomes short, the channel region overlapped planarly with the wires HL1 is inverted by the voltage applied to the wires HL1. Then, the region that is overlapped planarly with the wires HL1 in the entire channel region becomes an inverted state. For this reason, the region that is overlapped planarly with the wires HL1 in the channel region is inverted even when the high voltage resistant MISFET is off, whereby a distance of the channel region that is not substantially inverted is made short. Accordingly, a problem in which the voltage resistance between the source region and the drain region lowers occurs.

However, in the present embodiment, the wires HL1 are arranged not to be overlapped with the gate electrode 10b planarly. For this reason, the wires HL1 are arranged not to be overlapped planarly with the channel region formed immediately under the gate electrode 10b. Therefore, it is possible to restrain the wires HL1 from functioning as a gate electrode. In other words, according to the present embodiment, it is possible to obtain effects to prevent an occurrence of a parasitic MISFET due to the wires HL1, and to restrain the voltage resistance lowering between the source region and the drain region.

Figure 3:
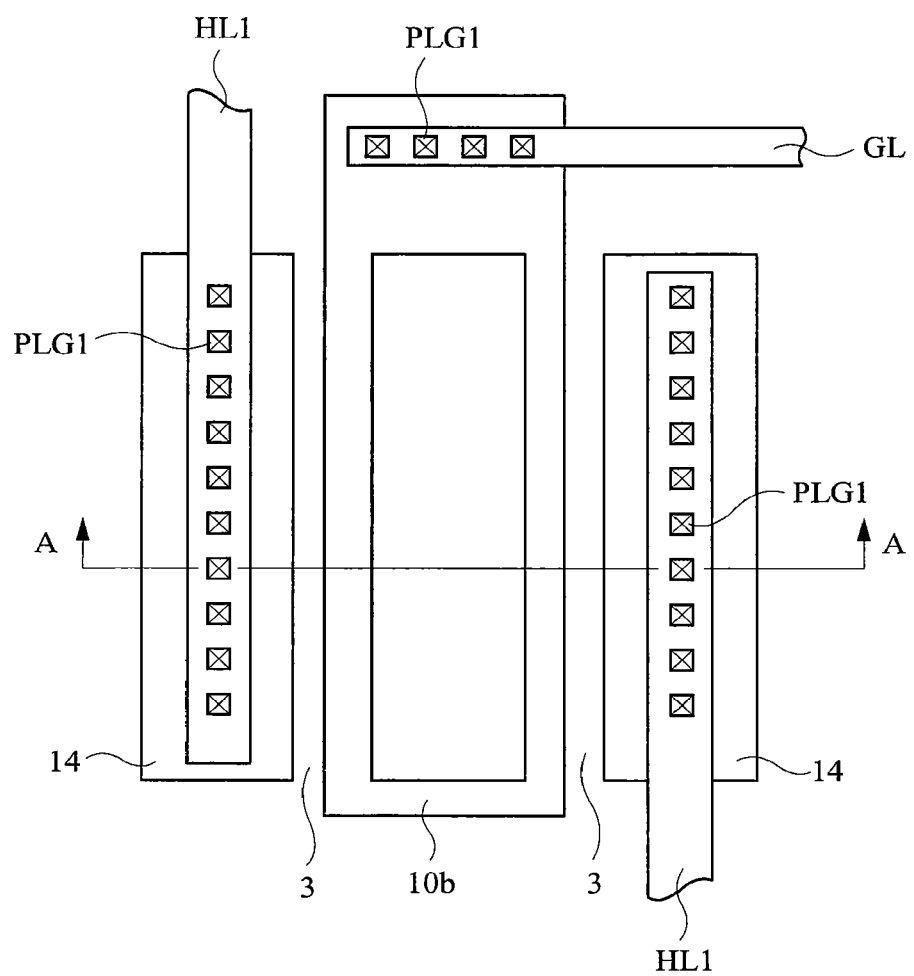
FIG. 3 is a plan view of the high voltage resistant MISFET shown in FIG. 2.

FIG. 3 is a plan view showing the high voltage resistant MISFET formation region shown in FIG. 2 viewed from above. The cross section cut at the A-A line in FIG. 3 corresponds to the high voltage resistant MISFET formation regions in FIG. 2. As shown in FIG. 3, at both sides of the gate electrode 10b, high voltage resistant high concentration impurity diffusion regions 14 to become the source region or the drain region are formed, and between the high voltage resistant high concentration impurity diffusion regions 14 and the gate electrode 10b, electric field relaxing insulation regions 3 are formed. Over the high voltage resistant MISFET configured in this manner, wires are formed via the interlayer insulation film of the first layer (not shown). In concrete, over the high voltage resistant high concentration impurity diffusion regions 14 to become the source region or the drain region, the wires HL1 are formed via plugs (first plug or second plug) PLG1. As seen in FIG. 3, the wires HL1 are arranged not to be overlapped with the gate electrode 10b planarly, and there is a distance between the gate electrode 10b and the wires HL1. Therefore, it is understood that the voltage resistance between the gate electrode 10b and the wires HL1 is secured.

On the other hand, a gate wire GL is connected to the gate electrode 10b via a plug (third plug) PLG1. This gate wire GL is formed with a wire of the same layer as that of the wires HL1 configuring a source wire or a drain wire. In other words, the gate wire GL is formed on the interlayer insulation film of the first layer. As shown in FIG. 3, this gate wire GL is arranged to have a region that is overlapped with the gate electrode 10b planarly. In other words, the gate wire GL is to be electrically connected to the gate electrode 10b via the plug (third plug) PLG1, and accordingly, a problem of the voltage resistance between the gate electrode 10b and the gate wire GL does not occur. In the present embodiment, a purpose is to secure the voltage resistance between the wires formed on the interlayer insulation film of the first layer and the gate electrode 10b. The problem of the voltage resistance with respect to the gate electrode 10b occurs in the source wire connected electrically to the source region of the high voltage resistant MISFET and the drain wire connected electrically to the drain region of the high voltage resistant MISFET from among the wires formed in the interlayer insulation film of the first layer. That is, it is characteristic that the gate electrode 10b and the wires HL1 that are the source wires or the drain wires are not overlapped planarly, and the gate wire GL connected electrically to the gate electrode 10b may be overlapped with the gate electrode 10b planarly.

Herein, in the present embodiment, it is characteristic that the wires HL1 formed on the interlayer insulation film of the first layer and the gate electrode 10b of the high voltage resistant MISFET are not overlapped planarly. At this moment, in other words, the wires HL1 formed in the interlayer insulation film of the first layer can be called wires of the lowest layer. However, in the case where wires are not formed in the interlayer insulation film of the first layer, but formed in the interlayer insulation film of the second layer, wires formed in the interlayer insulation film of this second layer may be called wires of the lowest layer. Further, as for the interlayer insulation film of the second layer, since wires are not formed in the interlayer insulation film of the first layer, a combination of the interlayer insulation film of the first layer and the interlayer insulation film of the second layer may be called one interlayer insulation film. Therefore, a certain definition is necessary to specify the wire HL1 to become the object in the present embodiment.

This definition will be explained. In the present embodiment, there is a problem caused by thinning the interlayer insulation film of the first layer. The voltage resistance between the wires HL1 formed over an interlayer insulation film of the first layer and the gate electrode 10b becomes a problem by thinning this interlayer insulation film of the first layer. Therefore, the wire HL1 formed in the interlayer insulation film of the first layer is defined as follows.

As shown in FIG. 2, when a distance from the interface between the semiconductor substrate 1S and the gate insulation film 8 to the upper portion of the gate electrode 10b is defined as a, and a distance from the upper portion of the gate electrode 10b to the upper portion of the interlayer insulation film on which the wire HL1 is formed is defined as b, the wire HL1 having a relation of a>b is defined as the objective wire in the present embodiment. That is, as the premise of the problem of the voltage resistance failures between the wire HL1 and the gate electrode 10b, attention is paid to a point that the interlayer insulation film of the first layer is thinned, and a point that the gate insulation film 8 of the high voltage resistant MISFET is thick and the gate electrode 10b runs onto the electric field relaxing insulation regions 3. Therefore, it becomes possible to clearly define that a wire in which the voltage resistance failures occur between the gate electrode 10b and the wire is the wire HL1 arranged at the position of a>b.

The fact that, in the high voltage resistant MISFET, the relation of a>b is established is concretely explained by numerical value examples. First, among the interlayer insulation films; a film thickness of the silicon nitride film is approximately 50 nm, and a film thickness of silicon oxide film 17 is approximately 500 nm. A film thickness of the gate insulation film 8 of the high voltage resistant MISFET is approximately 80 nm, and a film thickness of the gate electrode 10b is approximately 250 nm. Therefore, the distance "a" from the interface between the semiconductor substrate 1S and the gate insulation film 8 to the upper portion of the gate electrode 10b becomes approximately 330 nm (80 nm+250 nm). On the other hand, the distance "b" from the upper portion of the gate electrode 10b to the upper portion of the interlayer insulation film on which the wire HL1 is formed becomes approximately 220 nm (550 nm–330 nm). Therefore, it is understood that the relation of a>b is established. Further, since the electric field relaxing insulation regions 3 protrude approximately 10 nm to 20 nm from the semiconductor substrate 1S, it is understood that the relation of a>b is further satisfied. Thus, in the present embodiment, the voltage resistance between the gate electrode 10b and the wire HL1 becomes the problem, and as for this voltage resistance problem, it is clarified that the wire in which a position relation between the wire HL1 and the high voltage resistant MISFET is a>b causes the problem. Therefore, as for wires formed on the interlayer insulation films of the second layer and further upper layers which are not shown in FIG. 2, the relation of a>b is not established, so that they are not objectives of the present embodiment. In other words, as for the wires formed on the interlayer insulation films of the second layer and further upper layers, the voltage resistance failure does not become the problem because the distance from the gate electrode 10b of the high voltage resistant MISFET to the wire is sufficient. For this reason, there is no any problem even if the wires formed on the interlayer insulation films of the second layer and further upper layers (source wire and drain wire) are arranged to be overlapped with the gate electrode 10b planarly. By arranging the wires formed on the interlayer insulation films of the second layer and further upper layers to be overlapped with the gate electrode 10b planarly, it is possible to efficiently arrange the wires. In particular, in the high voltage resistant MISFET, since the gate length of the gate electrode 10b is as wide as 2 μm to 3 μm, it is useful to arrange the wires formed on the interlayer insulation films of the second layer and further upper layers to be overlapped with gate electrode 10b planarly.

Next, a wiring structure on the low voltage resistant MISFET will be explained. As shown in FIG. 2, an interlayer insulation film of a first layer is formed over the low voltage resistant MISFET. In concrete, the interlayer insulation film of the first layer is formed with a stacked film of a silicon nitride film 16 and a silicon oxide film 17. In the interlayer insulation film of the first layer made of the silicon nitride film 16 and the silicon oxide film 17, a plug PLG1 penetrating this interlayer insulation film and reaching the source region of the low voltage resistant MISFET, and a plug PLG1 penetrating this interlayer insulation film and reaching the drain region of the low voltage resistant MISFET are formed. On the interlayer insulation film of the first layer on which the plug PLG1 is formed, wires (source wires and drain wires) LL1 are formed. Meanwhile, the wires LL1 are formed on the interlayer insulation film of the first layer, but an interlayer insulation film of the second layer and an interlayer insulation film of the third layer are further formed over the interlayer insulation film of the first layer including these wires LL1, and wires are formed on the respective layers. In other words, multilayer wirings are formed over the low voltage resistant MISFET, but in FIG. 2, only the wires LL1 of the first layer are shown.

Herein, in the low voltage resistant MISFET, different from the high voltage resistant MISFET, the wires LL1 of the first layer are arranged to be overlapped with the gate electrode 10a of the low voltage resistant MISFET planarly. In other words, in the low voltage resistant MISFET, the voltage resistance between the wires LL1 of the first layer and the gate electrode 10a does not become a problem, which differs from the high voltage resistant MISFET.

This is because in the low voltage resistant MISFET, a film thickness of the gate insulation film 7 is thin, and since the electric field relaxing insulation regions 3 are not formed, the gate electrode 10a does not run onto the electric field relaxing insulation regions 3. Furthermore, a drive voltage of the low voltage resistant MISFET is approximately 5 V to 6 V, and accordingly, the voltage resistance is secured more easily than in the high voltage resistant MISFET whose drive voltage is 20 V to 30 V. Therefore, the wires (source wires and drain wires) LL1 formed on the interlayer insulation film of the first layer and the gate electrode 10a may be overlapped planarly. For this reason, since the gate length of the gate electrode 10a of the low voltage resistant MISFET is approximately 160 nm, it is possible to utilize a space over this gate electrode 10a effectively.

Furthermore, as a factor to secure the voltage resistance in the low voltage resistant MISFET, there is a fact that when a distance from the interface between the semiconductor substrate 1S and the gate insulation film 7 to the upper portion of the gate electrode 10a is defined as "c", and a distance from the upper portion of the gate electrode 10a to the upper portion of the interlayer insulation film on which the wires LL1 are formed is defined "d", a relation c<d is established. In other words, the relation (a>b) established in the high voltage resistant MISFET is not established in the low voltage resistant MISFET, and as a result of securing a distance between the gate electrode 10a and the wires LL1, the voltage resistance failures between the gate electrode 10a and the wires LL1 do not become a problem in the low voltage resistant MISFET.

Explanations will be made by numerical value examples in concrete. For example, among the interlayer insulation films, a film thickness of the silicon nitride film 16 is approximately 50 nm, and a film thickness of the silicon oxide film 17 is approximately 500 nm. A film thickness of the gate insulation film 7 of the low voltage resistant MISFET is approximately 13 nm, and a film thickness of the gate electrode 10a is approximately 250 nm. Therefore, the distance "c" from the interface between the semiconductor substrate 1S and the gate insulation film 7 to the upper portion of the gate electrode 10a becomes approximately 263 nm (13 nm+250 nm). On the other hand, the distance "d" from the upper portion of the gate electrode 10a to the upper portion of the interlayer insulation film on which the wires LL1 are formed becomes approximately 287 nm (550 nm–263 nm). Therefore, it is understood that the relation of c<d is established. In other words, in the low voltage resistant MISFET, the distance "d" from the upper portion of the gate electrode 10a to the wires LL1 is larger than the distance "c" from the lower portion of the gate insulation film 7 to the upper portion of the gate electrode 10a, and the drive voltage is low, which is different from the high voltage resistant MISFET. Accordingly, even if there is a region where the gate electrode 10a and the wires LL1 are overlapped planarly, the voltage resistance failure does not occur.

As mentioned above, in the present embodiment, it is characteristic that in the high voltage resistant MISFET formation regions, the wires HL1 to become the source wires and the drain wires are formed on the interlayer insulation film of the first layer, and the wires HL1 are arranged so that the wires HL1 and the gate electrode 10b of the high voltage resistant MISFET should not be overlapped planarly. Whereby, it is possible to obtain remarkable effects to restrain the high resistance of the plug due to miniaturization of the LCD driver, and to improve the voltage resistance failure between the gate electrode of the high voltage resistant MISFET and the wires.

The LCD driver (semiconductor device) according to the present embodiment is configured as mentioned above, and hereinafter, a method of manufacturing the same will be explained with reference to the drawings.

Figure 4:
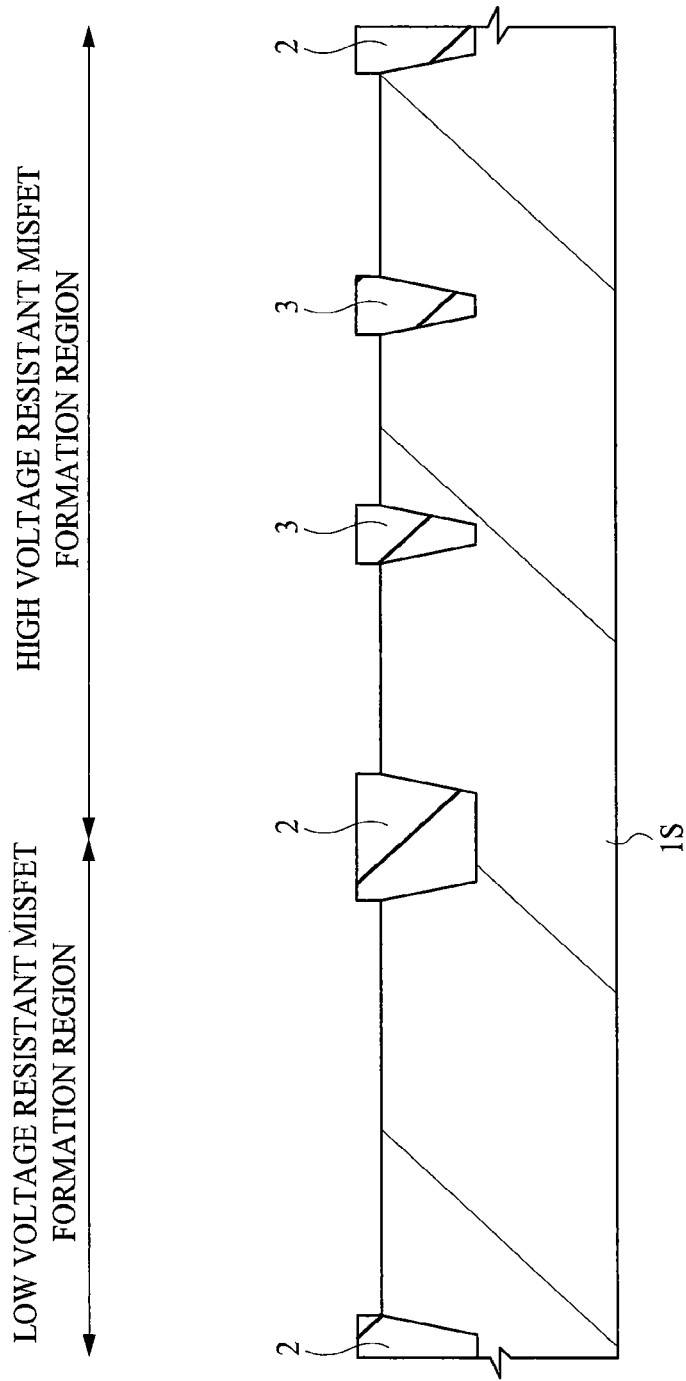
FIG. 4 is a cross sectional view showing a step of manufacturing a semiconductor device according to the present embodiment.

First, a semiconductor substrate 1S made of silicon single crystal to which p-type impurities such as boron (B) and the like are introduced is prepared. At this moment, the semiconductor substrate 1S is in a state of a semiconductor wafer having a substantially disk shape. As shown in FIG. 4, element isolation regions 2 that isolate the low voltage resistant MISFET formation region and the high voltage resistant MISFET formation region of the semiconductor substrate 1S are formed. The element isolation regions 2 are provided so that elements do not interfere with each other. The element isolation regions 2 may be formed by use of, for example, the local oxidation of silicon (LOCOS) method or the shallow trench isolation (STI) method. For example, with the STI method, the element isolation regions 2 are formed as follow. In other words, element isolation trenches are formed in the semiconductor substrate 1S by use of photolithography technique and etching technique. And a silicon oxide film is formed on the semiconductor substrate 1S so as to fill the element isolation trenches, thereafter, an unnecessary silicon oxide film formed on semiconductor substrate 1S is removed by use of CMP: chemical mechanical polishing method. Whereby, it is possible to form the element isolation regions 2 in which the silicon oxide film is filled only in the element isolation trenches.

In the present embodiment, in the step of forming the element isolation regions 2, the electric field relaxing insulation regions 3 are also formed. The electric field relaxing insulation regions 3 are formed in the same manner as the element isolation regions 2, and for example, they are formed by the STI method or the local oxidation of silicon method (LOCOS method). The electric field relaxing insulation regions 3 are formed in the high voltage resistant MISFET formation region. In particular, since the electric field relaxing insulation regions 3 are formed in the high voltage resistant MISFET formation region, occupancy of the element isolation regions 2 and the electric field relaxing insulation regions 3 becomes high. For this reason, for example, when the element isolation regions 2 and the electric field relaxing insulation regions 3 are formed by the STI method, the element isolation regions 2 and the electric field relaxing insulation regions 3 tend to protrude from the surface of semiconductor substrate 1S in the high voltage resistant MISFET formation region. In other words, the element isolation region 2 and the electric field relaxing insulation regions 3 are configured so as to protrude, for example, 10 nm to 20 nm from the surface of semiconductor substrate 1S. As mentioned later, in the high voltage resistant MISFET, since the end portion of the gate electrode is formed on the electric field relaxing insulation regions 3, they are formed so as to run onto the protruding electric field relaxing insulation regions 3. In particular, in the local oxidation of silicon method (LOCOS method), a selective oxide film is formed so as to swell from the surface of semiconductor substrate 1S, so that quantity in which the gate electrode runs onto the region 3 becomes large.

Figure 5:
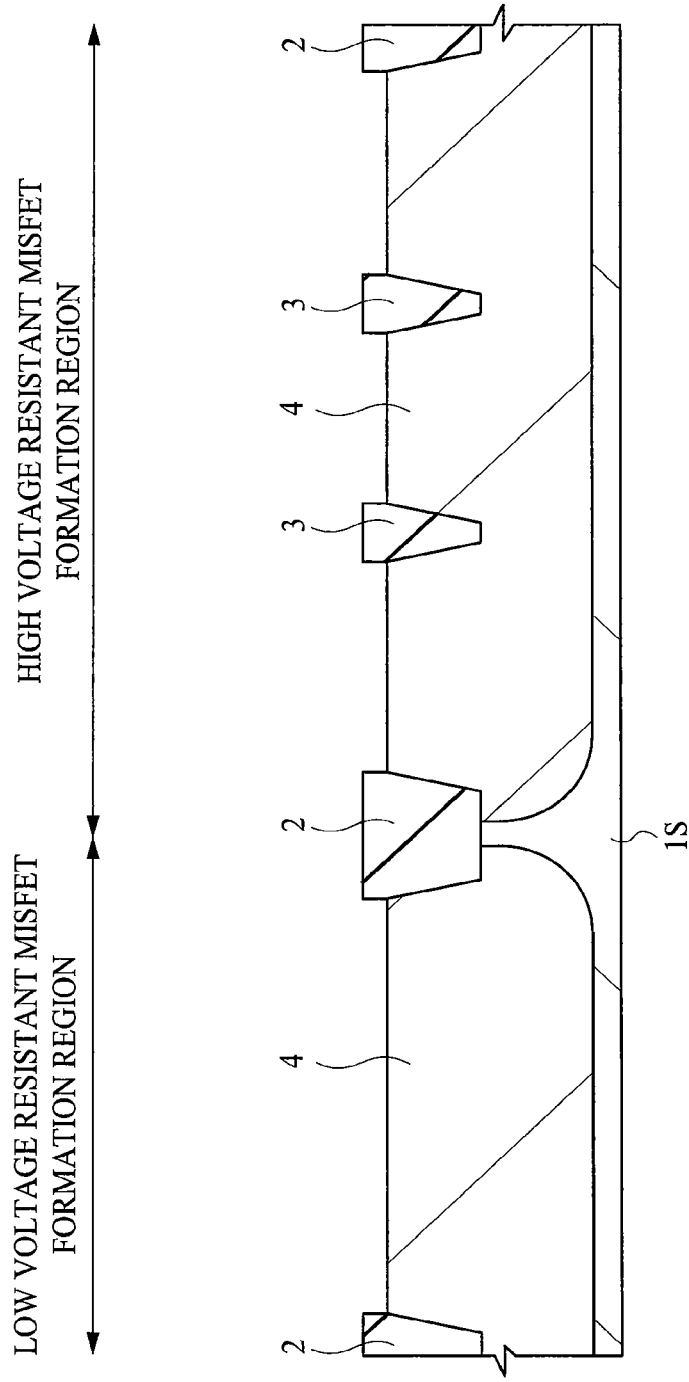
FIG. 5 is a cross sectional view showing a step of manufacturing the semiconductor device continued from FIG. 4.

Subsequently, as shown in FIG. 5, impurities are introduced into active regions isolated by the element isolation regions 2 to form a p-type well 4. The p-type well 4 is formed, for example, by introducing p-type impurities such as boron and the like into the semiconductor substrate 1S by the ion implantation method. This p-type well 4 is a well for the high voltage resistant MISFET, but it is formed in the high voltage resistant MISFET formation region and the low voltage resistant MISFET formation region. Then, a semiconductor region (not shown) for forming the channel is formed in the surface region of the p-type well 4. The semiconductor region for forming the channel is formed to adjust the threshold voltage to form the channel. In the present embodiment, the p-type wells 4 in the high voltage resistant MISFET formation region and the low voltage resistant MISFET formation region are formed in a same process, but it can be formed in separate processes. In that case, it is possible to form an impurity concentration to be introduced into the high voltage resistant MISFET formation region and an impurity concentration to be introduced into the low voltage resistant MISFET formation region, under optimal conditions respectively.

Figure 6:
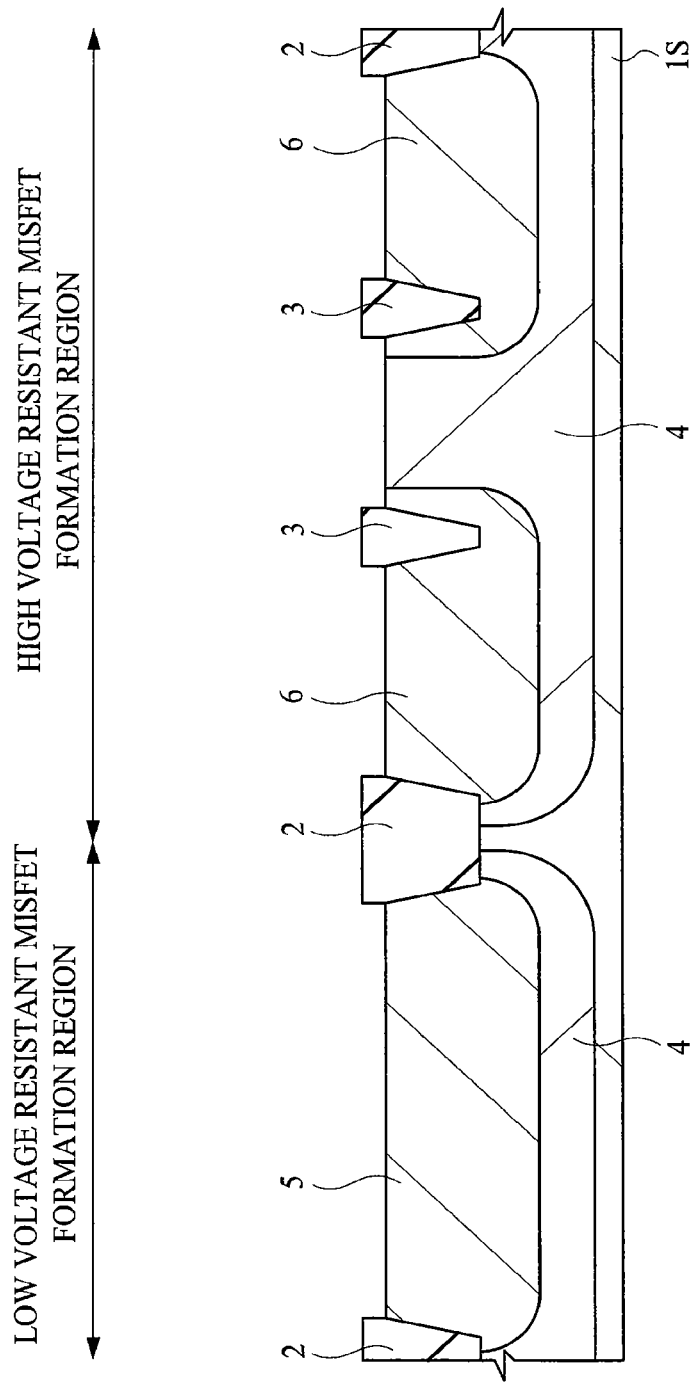
FIG. 6 is a cross sectional view showing a step of manufacturing the semiconductor device continued from FIG. 5.

Next, as shown in FIG. 6, a p-type well 5 is formed in the low voltage resistant MISFET formation region. The p-type well 5 is formed, for example, by introducing p-type impurities such as boron and the like into the semiconductor substrate 1S by the ion implantation method. This p-type well 5 is a well for the low voltage resistant MISFET. Thereafter, a pair of high voltage resistant low concentration impurity diffusion regions 6 is formed in the high voltage resistant MISFET formation region. This high voltage resistant low concentration impurity diffusion region 6 is a n-type semiconductor region, and it is formed by introducing n-type impurities such as phosphor (P) and arsenic (As) and the like into the semiconductor substrate 1S by the ion implantation method. The high voltage resistant low concentration impurity diffusion region 6 is formed to contain the electric field relaxing insulation region 3.

Figure 7:
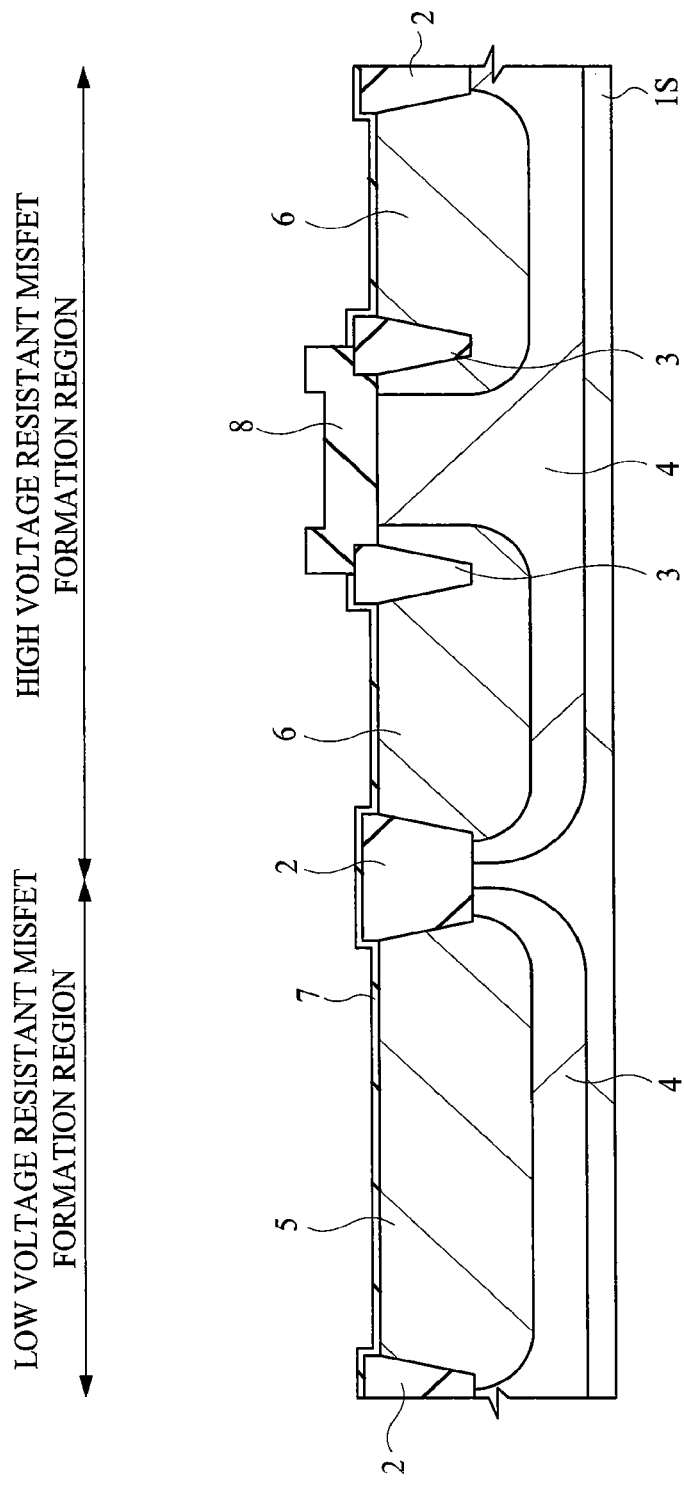
FIG. 7 is a cross sectional view showing a step of manufacturing the semiconductor device continued from FIG. 6.

Thereafter, as shown in FIG. 7, a gate insulation film is formed on the semiconductor substrate 1S. At this moment, in the low voltage resistant MISFET formation region, a thin gate insulation film 7 is formed, and in the high voltage resistant MISFET formation region, a thick gate insulation film 8 is formed. For example, a film thickness of the gate insulation film 7 to be formed in the low voltage resistant MISFET formation region is approximately 13 nm, and a film thickness of the gate insulation film 8 to be formed in the high voltage resistant MISFET formation region is approximately 80 nm. In order to form the gate insulation films of the different film thickness depending on the regions as mentioned-above, for example, after the thick gate insulation film 8 is formed on the semiconductor substrate 1S, the high voltage resistant MISFET formation region is masked with a resist film. By etching with this resist film as a mask, the film thickness of the gate insulation film 8 on the exposed low voltage resistant MISFET formation region is reduced, and therefore, the thin gate insulation film 7 can be formed. In addition, the thin gate insulation film 7 is first formed on the whole semiconductor substrate 1S, and a resist film is formed in the low voltage resistant MISFET formation region. By forming the thick gate insulation film 8 on the exposed high voltage resistant MISFET formation region, the thin gate insulation film 7 can be formed in the low voltage resistant MISFET formation region and the thick gate insulation film 8 can be formed in the high voltage resistant MISFET formation region. The end portions of the gate insulation film 8 formed in the high voltage resistant MISFET formation region are formed so as to run onto the electric field relaxing insulation regions 3.

The gate insulation films 7 and 8 are formed with, for example, a silicon oxide film, and can be formed by, for example, the thermal oxidation method. However, the gate insulation films 7 and 8 are not limited to the silicon oxide film, but various changes may be made. For example, the gate insulation films 7 and 8 may be formed with a silicon oxide nitride film (SiON). In other words, a structure in which nitrogen is segregated on the interface between the gate insulation film 7 or 8 and the semiconductor substrate 18 may be made. The silicon oxide nitride film has higher effects to suppress an occurrence of the interface levels in the film and to reduce electronic traps in comparison with the silicon oxide film. Therefore, it is possible to improve hot carrier resistance of the gate insulation films 7 and 8, and improve the insulation resistance. In addition, the silicon oxide nitride film is hard to let impurities go through in comparison with the silicon oxide film. For this reason, by using the silicon oxide nitride film for the gate insulation films 7 and 8, it is possible to restrain change in the threshold voltage caused by diffusing the impurities of the gate electrode to the side of the semiconductor substrate 1S. In order to form the silicon oxide nitride film, for example, the semiconductor substrate 1S may be subjected to heat treatment in an atmosphere including nitrogen such as NO, $NO_2$ or $NH_3$. In addition, the gate insulation films 7 and 8 made of silicon oxide film are formed on the surface of the semiconductor substrate 1S and then are subjected to the heat treatment in an atmosphere including nitrogen, and nitrogen is made to be segregated on the interface between the gate insulation film 7 or 8 and the semiconductor substrate 1S, so that the same effect may be obtained.

In addition, for example, the gate insulation films 7 and 8 may be formed with a highly dielectric constant film having a higher dielectric constant than that of the silicon oxide film. Conventionally, from the viewpoints of the high insulation resistance, and excellent electrical and physical stability of the interface between the silicon and the silicon oxide and so forth, the silicon oxide film is used as the gate insulation films 7 and 8. However, along with miniaturizing of elements, there has been a demand for an extremely thin film thickness of the gate insulation films 7 and 8. When such an extremely thin silicon oxide film is used as the gate insulation films 7 and 8, electrons flowing through the channel of the MISFET can tunnel through a barrier formed with the silicon oxide film and flow into the gate electrode, that is, a so-called tunnel current occurs.

Therefore, high dielectric films that can increase a physical film thickness with a same capacity by use of material whose dielectric constant is higher than that of the silicon oxide have come to be used. Since the physical film thicknesses can be increased even with a same capacity by the high dielectric films, it is possible to reduce a leak electric current.

For example, as the high dielectric film, a hafnium oxide film ($HfO_2$ film) that is one of the hafnium oxides is used, but in the place of the hafnium oxide film, other hafnium based insulation films such as a hafnium aluminate film, an HfON film (hafnium oxinitride film), an HfSiO film (a hafnium silicate film), an HfSiON film (hafnium silicon oxinitride film), an HfAlO film and the like may be used. Furthermore, it is possible to use hafnium based insulation films in which oxides such as tantalum oxide, niobium oxide, titanium oxide, zirconium oxide, lanthanum oxide, yttrium oxide and the like are introduced into these hafnium based insulation films. Since the hafnium based insulation films have, as with the hafnium oxide film, the dielectric constants higher than those of the silicon oxide film and the silicon oxide nitride film, it is possible to obtain the same effect as in the case of using the hafnium oxide film.

Figure 8:
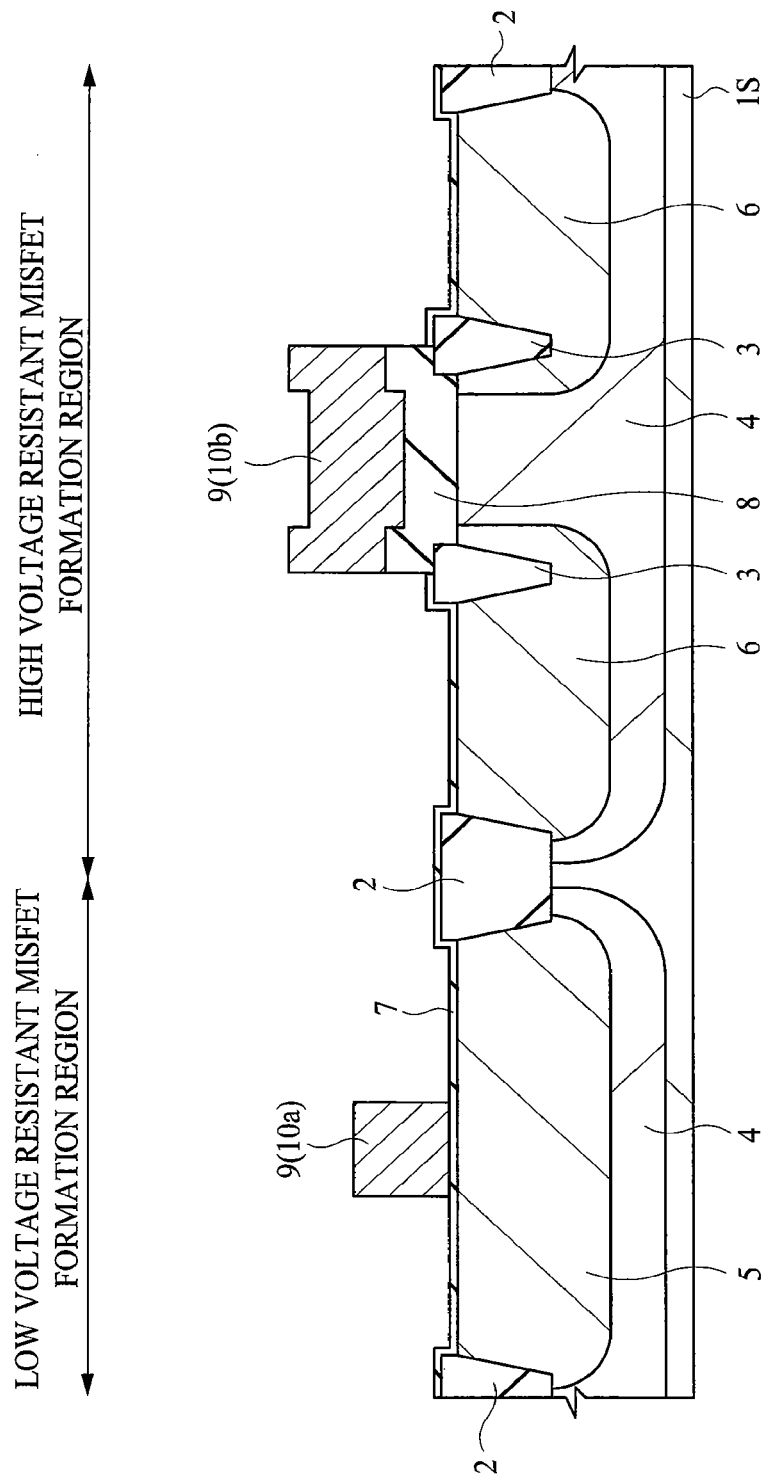
FIG. 8 is a cross sectional view showing a step of manufacturing the semiconductor device continued from FIG. 7.

Subsequently, as shown in FIG. 8, a polysilicon film is formed on the gate insulation films 7 and 8. The polysilicon film 9 may be formed, for example, by use of the CVD method. By use of the photolithography technique and the ion implantation method, n-type impurities such as phosphorus, arsenic, or the like is introduced into the polysilicon film 9.

Next, by etching using a patterned resist film as a mask, the polysilicon film 9 is processed, so that a gate electrode 10a is formed in the low voltage resistant MISFET formation region, and a gate electrode 10b is formed in the high voltage resistant MISFET formation region. The gate length of the gate electrode 10a is, for example, approximately 160 nm, and the gate length of the gate electrode 10b is, for example, approximately 2 µm to 3 µm. The end portions of the gate electrode 10b formed in the high voltage resistant MISFET formation region is formed to run onto the electric field relaxing insulation regions 3 via the gate insulation film 8.

Herein, in the gate electrodes 10a and 10b, n-type impurities are introduced into the polysilicon film 9. For this reason, it is possible to make work function values of the gate electrodes 10a and 10b to be the value close to the conductive band (4.15 eV) of the silicon, and accordingly, it is possible to reduce the threshold voltage of the low voltage resistant MISFET and the high voltage resistant MISFET that is an n-channel type MISFET.

Figure 9:
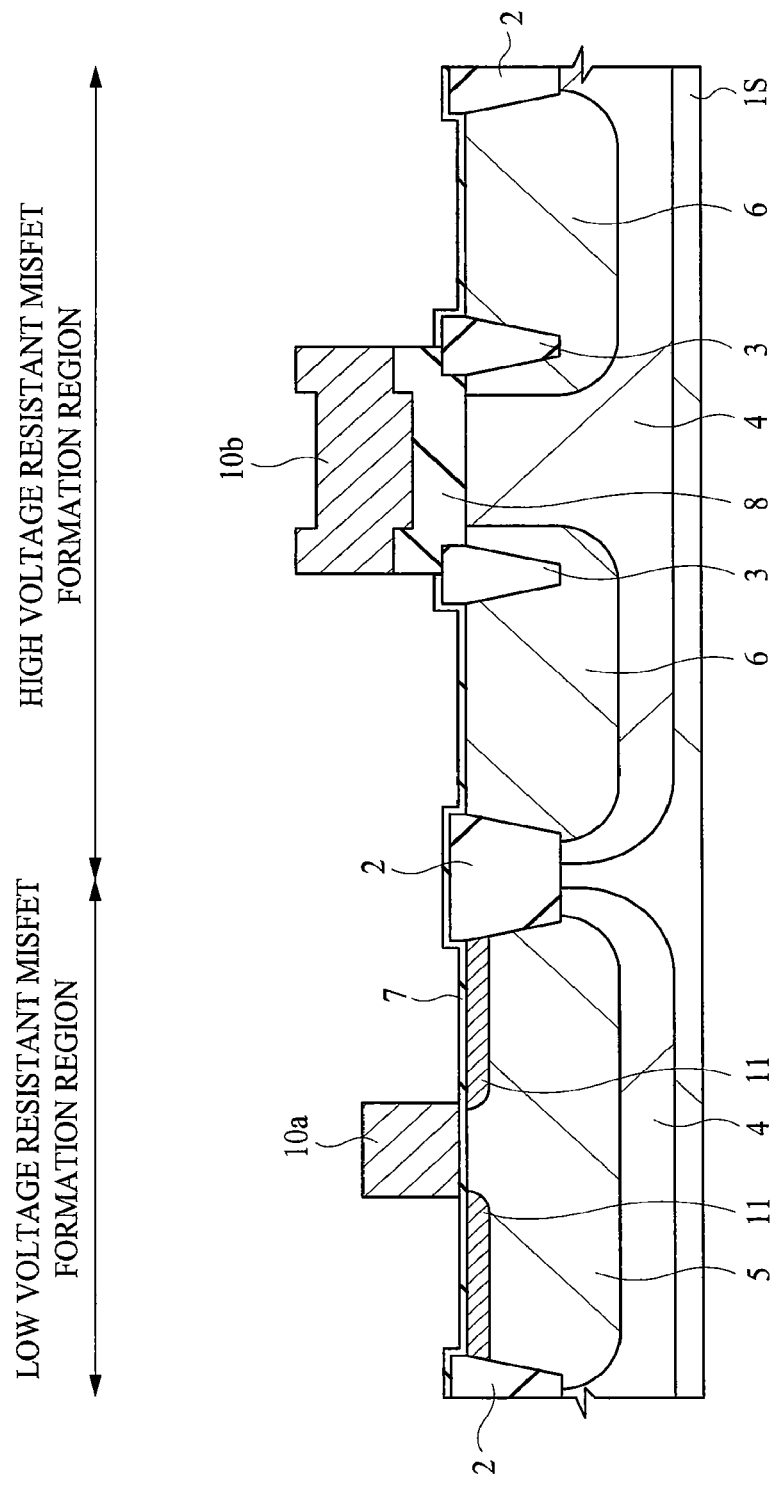
FIG. 9 is a cross sectional view showing a step of manufacturing the semiconductor device continued from FIG. 8.

Subsequently, as shown in FIG. 9, a shallow low voltage resistant low concentration impurity diffusion region 11 aligned to the gate electrode 10a of the low voltage resistant MISFET is formed by use of the photolithography technique and the ion implantation method. The shallow low voltage resistant low concentration impurity diffusion region 11 is an n-type semiconductor region.

Figure 10:
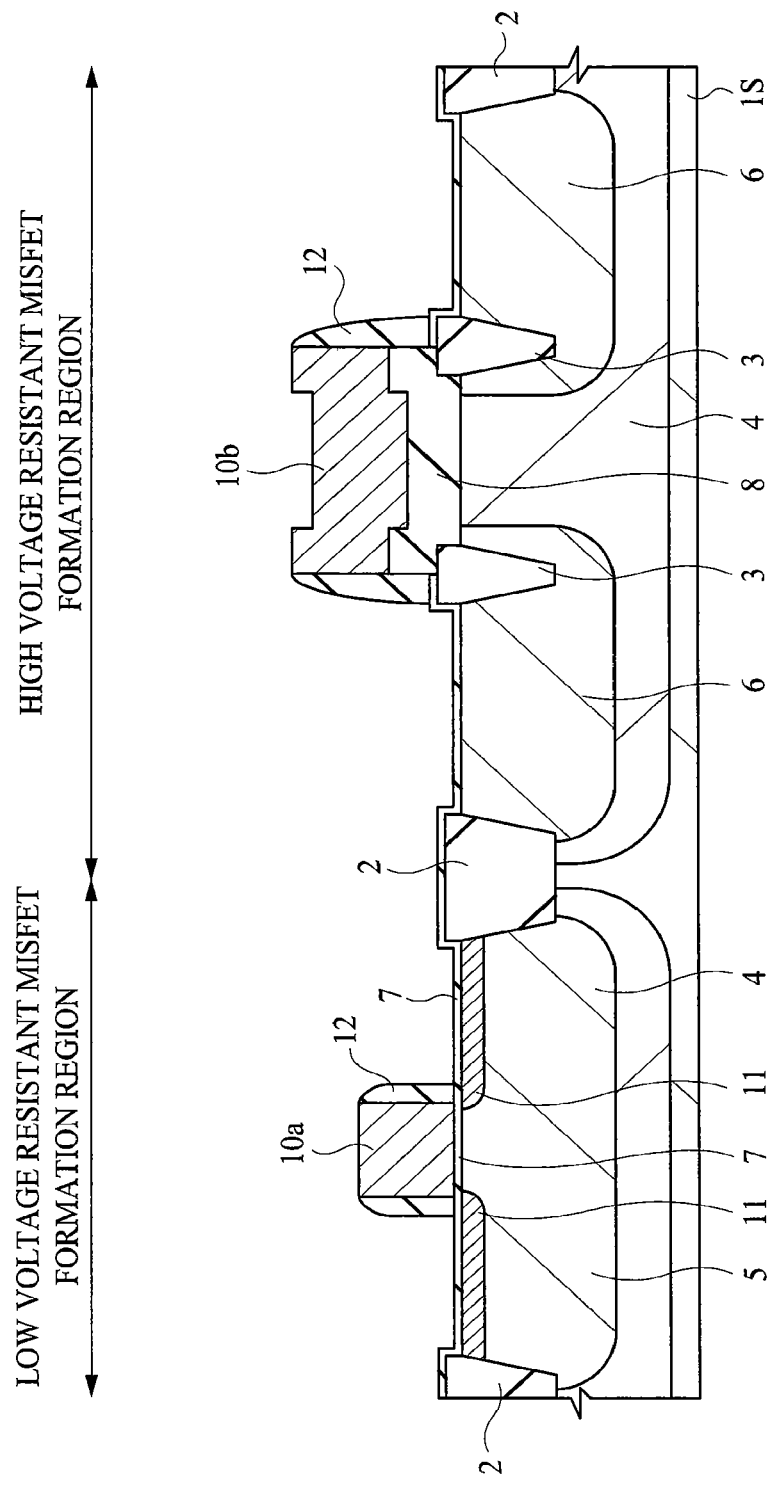
FIG. 10 is a cross sectional view showing a step of manufacturing the semiconductor device continued from FIG. 9.

As shown in FIG. 10, a silicon oxide film is formed over the semiconductor substrate 1S. The silicon oxide film may be formed by, for example, the CVD method. By performing anisotropic etching of the silicon oxide film, side walls 12 are formed on side walls of the gate electrodes 10a and 10b. The side walls 12 are formed with a single-layered film of a silicon oxide film, but the present invention is not limited to this, for example, the side walls 12 formed with a stacked film of a silicon nitride film and a silicon oxide film may be formed.

Figure 11:
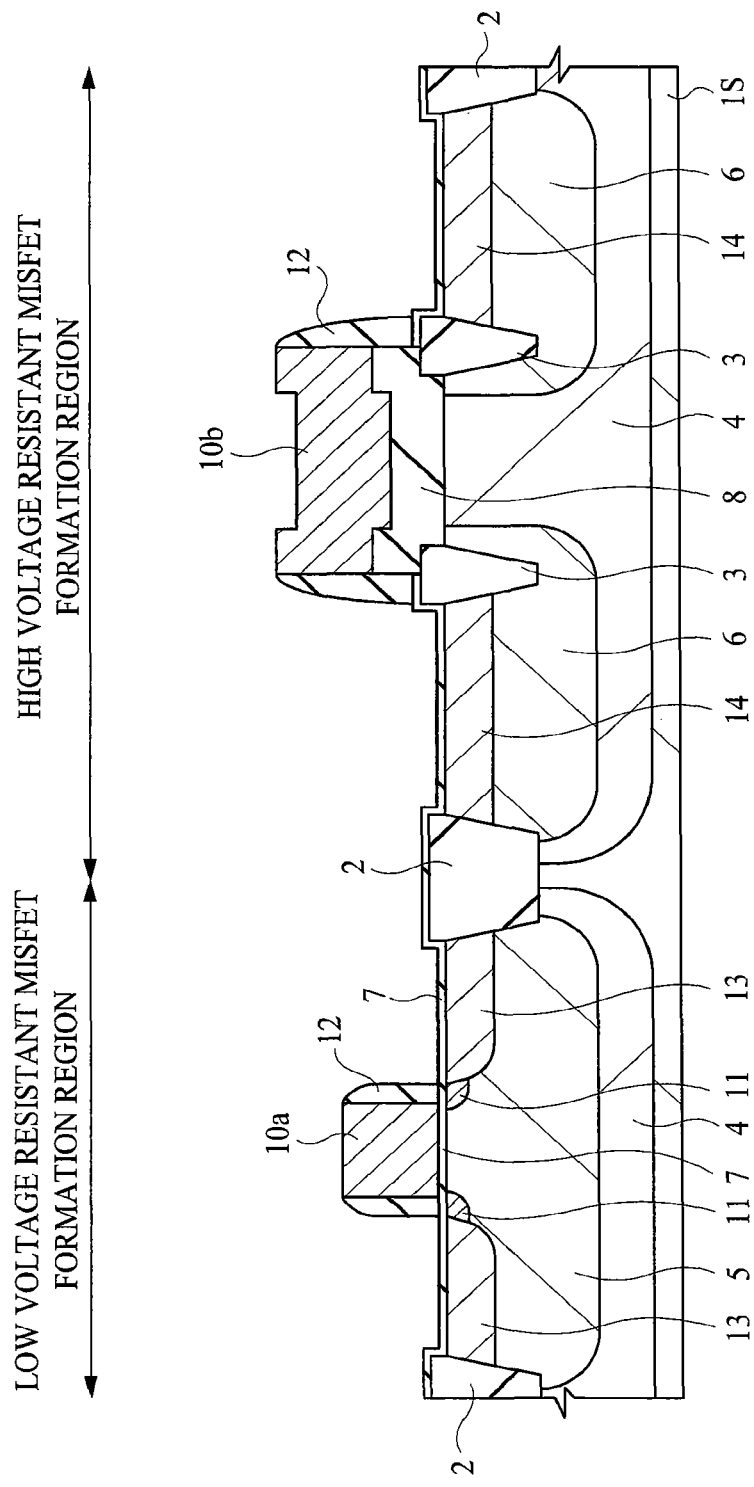
FIG. 11 is a cross sectional view showing a step of manufacturing the semiconductor device continued from FIG. 10.

Next, as shown in FIG. 11, by use of the photolithography technique and the ion implantation method, deep low voltage resistant high concentration impurity diffusion regions 13 aligned to the side walls 12 are formed in the low voltage resistant MISFET formation region. The deep low voltage resistant high concentration impurity diffusion region 13 is an n-type semiconductor region. The source region or the drain region of the low voltage resistant MISFET are formed with the deep low voltage resistant high concentration impurity diffusion regions 13 and the shallow low voltage resistant low concentration impurity diffusion regions 11. By forming the source region and the drain region with the shallow low voltage resistant low concentration impurity diffusion regions 11 and the deep low voltage resistant high concentration impurity diffusion regions 13 in this manner, it is possible to make the source region and the drain region have a Lightly Doped Drain (LDD) structure.

The ion implantation of n-type impurities to form the low voltage resistant high concentration impurity diffusion regions is performed also to the high voltage MISFET formation regions at the same time, and whereby the high voltage resistant high concentration impurity diffusion regions 14 are formed. The high voltage resistant high concentration impurity diffusion regions 14 are also an n-type semiconductor region, and they are formed outside the electric field relaxing insulation regions 3 so as to be contained in the high voltage resistant low concentration impurity diffusion regions 6. In the high voltage resistant MISFET, the source region or the drain region is formed with the high voltage resistant high concentration impurity diffusion regions 14 and the high voltage resistant low concentration impurity diffusion regions 6.

After the low voltage resistant high concentration impurity diffusion region 13 and the high voltage resistant high concentration impurity diffusion region 14 are formed as described above, a heat treatment at around 1000 C.° is performed to them. Whereby, the impurities introduced are activated.

Figure 12:
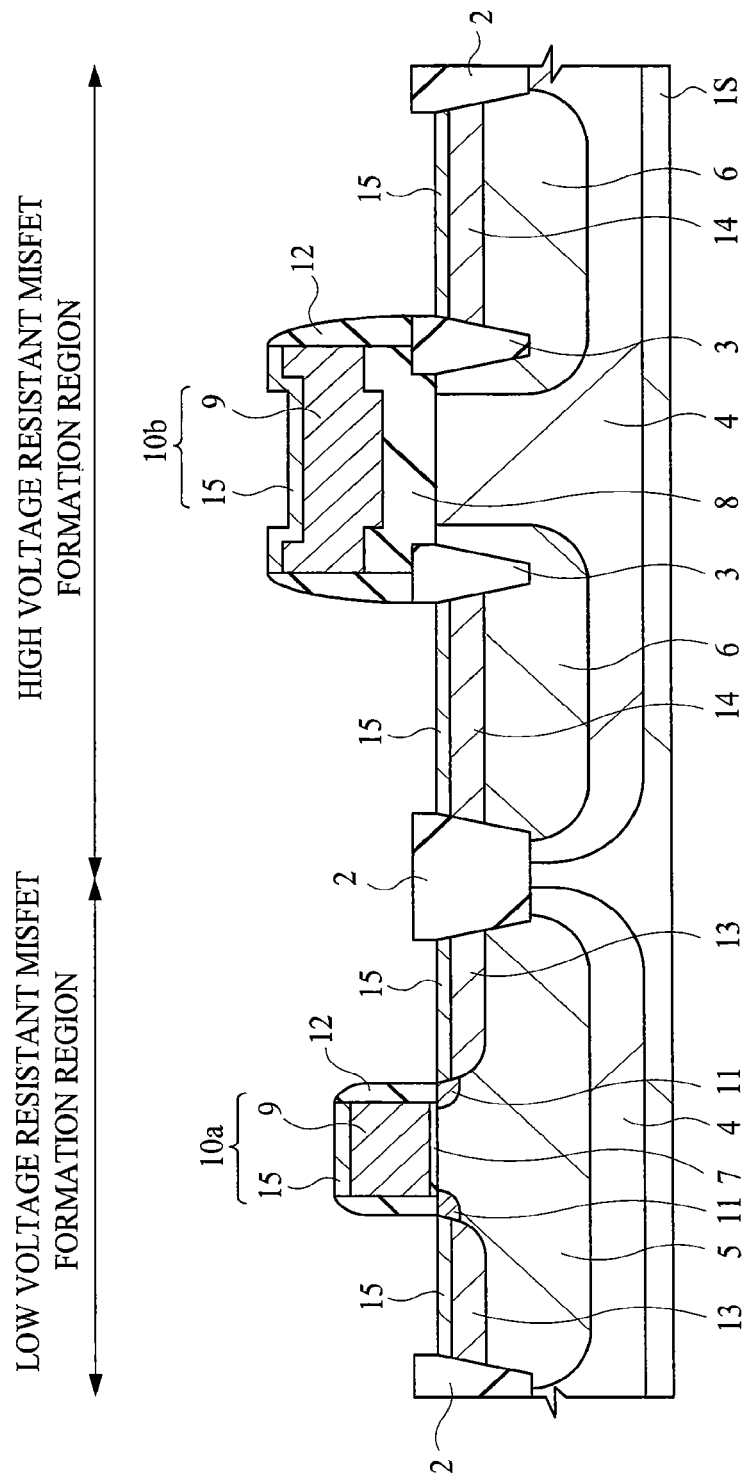
FIG. 12 is a cross sectional view showing a step of manufacturing the semiconductor device continued from FIG. 11.

Subsequently, as shown in FIG. 12, a cobalt film is formed over the semiconductor substrate 1S. At this moment, the cobalt film is formed to contact with the gate electrodes 10a and 10b directly. In the same manner, the cobalt film contacts with the deep low voltage resistant high concentration impurity diffusion regions 13 and the high voltage resistant high concentration impurity diffusion regions 14 directly.

The cobalt film may be formed by, for example, the sputtering method. After the cobalt film is formed, by performing a heat treatment, the polysilicon film 9 constituting the gate electrodes 10a and 10b and the cobalt film are reacted to form a cobalt silicide film 15. Whereby, the gate electrodes 10a and 10b become a stacked structure of the polysilicon film 9 and the cobalt silicide film 15. The cobalt silicide film 15 is formed for lowering a resistant of the gate electrodes 10a and 10b. In the same manner, by the heat treatment mentioned above, the silicon and the cobalt film react also on the surface of the low voltage resistant high concentration impurity diffusion regions 13 and the high voltage resistant high concentration impurity diffusion regions 14, so that the cobalt silicide film 15 is formed. Accordingly, it is possible to realize the low resistance in the low voltage resistant high concentration impurity diffusion regions 13 and the high voltage resistant high concentration impurity diffusion regions 14.

Then, an unreacted cobalt film is removed from the semiconductor substrate 1S. In the present embodiment, the cobalt silicide film 15 is formed, but in the place of the cobalt silicide film 15, for example, a nickel silicide film or a titanium silicide film may be formed. In this manner, the low voltage resistant MISFET and the high voltage resistant MISFET can be formed over the semiconductor substrate 1S.

Figure 13:
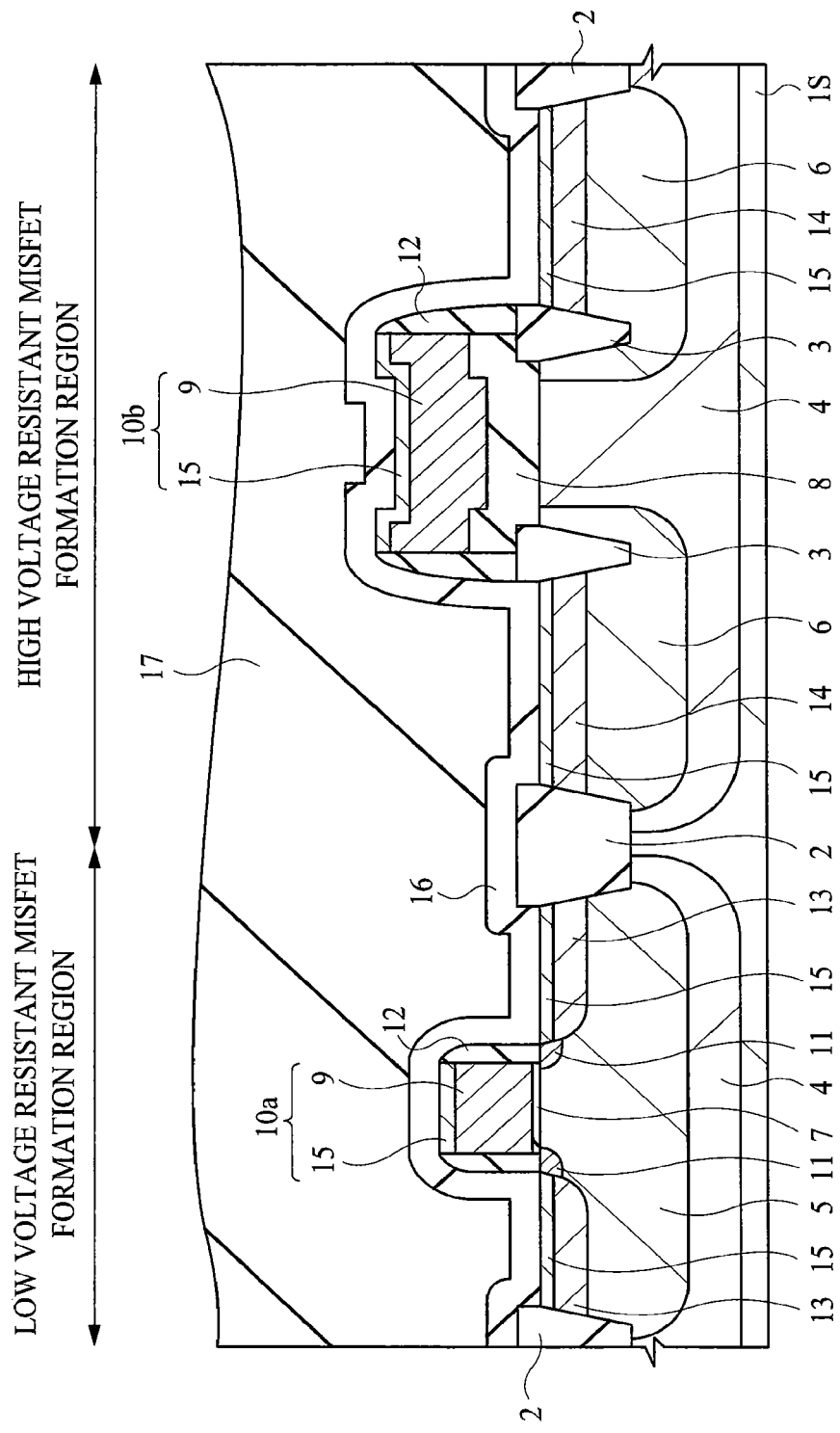
FIG. 13 is a cross sectional view showing a step of manufacturing the semiconductor device continued from FIG. 12.

Next, a wiring step will be explained. First, as shown in FIG. 13, a silicon nitride film 16 to become an interlayer insulation film is formed over the main surface of the semiconductor substrate 1S, and an silicon oxide film 17 is formed on this silicon nitride film 16. Whereby, the interlayer insulation film of the first layer becomes a stacked film of the silicon nitride film 16 and the silicon oxide film 17. The silicon nitride film 16 may be formed by, for example, the CVD method, and the silicon oxide film 17 may be formed by, for example, the CVD method using tetra ethyl ortho silicate (TEOS) as its raw material. At this moment, a film thickness of the silicon nitride film 16 is approximately 50 nm, and a film thickness of the silicon oxide film 17 is approximately 1100 nm.

Figure 14:
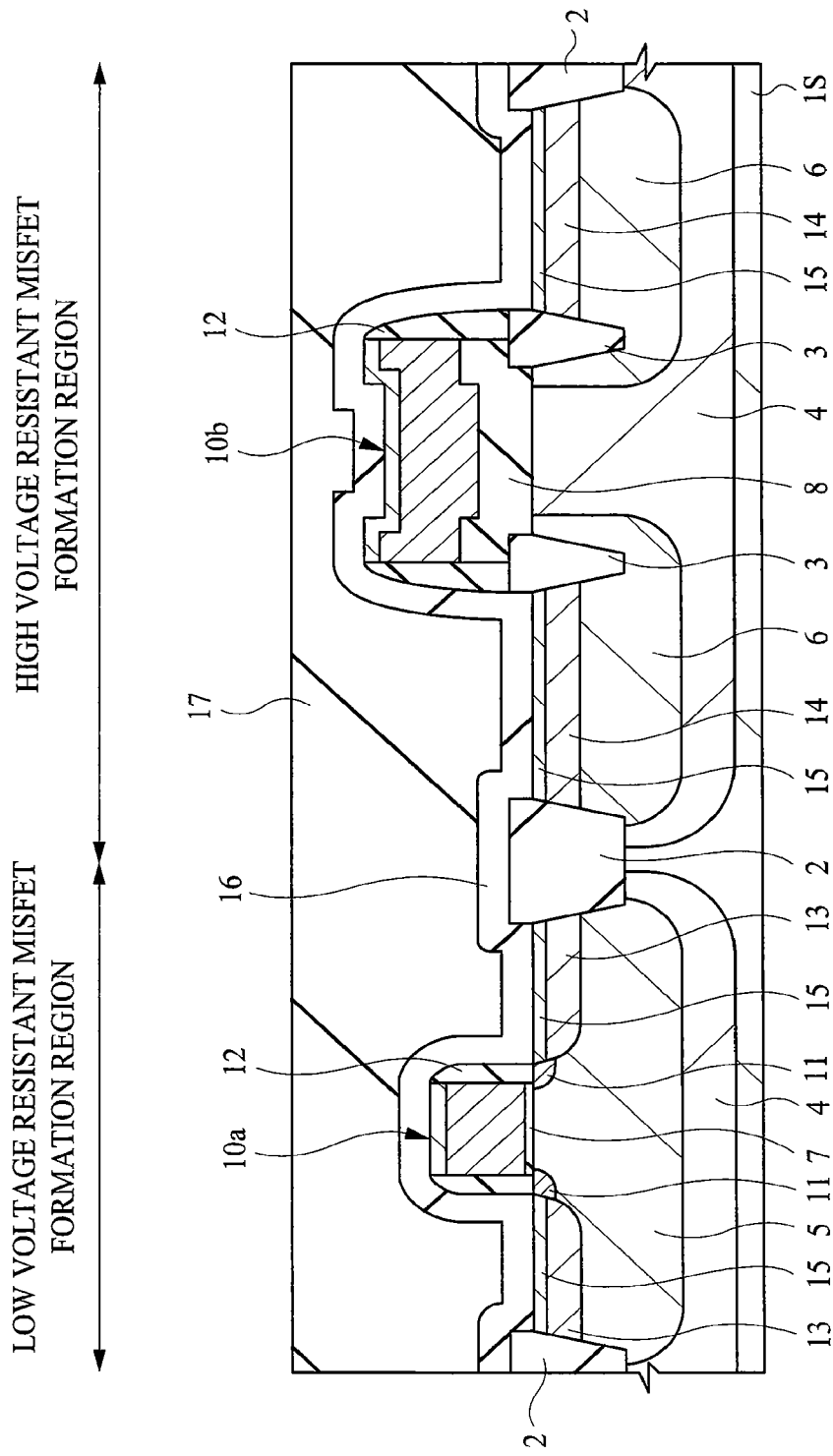
FIG. 14 is a cross sectional view showing a step of manufacturing the semiconductor device continued from FIG. 13.

Thereafter, as shown in FIG. 14, a surface of the silicon oxide film 17 is planarized by, for example, the Chemical Mechanical Polishing (CMP) method. In this process, the film thickness of the silicon oxide film 17 decreases and becomes, for example, approximately 550 nm. In this manner, the film thickness of the silicon oxide film 17 is thinned.

Figure 15:
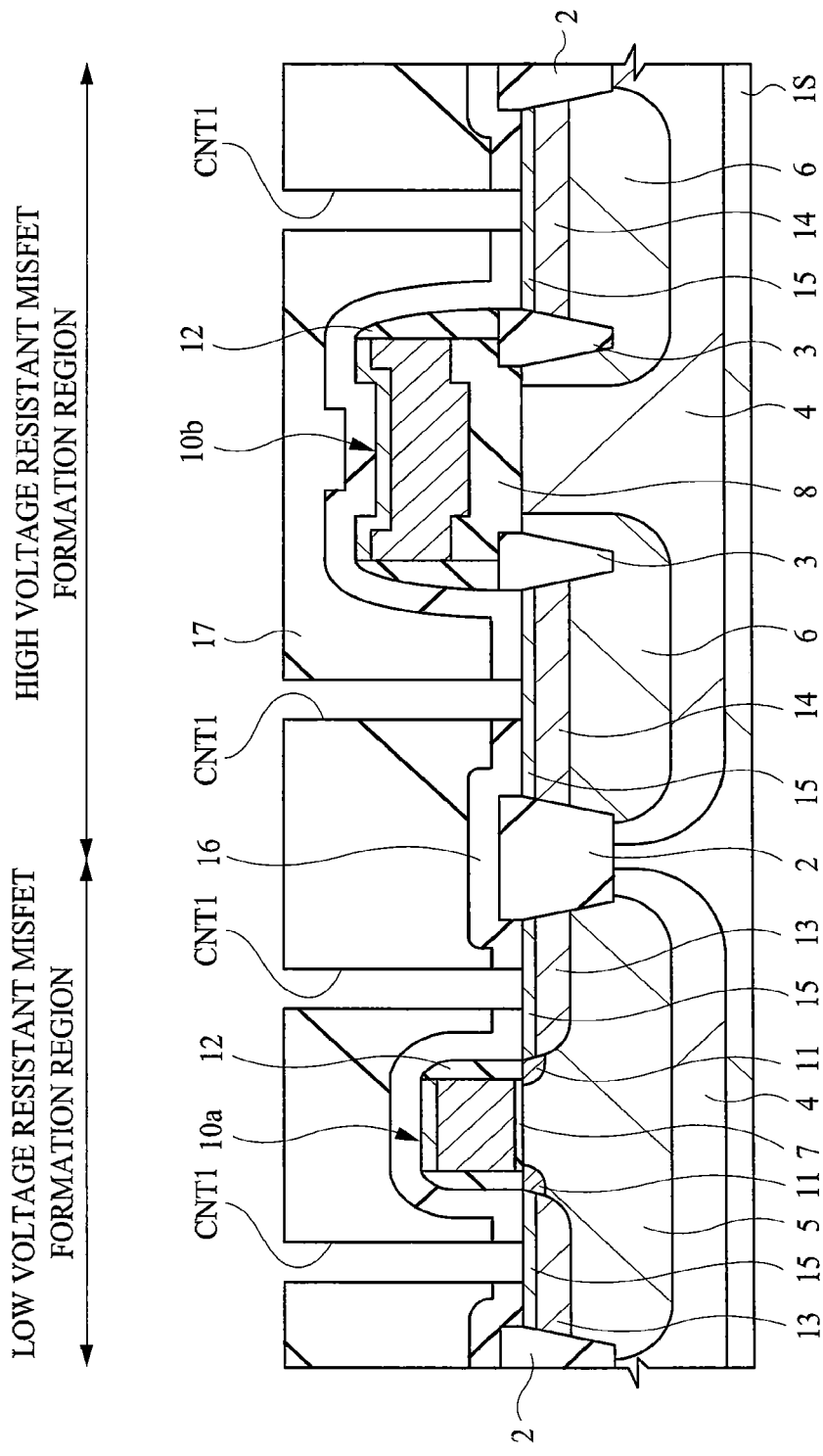
FIG. 15 is a cross sectional view showing a step of manufacturing the semiconductor device continued from FIG. 14.

Subsequently, as shown in FIG. 15, contact halls CNT1 are formed in the silicon oxide film 17 by use of the photolithography technique and the etching technique. The contact halls CNT1 penetrate the interlayer insulation film of the first layer made of the silicon oxide film 17 and the silicon nitride film 16 and reach the semiconductor substrate 1S. In concrete, the contact halls CNT1 are formed in the high voltage resistant MISFET formation region and the low voltage resistant MISFET formation region. In the high voltage resistant MISFET formation region, a contact hall (first contact hall) CNT1 reaching the source region (cobalt silicide film 15) is formed, and another contact hall (second contact hall) CNT1 reaching the drain region (cobalt silicide film 15) is formed. Incidentally, although not shown in FIG. 15, a contact hall reaching the gate electrode 10b is also formed. In the same manner, in the low voltage resistant MISFET formation region, a contact hall CNT1 reaching the source region (cobalt silicide film 15) is formed, and a contact hall CNT1 reaching the drain region (cobalt silicide film 15) is formed. In addition, although not shown in figure, a contact hall reaching the gate electrode 10a is also formed.

Figure 16:
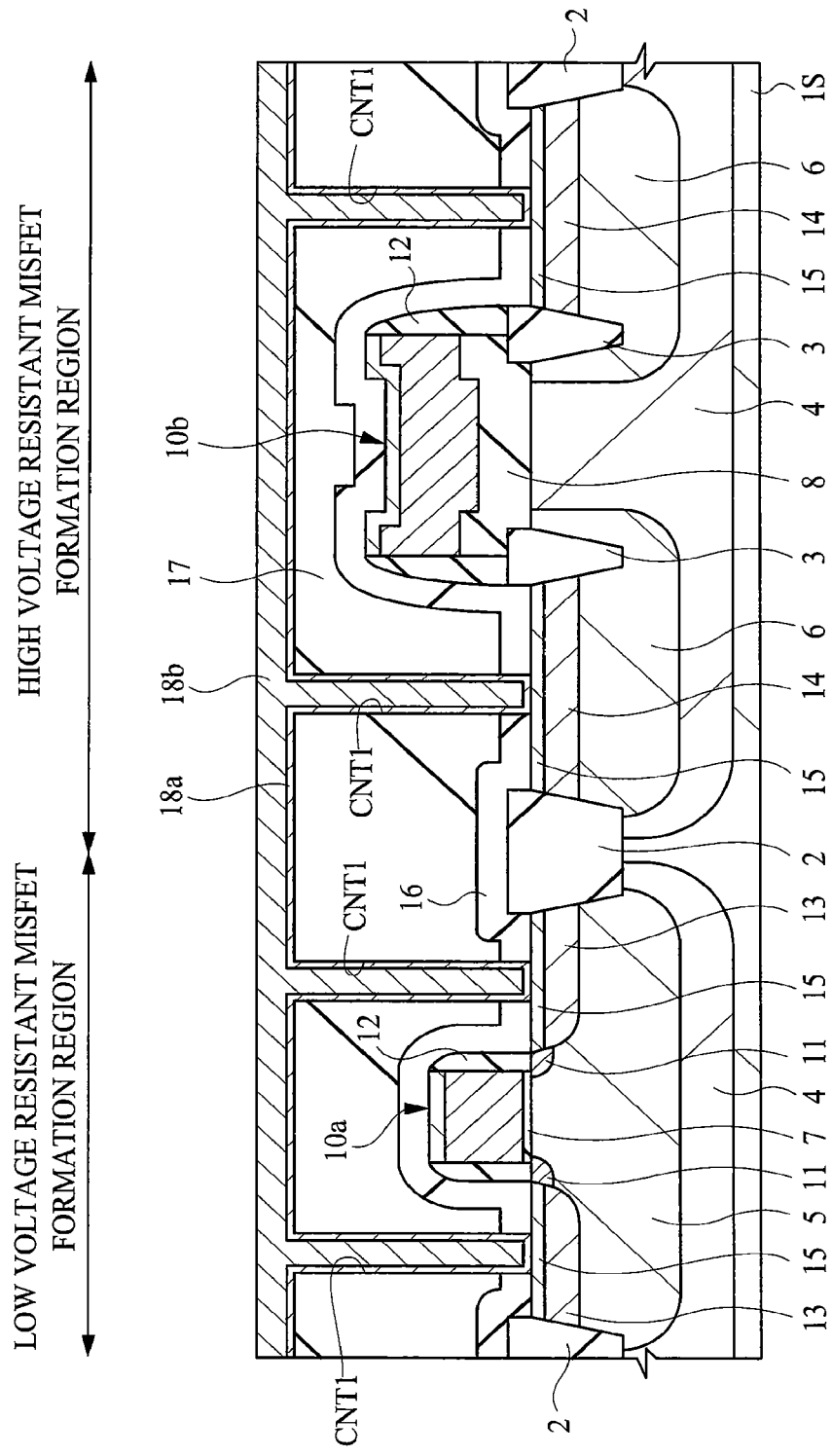
FIG. 16 is a cross sectional view showing a step of manufacturing the semiconductor device continued from FIG. 15.

Next, as shown in FIG. 16, a titanium/titanium nitride film 18a is formed on the silicon oxide film 17 including a bottom surface and an inside wall of the contact hall CNT1. The titanium/titanium nitride film 18a is configured with a stacked film of a titanium film and a titanium nitride film, and may be formed by use of, for example, the sputtering method. This titanium/titanium nitride film 18a has so-called barrier characteristics to prevent, for example, tungsten that is a film material to be buried in the later process from diffusing into the silicon. Thereafter, a tungsten film 18b is formed on the entire surface of the main surface of the semiconductor substrate 1S to fill up the contact halls CNT1. This tungsten film 18b may be formed by, for example, the CVD method.

Figure 17:
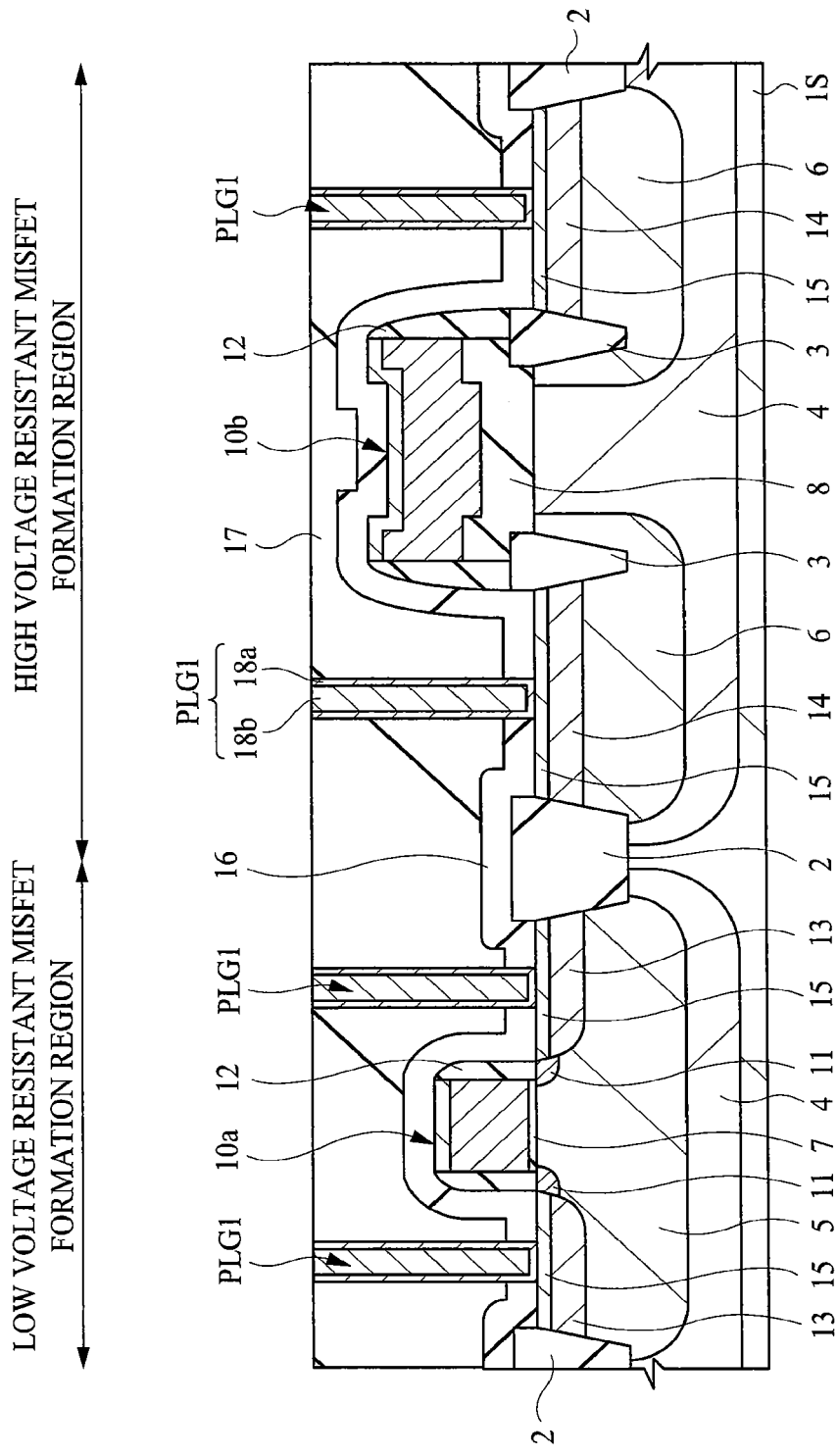
FIG. 17 is a cross sectional view showing a step of manufacturing the semiconductor device continued from FIG. 16.

Subsequently, as shown in FIG. 17, an unnecessary titanium/titanium nitride film 18a and tungsten film 18b formed on the silicon oxide film 17 are removed by, for example, the CMP method, and the titanium/titanium nitride film 18a and the tungsten film 18b are left only in the contact halls CNT1, and whereby, the plug PLG1 can be formed. By the CMP polishing at this time, the silicon oxide film 17 is polished. In concrete, the film thickness of the silicon oxide film 17 before the CMP polishing is approximately 550 nm, meanwhile, the film thickness of the silicon oxide film 17 after the CMP polishing is approximately 500 nm.

In the high voltage resistant MISFET formation region, the plug (first plug) PLG1 electrically connected to the source region of the high voltage resistant MISFET and the plug (second plug) PLG1 electrically connected to the drain region of the high voltage resistant MISFET are formed. Although not shown in the figure, a plug (third plug) electrically connected to the gate electrode 10b is also formed. In the same manner, in the low voltage resistant MISFET formation region, the plug PLG1 electrically connected to the source region of the low voltage resistant MISFET and the plug PLG1 electrically connected to the drain region of the low voltage resistant MISFET are formed. Meanwhile, although not shown in the figure, a plug electrically connected to the gate electrode 10a is also formed.

Figure 18:
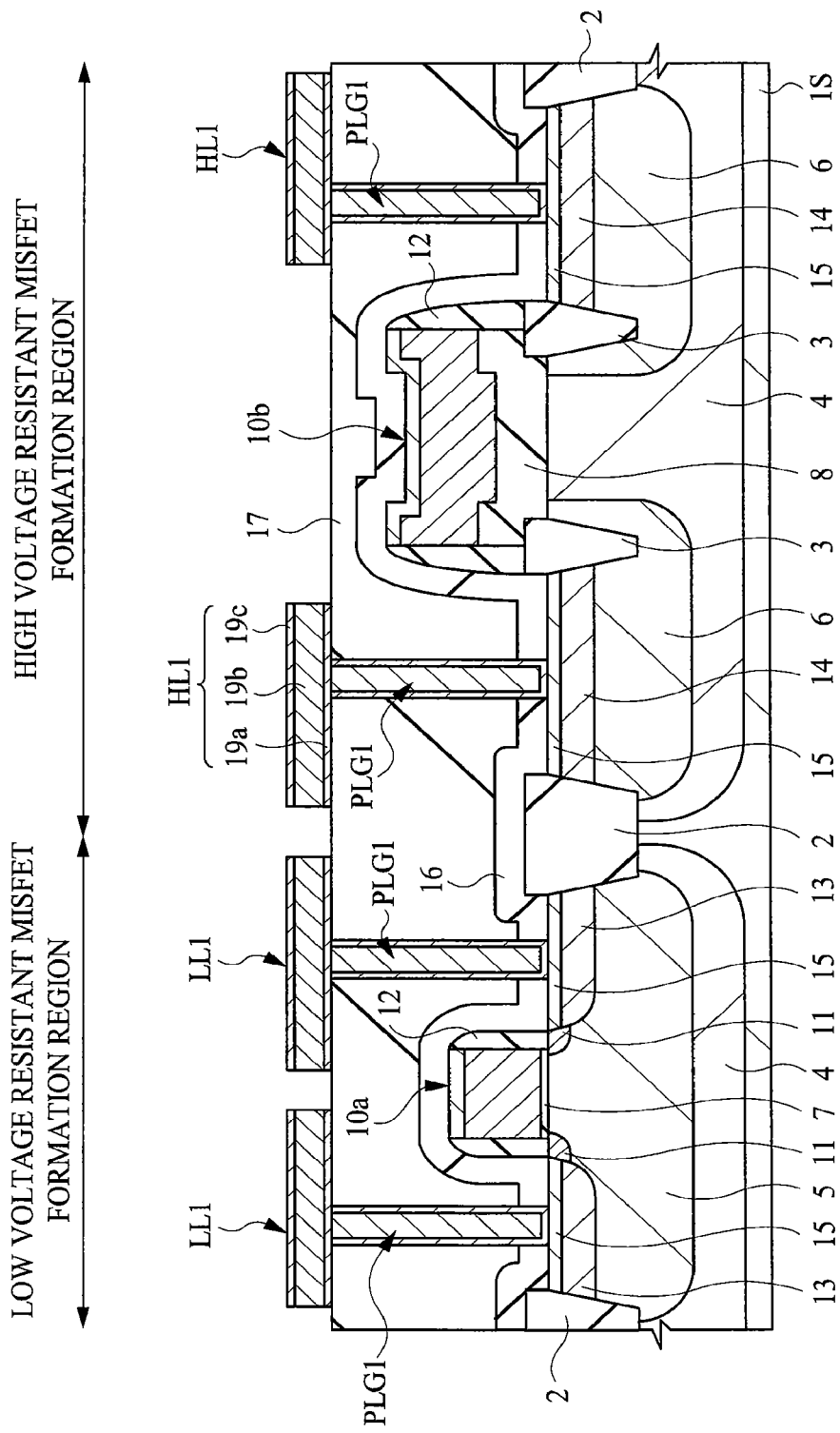
FIG. 18 is a cross sectional view showing a step of manufacturing the semiconductor device continued from FIG. 17.

Next, as shown in FIG. 18, a titanium/titanium nitride film 19a, an aluminum film 19b containing copper, a titanium/titanium nitride film 19c are sequentially formed on the silicon oxide film 17 and the plug PLG1. These films may be formed by use of, for example, the sputtering method. Thereafter, these films are patterned by use of the photolithography technique and the etching technique to form wires HL1 and wires LL1. Through these processes, the wires HL1 and the wires LL1 may be formed on the interlayer insulation film of the first layer.

Since the wires HL1 and the wires LL1 may be formed on the interlayer insulation film of the first layer, it is possible to make small the aspect ratio of the plug PLG1 connected to the wire HL1 and the wire LL1. Therefore, even if a diameter of the plug PLG1 is reduced and the miniaturization of the chip region is carried out, it is possible to restrain the high resistance of the plug PLG1. Furthermore, in the present embodiment, the wire (source wire) HL1 connected to the source region of the high voltage resistant MISFET via the plug PLG1 and the wire (drain wire) HL1 connected to the drain region of the high voltage resistant MISFET via the plug PLG1 are arranged as follows. In other words, the wires HL1 arranged on the interlayer insulation film of the first layer and the gate electrode 10b should not be overlapped planarly. Whereby, since the wires HL1 are not formed immediately over the gate electrode 10b of the high voltage resistant MISFET, it is possible to keep the distance between the wires HL1 and the gate electrode 10b away even if the interlayer insulation film of the first layer is made thin. Therefore, it is possible to secure the voltage resistance between the gate electrode 10b of the high voltage resistant MISFET and the wires HL1 to become the source wire or the drain wire. In other words, according to the present embodiment, it is possible to obtain remarkable effects to restrain the high resistance of the plug due to the miniaturization of the semiconductor device, and to improve the voltage resistance failures between the gate electrode of the high voltage resistant MISFET and the wires.

In addition, although not shown in the figure, the gate wire electrically connected to the gate electrode 10b is formed on the interlayer insulation film of the first layer. In other words, the gate wire is formed by the same layer as that of the wires HL1 constituting the source wire or the drain wire. The gate wire is electrically connected to the gate electrode 10b, so that the voltage resistance between the gate wire and the gate electrode 10b does not become a problem. For this reason, the gate wire is arranged to be overlapped with the gate electrode 10b planarly.

On the other hand, in the low voltage resistant MISFET formation region, wires LL1 are formed on the interlayer insulation film of the first layer. Since the voltage resistance between the wires LL1 and the gate electrode 10a does not become the problem in the low voltage resistant MISFET, a wire width of the wire LL1 is made wide to be overlapped with the gate electrode 10a planarly. Whereby, it is possible to utilize a space over the gate electrode 10a effectively and to realize the low resistance of the wire LL1.

Figure 19:
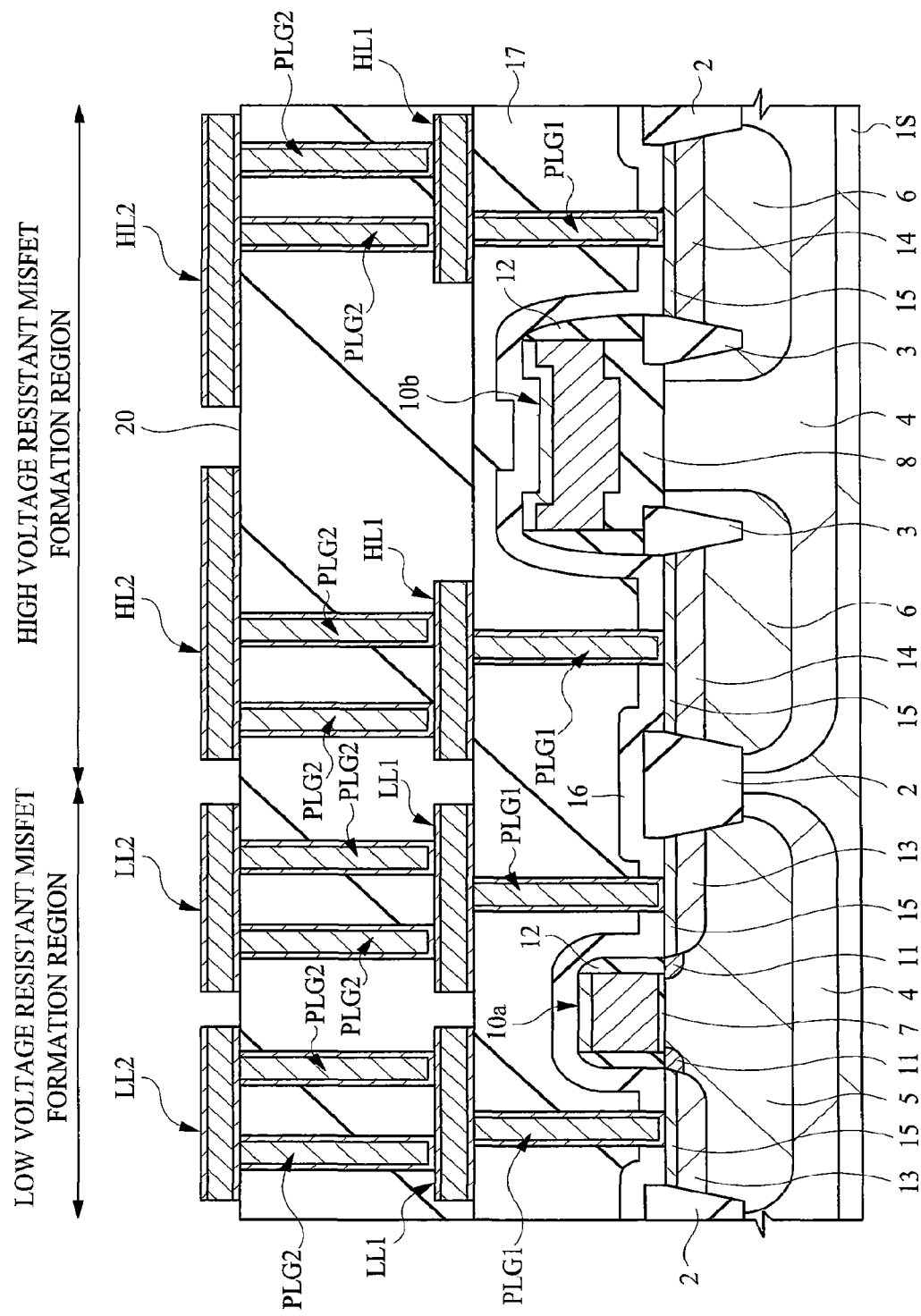
FIG. 19 is a cross sectional view showing a step of manufacturing the semiconductor device continued from FIG. 18.

Next, as shown in FIG. 19, a silicon oxide film 20 that is an interlayer insulation film of the second layer is formed on the interlayer insulation film of the first layer on which the wires HL1 and wires LL1 are formed. In the same manner as the process mentioned above, plugs PLG2 are formed in the silicon oxide film 20. The plugs PLG2 are connected to the wires HL1 and wires LL1. Wires HL2 and the wires LL2 are formed on the silicon oxide film 20 in which the plugs PLG2 are formed. Herein, since the wires HL1 and the wires HL2 are connected by a plurality of rows of plugs PLG2, it is possible to reduce the wire resistance and the plug resistance. In the same manner, the wires LL1 and the wires LL2 are connected by the plurality of rows of plugs PLG2, so that it is possible to reduce the wire resistance and the plug resistance.

In the high voltage resistant MISFET formation region, the wires HL2 formed on the silicon oxide film 20 that is the interlayer insulation film of the second layer may be arranged to be overlapped with the gate electrode 10b planarly. this is because a distance between the wires HL2 arranged on the interlayer insulation film of the second layer and the gate electrode 10b are sufficiently away in comparison with a distance between the wires HL1 arranged on the interlayer insulation film of the first layer and the gate electrode 10b, and so the voltage resistance between the wires HL2 and the gate electrode 10b does not become a problem. For this reason, by effectively utilizing a space over the gate electrode 10b having the gate length of approximately 2 μm to 3 μm, it is possible to realize the low resistance of the wire HL2 by widening the wire width of the wire HL2. On the interlayer insulation film of the second layer, a plurality of wires may be arranged in a region overlapped planarly with the gate electrode 10b.

Furthermore, multilayer wirings are formed by forming wires on an upper layer of the wires HL2 and the wires LL2. A bump electrode is formed on the highest layer of the multilayer wirings. A process of forming this bump electrode will be explained.

Figure 20:
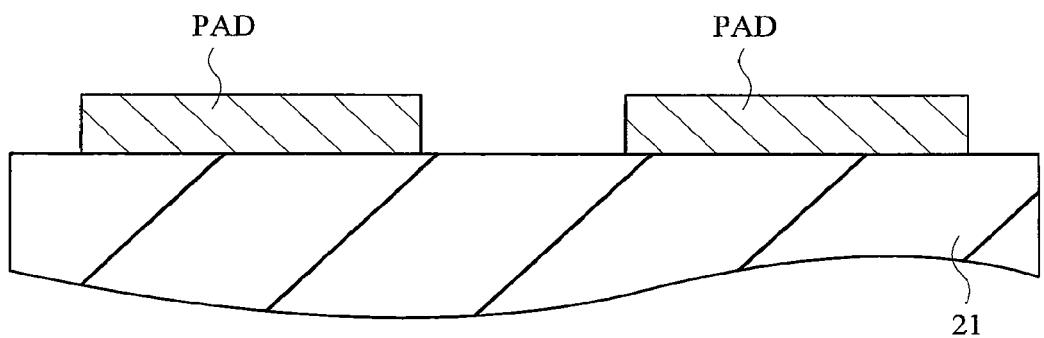
FIG. 20 is a cross sectional view showing a step of manufacturing the semiconductor device continued from FIG. 19.

FIG. 20 shows a silicon oxide film 21 formed over the multilayer wirings, and pads PAD are formed on the silicon oxide film 21. A lower layer structure of the silicon oxide film 21 is omitted, but in the lower layer of the silicon oxide film 21, the low voltage resistant MISFET, the high voltage resistant MISFET and multilayer wirings shown in FIG. 19 are formed.

As shown in FIG. 20, for example, the silicon oxide film 21 is formed. The silicon oxide film 21 may be formed, for example, by use of the CVD method. Then, a titanium/titanium nitride film, an aluminum film and a titanium/titanium nitride film are stacked and formed on the silicon oxide film 21. Thereafter, by use of the photolithography technique and the etching technique, the stacked film is patterned. By this patterning process, pads PAD can be formed on the silicon oxide film 21.

Figure 21:
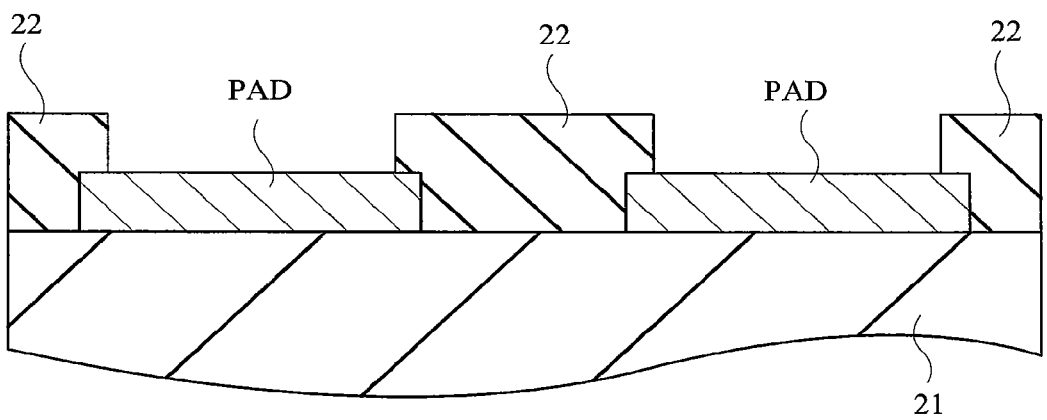
FIG. 21 is a cross sectional view showing a step of manufacturing the semiconductor device continued from FIG. 20.

Subsequently, as shown in FIG. 21, a surface protective film 22 is formed on the silicon oxide film 21 on which the pads PAD are formed. The surface protective film 22 may be formed with, for example, a silicon nitride film, and may be formed by the CVD method. Next, by use of the photolithography technique and the etching technique, an opening portion is formed in the surface protective film 22. This opening portion is formed on the pads PAD and exposes a surface of the pads PAD.

Figure 22:
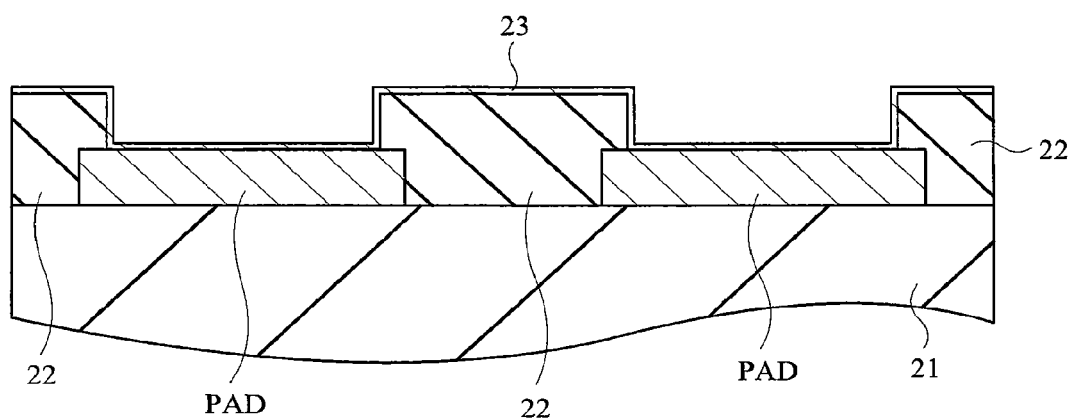
FIG. 22 is a cross sectional view showing a step of manufacturing the semiconductor device continued from FIG. 21.

Next, as shown in FIG. 22, on the surface protective film 22 including the opening portion, an Under Bump Metal (UBM) film 23 is formed. The UBM film 23 may be formed, for example, by use of the sputtering method, and formed with a single layer film or a stacked film of, for example, a titanium film, a nickel film, a palladium film, a titanium tungsten alloy film, a titanium nitride film or a gold film. Herein, the UBM film 23 has a function to improve adhesive property between the bump electrodes and the pads PAD or the surface protective film 22, and a function as an electrode. In addition, the UBM film 23 has a barrier function to restrain or prevent metallic elements of a conductive film to be formed in the next process from moving to the multilayer wiring side, and on the contrary, prevent metallic elements constituting the multilayer wirings from moving to the conductive film side.

Figure 23:
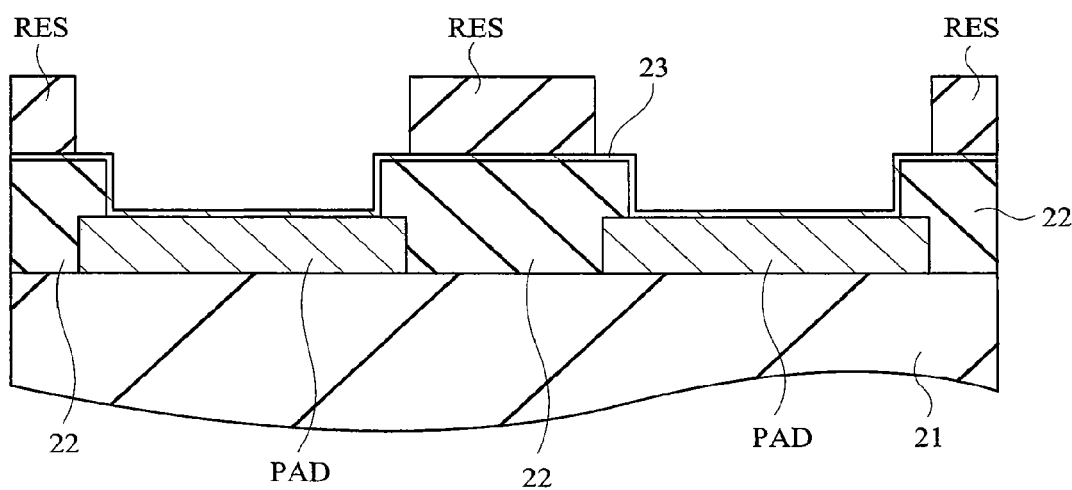
FIG. 23 is a cross sectional view showing a step of manufacturing the semiconductor device continued from FIG. 22.
Figure 24:
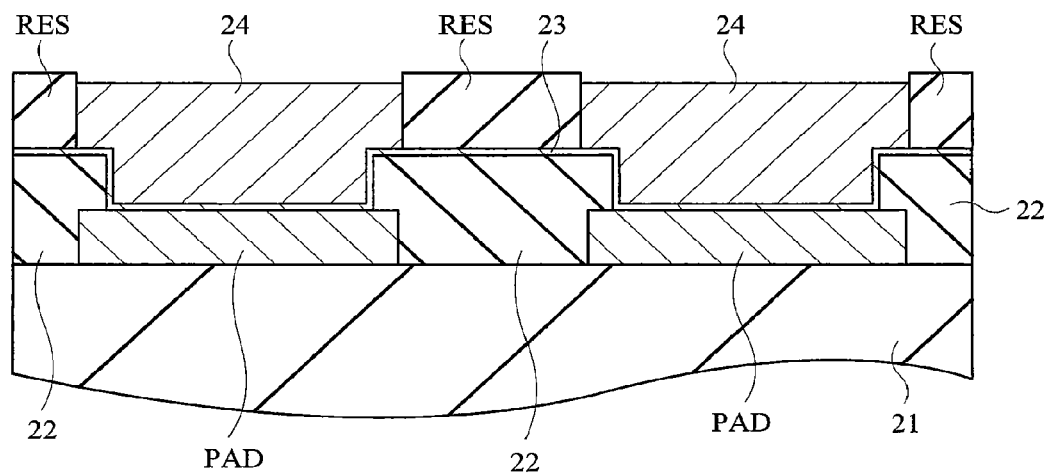
FIG. 24 is a cross sectional view showing a step of manufacturing the semiconductor device continued from FIG. 23.
Figure 25:
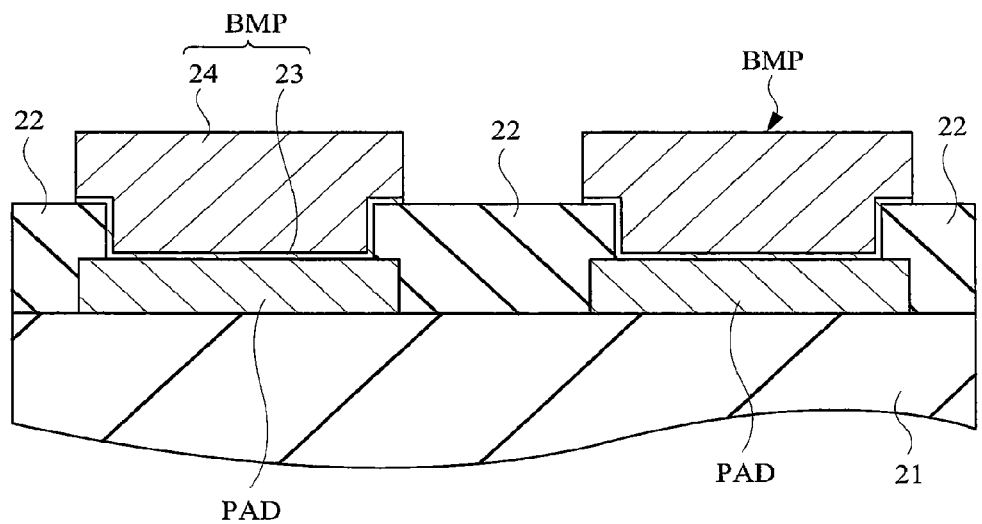
FIG. 25 is a cross sectional view showing a step of manufacturing the semiconductor device continued from FIG. 24.

Subsequently, as shown in FIG. 23, after a resist film RES is applied onto the UBM film 23, this resist film RES is subjected to an exposure/development processing to pattern the film. The patterning is performed so that the resist film RES should not be left in the bump electrode formation region. Then, as shown in FIG. 24, as a conductive film 24, for example, a gold film is formed by the plating method. Thereafter, as shown in FIG. 25, the patterned resist film RES and the UBM film 23 covered with the resist film RES are removed, and whereby a bump electrode BMP composed of the conductive film 24 and the UBM film 23 is formed.

Next, a semiconductor substrate in a semiconductor wafer state is diced, and whereby singulated semiconductor chips CHP are obtained. The singulated semiconductor chip CHP is such a chip as shown in FIG. 1. Thereafter, the semiconductor chips CHP obtained by dividing the semiconductor substrate into pieces are mounted on a glass substrate.

Figure 26:
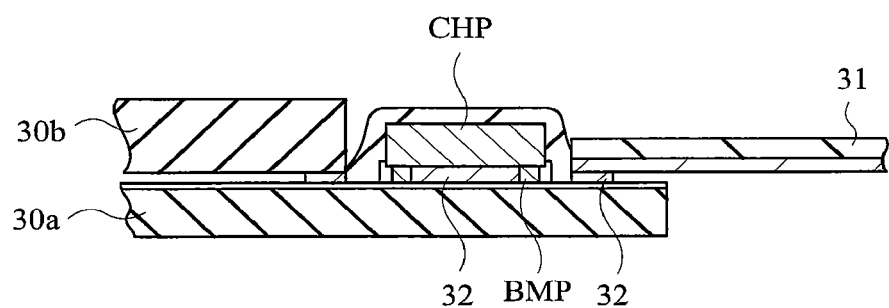
FIG. 26 is a cross sectional view showing a situation in which a semiconductor chips is mounted on a glass substrate.

Next, a state where the semiconductor chip CHP that is an LCD driver is adhered onto a package substrate and mounted thereon is shown. FIG. 26 shows a case where the semiconductor chip CHP is mounted on a glass substrate 30a (COG: Chip On Glass). As shown in FIG. 26, a glass substrate 30b is mounted on the glass substrate 30a, so that a display portion of an LCD is formed. And on the glass substrate 30a at the vicinity of the display portion of the LCD, the semiconductor chip CHP that is the LCD driver is mounted. A bump electrode BMP is formed in the semiconductor chip CHP, and the bump electrode BMP and a terminal formed on the glass substrate 30a are connected via an anisotropic conductive film 32. In addition, the glass substrate 30a and a flexible printed circuit 31 are also connected by the anisotropic conductive film 32. In the semiconductor chip CHP mounted on the glass substrate 30a in this manner, the bump electrode BMP for output is electrically connected to the display portion of the LCD, and the bump electrode BMP for input is connected to the flexible print substrate 31.

Figure 27:
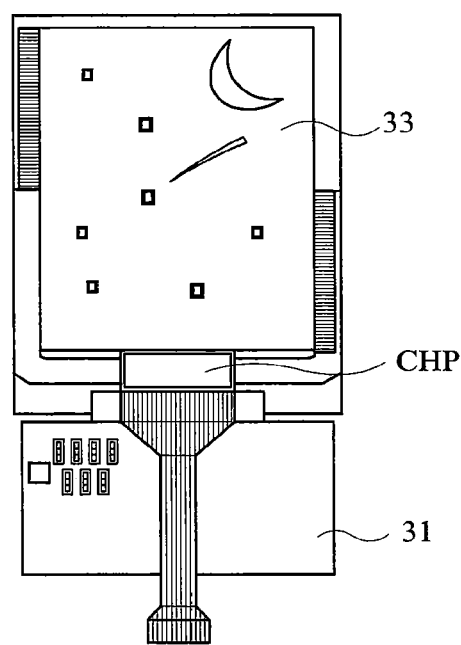
FIG. 27 is a figure showing an entire structure of a LCD.

FIG. 27 is a figure showing an entire structure of the LCD. As shown in FIG. 27, a display portion 33 of the LCD is formed on the glass substrate, and an image is displayed on this display portion 33. The semiconductor chip CHP that is the LCD driver is mounted on the glass substrate at the vicinity of the display portion 33. The flexible print substrate 31 is mounted at the vicinity of the semiconductor chip CHP, and the semiconductor chip CHP that is the LCD driver is mounted between the flexible print substrate 31 and the display portion 33 of the LCD. In this manner, it is possible to mount the semiconductor chip CHP on the glass substrate. Through the processes, it is possible to mount the LCD driver on the glass substrate and manufacture the LCD.

(Second Embodiment)

Figure 28:
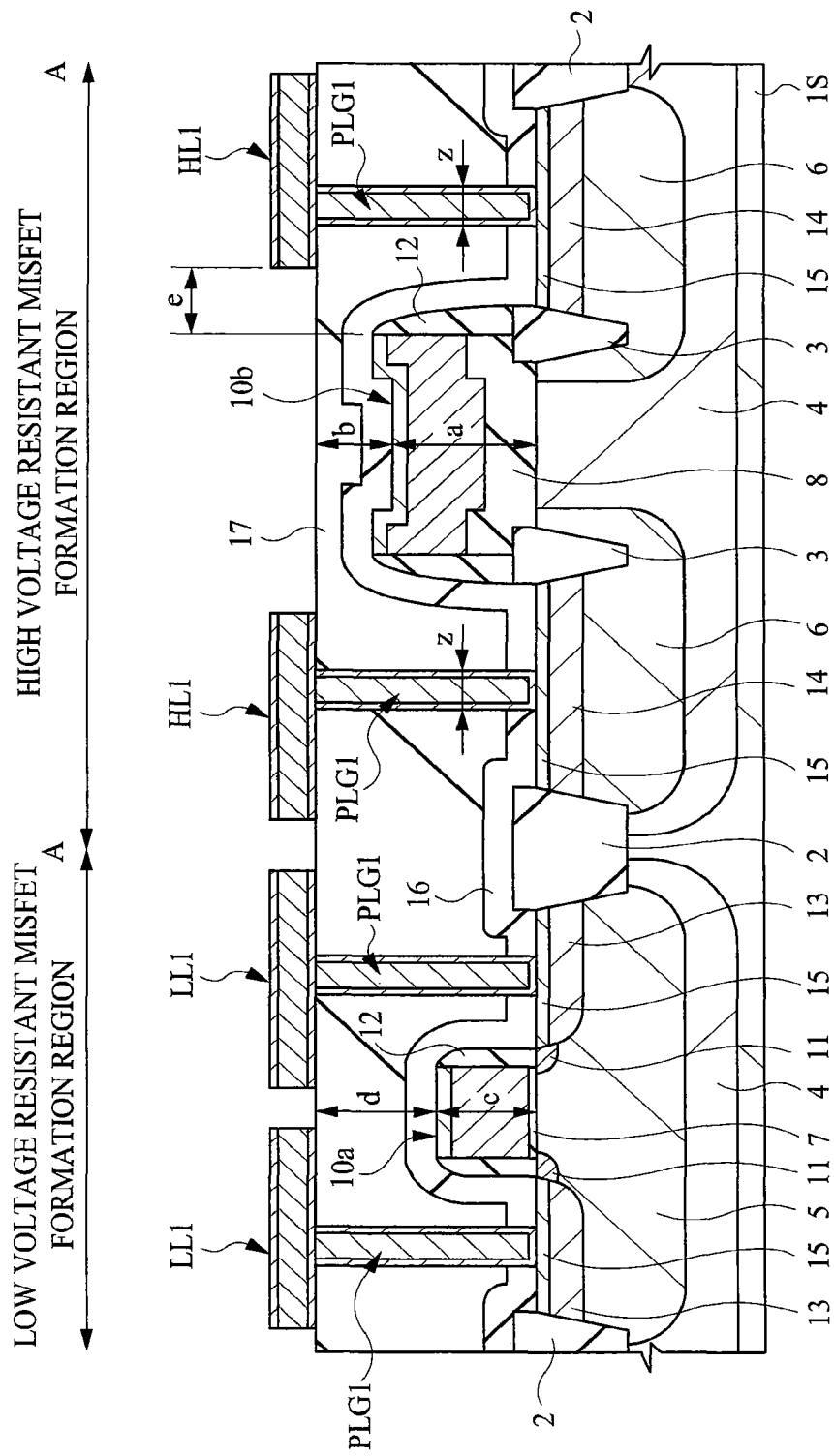
FIG. 28 is a cross sectional view showing semiconductor devices according to a second embodiment and a third embodiment.

One of the characteristics of the first embodiment lies in, as shown in FIG. 28, a point where the wires HL1 to become the source wire and the drain wire are formed on the insulation film (silicon oxide film 17) of the first layer, and the wires HL1 are arranged so that the wires HL1 and the gate electrode 10b of the high voltage resistant MISFET should not be overlapped planarly. In FIG. 28, a distance "e" of an interval in which the gate electrode 10b of the high voltage resistant MISFET and the wires HL1 are not overlapped planarly is shown, and in a second embodiment, specific numerical value examples of this distance "e" will be explained.

FIG. 28 is a cross sectional view showing the high voltage resistant MISFET and the low voltage resistant MISFET, and it is a figure similar to FIG. 2. However, in FIG. 28, the distance "e" of the interval where the gate electrode 10b and the wires HL of the high voltage resistant MISFET are not overlapped planarly, and a diameter "z" of the plug PLG1 are shown.

As shown in FIG. 28, the gate electrode 10b of the high voltage resistant MISFET and the wire HL are separated by only a planar distance "e", but it is necessary to determine this distance in consideration of dimensional errors of a pattern and a gap of patterns formed by the photolithography process. For example, even when a sufficient distance "e" is set to secure the voltage resistance between the gate electrode 10b and the wires HL in a design process, it is thought that there is a case where the gate electrode 10b and wires HL1 may be processed to be overlapped planarly due to dimensional errors in the processing of gate electrode 10b and the wires HL or matching gaps between the gate electrode 10b and the plug PLG1 and between the plug PLG1 and the wires HL1 and the like. In this case, it is not possible to secure the voltage resistance between the gate electrode 10b and the wires HL1.

Therefore, it is necessary to set the distance "e" so as to secure the distance "e" of the interval where the gate electrode 10b and the wires HL1 are not overlapped planarly, even if the dimensional errors of the pattern or the matching gaps of the patterns occur in the above-mentioned photolithography process.

FIG. 29 is a table concretely showing the dimensional errors of the pattern and the matching gaps between patterns in the photolithography process. For example, in FIG. 29, it is understood that the dimensional error (unevenness) of the gate electrode 10b becomes 40 nm at the maximum when the gate electrode 10b is formed by the photolithography process. Furthermore, the matching gap (stack gap, unevenness) of the plug PLG1 to the gate electrode 10b becomes 40 nm at the maximum. In the same manner, the dimensional error of the wires HL1 is 40 nm at the maximum, and the stack gap of the wires HL1 to the plug PLG1 is 70 nm at the maximum. Therefore, in a case when these dimensional errors and the stack gaps work all in a direction where the interval in which the gate electrode 10b and the wires HL1 are not overlapped planarly is made short, an error in which the distance "e" is made shortest is generated In other words, in the case when the distance "e" is 190 nm (40 nm+40 nm+40 nm+70 nm) or less, in some sizes of the dimensional errors of the pattern and the stack gaps in the photolithography process, the gate electrode 10b and the wires HL1 are formed to have a region which is overlapped planarly. As a result, a situation where the voltage resistance between the gate electrode 10b and the wires HL1 cannot be secured occurs. In other words, in the case when the distance "e" is 190 nm or more, it is possible to prevent an occurrence of the region where the gate electrode 10b and the wires HL1 are overlapped planarly, even if the dimensional errors of the pattern and the stack gaps of the pattern in the photolithography process are caused by any cases. From this fact, by making the distance "e" 190 nm or more, it is possible to prevent the gate electrode 10b and the wires HL1 from being overlapped planarly even if the dimensional errors of the pattern and the stack gaps of the patterns in the photolithography process are caused. As a result, it is possible to securely improve the voltage resistance between the gate electrode 10b and the wires HL1 and to realize reliability improvement of the semiconductor device.

In the above-mentioned description, the example where the distance "e", at which the gate electrode 10b and the wires HL1 are not overlapped planarly, is made larger than the value (190 nm) obtained by simply adding the dimensional errors of the pattern and the stack gaps of the patterns in the photolithography process is shown. However, it is thought that there is a low probability of all the dimensional errors of patterns and the stack gaps between patterns occur in the direction to make the distance "e" shorter, and therefore, there may be another method to take the square sum as a method to evaluate the distance "e". In other words, the dimensional errors of the pattern and the stack gaps between patterns in the photolithography process are evaluated by the square sum. In this case, the distance "e" becomes $\sqrt{(40 \times 40 + 40 \times 40 + 40 \times 40 + 70 \times 70)}$=98 nm, and by making the distance "e" more than 98 nm (approximately 100 nm), it is possible to sufficiently prevent the gate electrode 10b and the wires HL1 from being overlapped planarly.

(Third Embodiment)

In the first embodiment, it is characteristic that the wires HL1 formed on the interlayer insulation film of the first layer (silicon oxide film 17) and the gate electrode 10b of the high voltage resistant MISFET shown in FIG. 28 are arranged not to be overlapped planarly. In other words, in the first embodiment, attention is paid to a problem caused by thinning the interlayer insulation film of the first layer, and is paid to the fact that the voltage resistance between the wires HL1 formed in the interlayer insulation film of the first layer and the gate electrode 10b becomes the problem caused by thinning the insulation film of the first layer. At this moment, in the first embodiment, it is quantitatively defined that the interlayer insulation film of the first layer is thinned.

In concrete, as shown in FIG. 28, when the distance from the interface between the semiconductor substrate 1S and the gate insulation film 8 to the upper portion of the gate electrode 10b is defined as "a", and the distance from the upper portion of the gate electrode 10b to the upper portion of the interlayer insulation film on which the wire HL1 is formed is defined as "b", the wire HL1 in which the relation a>b is satisfied is defined as the objective wire in the first embodiment. That is, as a premise of the problem of the voltage resistance failure between the wire HL1 and the gate electrode 10b, attention is paid to the point that the interlayer insulation film of the first layer is thinned, and the point that the gate insulation film 8 of the high voltage resistant MISFET is thick and the gate electrode 10b runs onto the electric field relaxing insulation area 3. Whereby, it becomes possible to clearly define that the wire HL, which is arranged at the position of a>b, causes the problem of the voltage resistance failure with the gate electrode 10b.

In a third embodiment, another expression of the above-mentioned condition a>b will be explained. First, as mentioned above, when the distance from the interface between the semiconductor substrate 1B and the gate insulation film 8 to the upper portion of the gate electrode 10b is defined as "a" and the distance from the upper portion of the gate electrode 10b to the upper portion of the interlayer insulation film on which the wire HL1 is formed is defined as "b", a condition in which the relation a>b is established is a prior condition of the present invention. Herein, as another condition, there is a relation between a diameter "z" of the plug PLG1 and a thickness "f" (not shown) of the interlayer insulation film (silicon oxide film 17+silicon nitride film 16) (f=a+b). In other words, the plug PLG1 is formed to penetrate the interlayer insulation film, and from the view point to make embedding characteristic of the plug PLG1 preferable, it is necessary to make an aspect ratio a specified value or less. Herein, the aspect ratio is a quantity f/z expressed by the thickness "f" of the interlayer insulation film and the diameter "z" of the plug PLG1. For example, when this aspect ratio becomes large, the embedding characteristic becomes worse by forming the plug PLG1 of a small diameter in a thick interlayer insulation film. In other words, from the viewpoint of making the embedding characteristic of the plug PLG1 preferable, it is necessary to make the aspect ratio a specified value or below. In concrete, for example, this condition may be expressed by a condition of f/z<5. In other words, when the thickness "f" of the interlayer insulation film and the diameter "z" of the plug PLG1 are determined so that the aspect ratio f/z is 5 or less, it is possible to prevent the embedding characteristic of the plug PLG1 from deteriorating.

Herein, the thickness f of the interlayer insulation film is expressed by f=a+b, and from this expression, a=f−b is obtained. When this is assigned to a>b, f>2b is obtained. On the other hand, from the relational expression of the aspect ratio f/z<5, f<5z is obtained. Accordingly, from the two relational expressions f<5z and f>2b, the relation 2b<5z is obtained. When this 2b<5z is solved by b, it becomes that b<2.5z. From the above, it is understood that the condition a>b may be replaced by the condition b<2.5z by use of the thickness of the interlayer insulation film f=a+b and the relational expression of the aspect ratio f/z<5. By words, when the distance from the upper portion of the gate electrode 10b to the upper portion of the interlayer insulation film on which the wires HL1 are formed is defined as "b", and the diameter of the plug PLG1 is defined as "z", the condition where the relation of b<2.5z is established may be replaced by a condition that the distance "b" from the upper portion of the gate electrode 10b to the upper portion of the interlayer insulation film on which the wires HL1 are arranged is smaller than 2.5 times of the diameter "z" of the plug PLG1. In other words, as for the feature of the present invention, in the third embodiment, when the distance "b" from the upper portion of the gate electrode 10b to the upper portion of the interlayer insulation film on which the wires HL1 are arranged is smaller than 2.5 times of the diameter "z" of the plug PLG1, the gate electrode 10b and the wires HL1 should be arranged so as not to be overlapped planarly.

Incidentally, the diameter of the plug PLG1 is defined as "z", and when the diameter of the plug PLG1 is same in the whole of the plug PLG1, there is no problem. But actually, the diameter at the surface of the interlayer insulation film (silicon oxide film 17) is largest, and the diameter is formed so as to become smaller toward the bottom portion of the plug PLG1. In this case, there is a problem that at which depth the diameter "z" of the plug PLG1 is taken. But in the third embodiment, the diameter at the bottom portion of the plug PLG1 is defined as "z".

(Fourth Embodiment)

In the first embodiment, the case where the present invention is applied to the high voltage resistant MISFET is explained, but in a fourth embodiment, a case where the present invention is applied to a resistance element will be explained. In other words, in the LCD driver, in addition to the low voltage resistant MISFET and the high voltage resistant MISFET, a plurality of resistance elements constituting circuits are formed. Among these resistance elements, there are resistances to which a high voltage is applied in the same manner as in the high voltage resistant MISFET. Therefore, the voltage resistance becomes a problem in the resistance elements using the high voltage in the same manner as the high voltage resistant MISFET.

Figure 30:
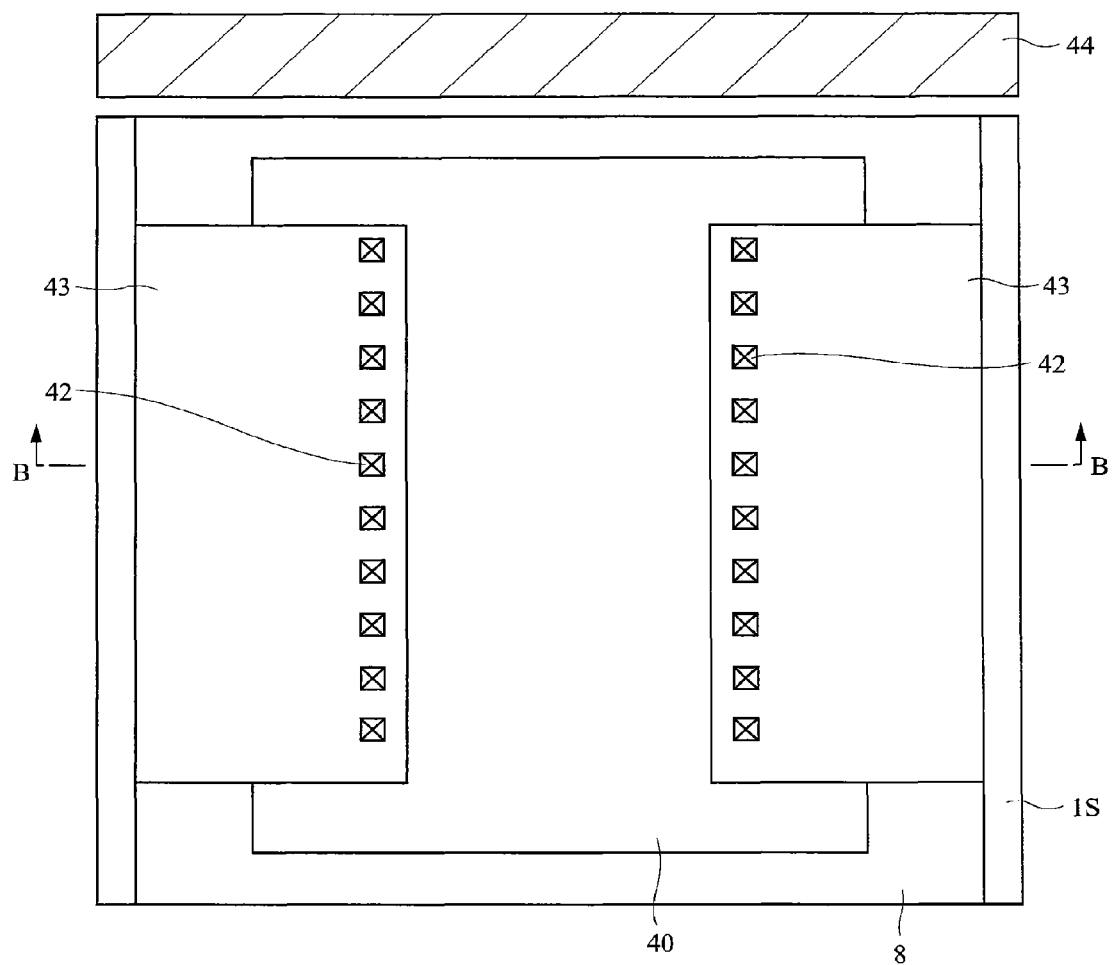
FIG. 30 is a plane view showing a structure of a resistance element according to a fourth embodiment.

FIG. 30 is a plan view showing a resistance element in the fourth embodiment. In FIG. 30, a gate insulation film 8 is formed on the semiconductor substrate 1S, and a polysilicon film (conductive film) 40 to become a resistance element is formed on this gate insulation film 8. Wires 43 are connected to this polysilicon film 40 to become the resistance element by plugs (fourth plugs) 42. On the other hand, wire 44 not connected to the resistance element is also formed.

The feature of the fourth embodiment is that among the wires 43 and the wires 44 formed on the polysilicon film 40 to become the resistance element, the wire 44 to which an electric potential different from that of the polysilicon film 40 is applied is arranged not to be overlapped with the polysilicon film 40 planarly. In other words, since the wire 43 electrically connected directly to the polysilicon film 40 via the plug 42 is conductive, the problem of the voltage resistance does not occur with the polysilicon film 40. From this fact, as shown in FIG. 30, the polysilicon film 40 and the wire 43 are arranged to be overlapped planarly. In contrast, in the wire 44 not electrically connected directly to the polysilicon film 40 via the plug 42 and to which an electric potential different from that of the polysilicon film 40 is applied, there is a case where a high potential difference is generated between the polysilicon film 40 and the wire 44. In this case, the voltage resistance becomes a problem between the polysilicon film 40 and the wire 44. Therefore, for the wire 44 not electrically connected directly to the polysilicon film 40 via the plug 42, the polysilicon film 40 to become a resistance element is arranged so as not to be overlapped with the wire 44 planarly. By this structure, even if a high voltage is applied to between the polysilicon film 40 to become the resistance element and the wire 44, it is possible to secure the voltage resistance.

Figure 31:
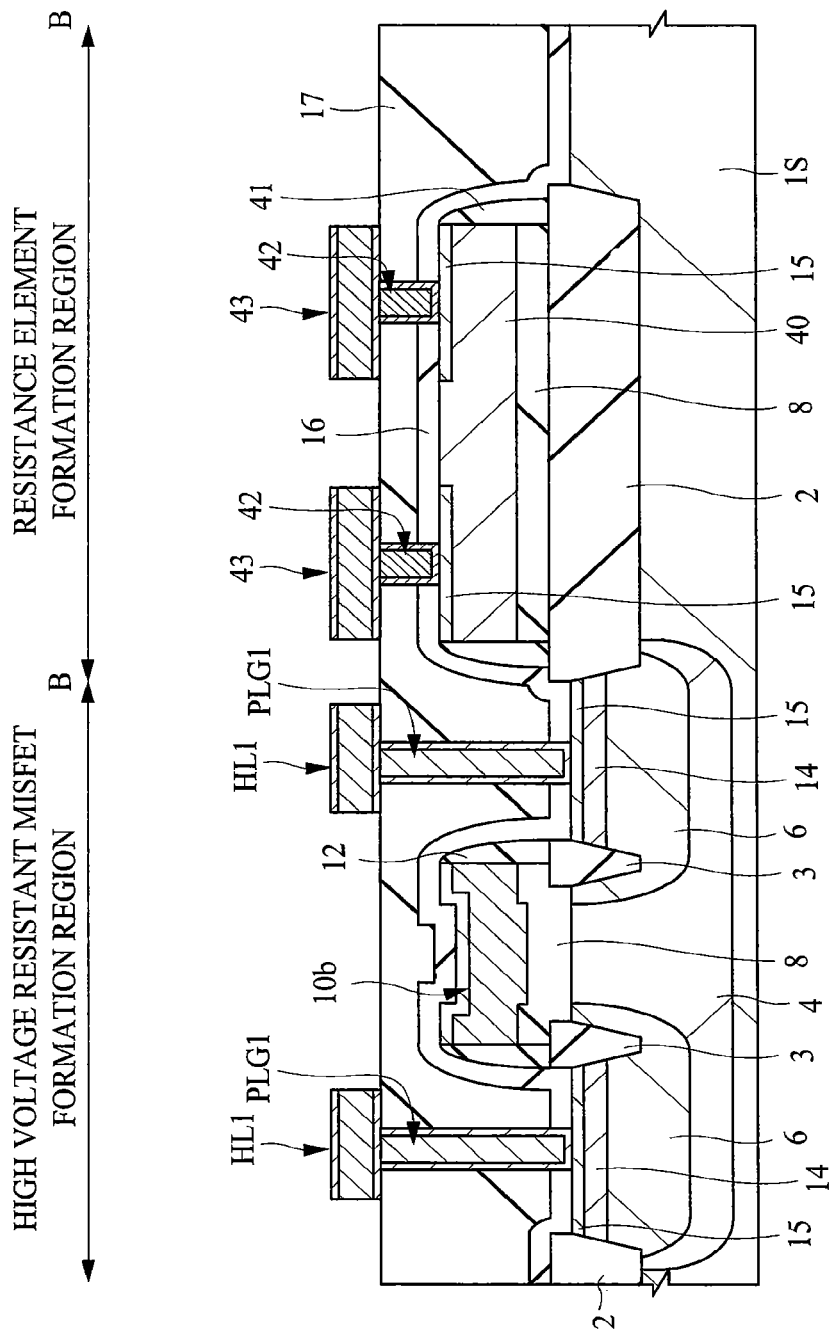
FIG. 31 is a cross sectional view including a cross section at B-B line in FIG. 30.

FIG. 31 is a cross sectional view at the B-B line in FIG. 30. In FIG. 31, the resistance element formation region is formed to be adjacent to the high voltage resistant MISFET formation region. Hereinafter, a structure of the resistance element formed in the resistance element formation region will be explained. In FIG. 31, an element isolation region 2 is formed over the semiconductor substrate is, and on this element isolation region 2, a film (referred to as gate insulation film 8) having the same film thickness as that of the gate insulation film 8 used for the high voltage resistant MISFET is formed. A polysilicon film 40 is formed on this gate insulation film 8, and the polysilicon film 40 is formed by use of the same film as that of the polysilicon film constituting the gate electrode 10b of the high voltage resistant MISFET. The polysilicon film 40 functions as a resistance element. On side walls of this polysilicon film 40, side walls 41 similar to the side walls 12 are formed by performing a process of forming the side walls 12 of the MISFET. Furthermore, in a part of the surface of the polysilicon film 40, a cobalt silicide film 15 is formed.

An interlayer insulation film is formed so as to cover the polysilicon film 40. The interlayer insulation film is formed with a silicon nitride film 16 and a silicon oxide film 17. In the interlayer insulation film, a plug 42 penetrating the interlayer insulation film and reaching the cobalt silicide film 15 formed on the surface of the polysilicon film 40 is formed, and a wire 43 electrically connected directly to this plug 42 is formed on the interlayer insulation film. Since FIG. 31 shows the cross sectional view at the B-B line in FIG. 30, the wire 43 electrically connected directly to the polysilicon film 42 via the plug 42 is shown. In addition, it is shown in FIG. 30 that the feature of the fourth embodiment in which the wire 44 and the polysilicon film 40 are not overlapped planarly.

Herein, the resistance element is formed by use of a process of forming the high voltage resistant MISFET. In other words, for the gate insulation film 8 formed over the element isolation region 2, the same film as that of gate insulation film 8 of the high voltage resistant MISFET is used, and for the polysilicon film 40 formed on the gate insulation film 8, the same film as that of the polysilicon film constituting the gate electrode 10b of the high voltage resistant MISFET is used. Therefore, a height of the resistance element becomes same as that of the high voltage resistant MISFET.

On the other hand, a thickness of the interlayer insulation film is the same thickness in both regions of the high voltage resistant MISFET formation region and the resistance element formation region, and from the viewpoint of lowering the aspect ratio of the plug PLG1 in the high voltage resistant MISFET as much as possible, the thickness of the interlayer insulation film is made thin.

From this fact, in the high voltage resistant MISFET formation region, when the distance from the interface between the semiconductor substrate 1S and the gate insulation film 8 to the upper portion of the gate electrode 10b is defined as "a", and the distance from the upper portion of the gate electrode 10b to the upper portion of the interlayer insulation film on which the wires HL1 are formed is defined as "b", the condition of a>b is established.

The polysilicon film 40 (resistance element) is formed on the gate insulation film 8, and the polysilicon film 40 (resistance element) is formed with the same film as that of the polysilicon film constituting the gate electrode 10b of the high voltage resistant MISFET. For this reason, even in the resistance element formation region, a distance from the interface between the semiconductor substrate 1S and the gate insulation film 8 to the upper portion of the polysilicon film 40 becomes same as "a", and a distance from the upper portion of the polysilicon film 40 to the upper portion of the interlayer insulation film on which the wire 43 and the wire 44 (refer to FIG. 30) are formed becomes same as "b". For this reason, in the resistance element formation region, the condition of a>b is established.

From the above fact, in the resistance element, the film thickness of the interlayer insulation film existing between the polysilicon film 40 and the wire 44 (not shown in FIG. 31) is thin, and as with the high voltage resistant MISFET, the voltage resistance between the polysilicon film 40 and the wire 44 via the interlayer insulation film becomes a problem. Therefore, as shown in FIG. 30, also in the resistance element, among the wire 43 and the wire 44 formed on the polysilicon film 40 which is to be the resistance element, the wire 44 to which an electric potential different from that of the polysilicon film 40 is applied is arranged not to be overlapped with polysilicon film 40 planarly. By this structure, even if the interlayer insulation film becomes thin, it is possible to secure the voltage resistance between the polysilicon film 40 and the wire 44.

Herein, as a method of lowering the height of the resistance element, it is thought that there may be the case where the polysilicon film 40 constituting the resistance element is not formed on the thick gate insulation film 8, but directly formed on the element isolation region 2, or the case where the polysilicon film 40 is formed on the thin gate insulation film of the low voltage resistant MISFET. In this case, since the height of the polysilicon film 40 constituting the resistance element is made low, the thickness of the interlayer insulation film existing between the polysilicon film 40 and the wire 44 can be made thick, and therefore, it is thought that the voltage resistance between the polysilicon film 40 and the wire 44 can be improved.

Figure 32:
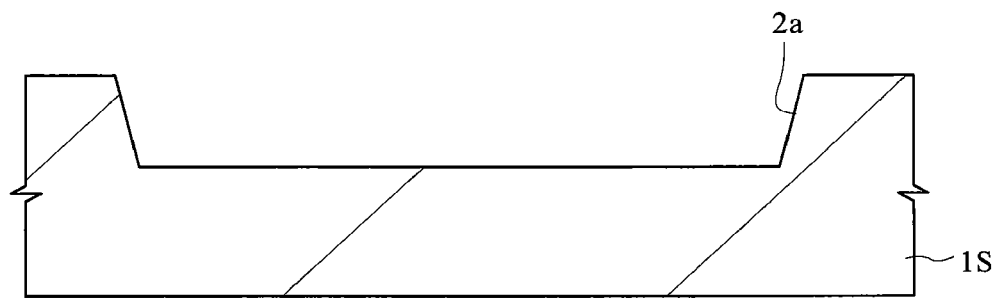
FIG. 32 is a cross sectional view showing a step of forming a general element isolation region.
Figure 33:
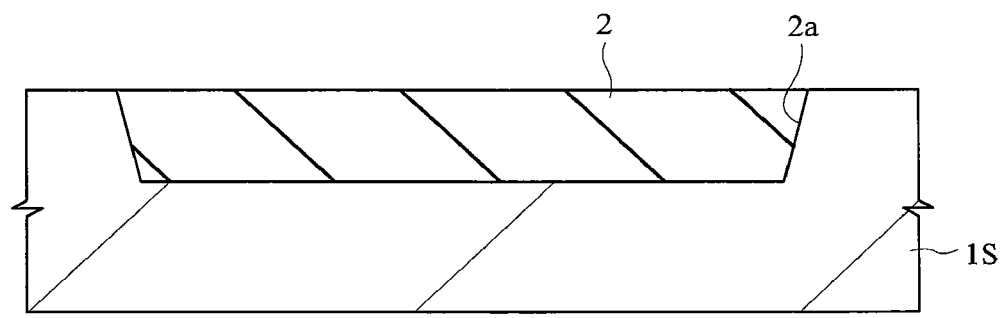
FIG. 33 is a cross sectional view showing a step of forming the general element isolation region continued from FIG. 32.

However, in the fourth embodiment, the polysilicon film 40 that is the resistance element is formed on the same film as that of the gate insulation film 8 of the high voltage resistant MISFET for the following reason. This reason will be explained with reference to the drawings. FIG. 32 and FIG. 33 are cross sectional views showing a process of forming a general element isolation region. For example, as shown in FIG. 32, an element isolation trench 2a is formed in the semiconductor substrate 1S by use of the photolithography technique and the etching technique. As shown in FIG. 33, after the silicon oxide film is formed to be filled in this element isolation trench 2a, the silicon oxide film formed on the surface of the semiconductor substrate 1S is removed by the chemical mechanical polishing method (CMP). Accordingly, since the silicon oxide film can be left only in the element isolation trench 2a, it is possible to form the element isolation region 2 in which the element isolation trench 2a is filled with the silicon oxide film. FIG. 32 and FIG. 33 are the formation process of the normal element isolation region 2.

Figure 34:
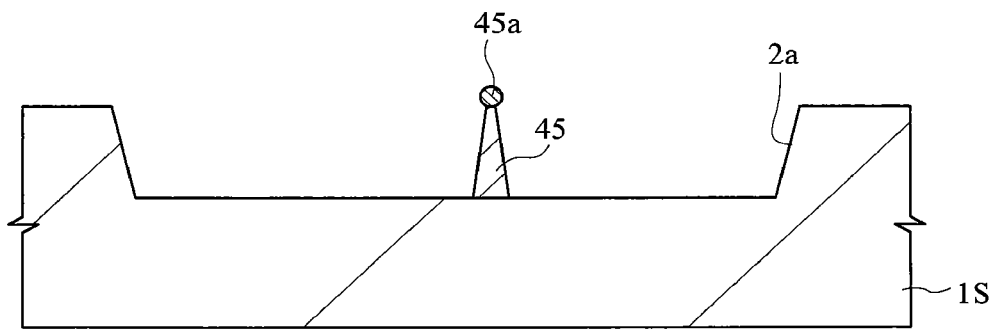
FIG. 34 is a cross sectional view showing a state in which etching remain is left due to a foreign matter upon forming an element isolation trench.
Figure 35:
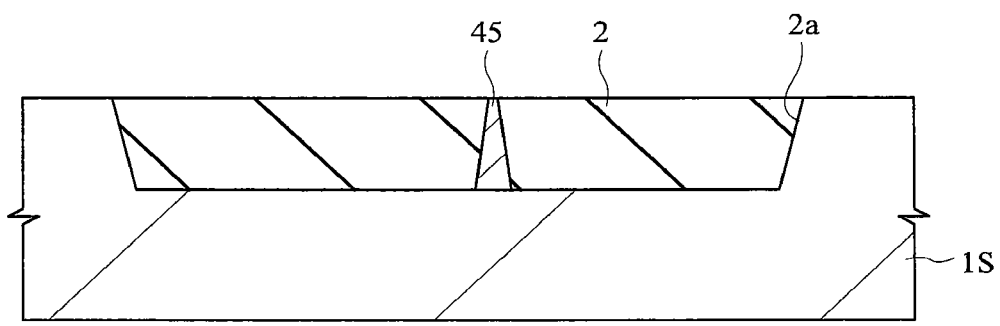
FIG. 35 is a cross sectional view showing a step of forming the element isolation region continued from FIG. 34.

However, for example, as shown in FIG. 34, it is assumed that when the element isolation trench 2a is formed in the semiconductor substrate 1S, a foreign matter 45a attaches to an etching region of the semiconductor substrate 1S. Then, the foreign matter 45a becomes the mask, and silicon formed under the foreign matter is left without being etched. In other words, an etching remain 45 is formed under the foreign matter 45a as shown in FIG. 34. Thereafter, as shown in FIG. 35, when the element isolation trench 2a is filled with the silicon oxide film to form the element isolation region 2, the etching remain 45 is left.

Figure 36:
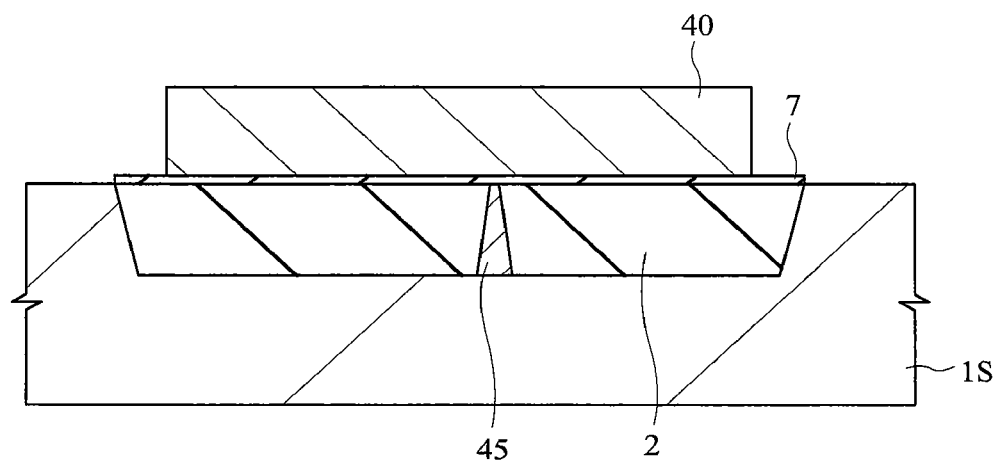
FIG. 36 is a cross sectional view showing an example of forming a resistance element via a thin gate insulation film over the element isolation region on which the etching remain is formed.

Therefore, when the polysilicon film 40 to become the resistance element is formed over the element isolation region 2 in which the etching remain 45 is formed, since the etching remain 45 is formed with silicon, an inconvenience that the polysilicon film 40 and the semiconductor substrate 1S are shortcircuited via the etching remain 45 occurs. This inconvenience becomes conspicuous in the case where the polysilicon film 40 is formed directly on the element isolation region 2, and as shown in FIG. 36, in the case where the polysilicon film 40 is formed via a thin gate insulation film 7, since a high voltage is applied to the polysilicon film 40, shortcircuit failures tend to be generated.

Figure 37:
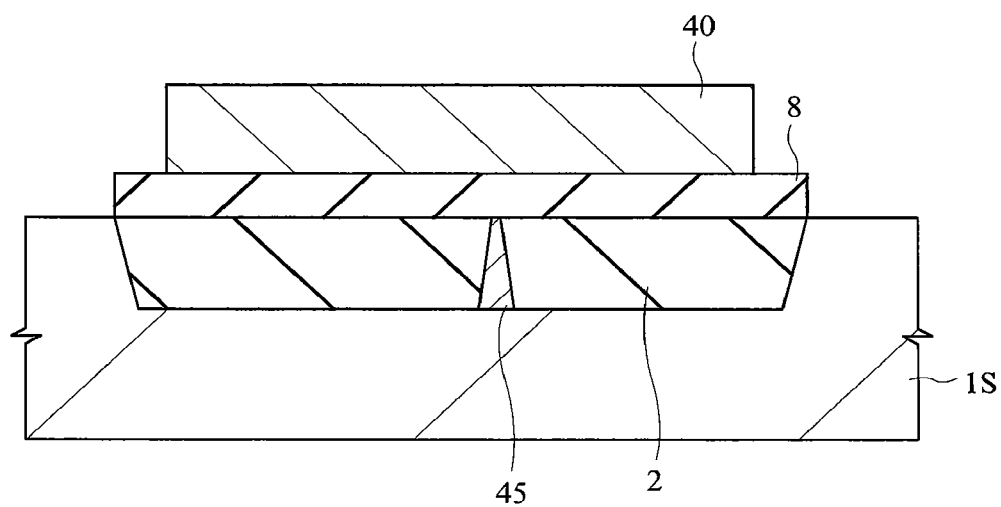
FIG. 37 is a cross sectional view showing an example of forming a resistance element via a thick gate insulation film over the element isolation region on which the etching remain is formed.

From this fact, as shown in FIG. 37, after the thick gate insulation film 8 is formed on the element isolation region 2, the polysilicon film 40 is formed on this thick gate insulation film 8. By forming the thick gate insulation film 8 between the polysilicon film 40 that is the resistance element and the element isolation region 2, as shown in FIG. 37, even if the etching remain 45 is generated in the element isolation region 2, it is possible to largely reduce a possibility of the shortcircuit between the polysilicon film 40 and the semiconductor substrate 1S via the etching remain 45.

From the above-mentioned reasons, the polysilicon film 40 constituting the resistance element is formed on the same thick gate insulation film 8 as the gate insulation film 8 of the high voltage resistant MISFET. For this reason, the polysilicon film 40 (resistance element) is formed on the gate insulation film 8, and the polysilicon film 40 (resistance element) is formed with the same film of the polysilicon film constituting the gate electrode 10b of the high voltage resistant MISFET. Therefore, in the resistance element formation region, the distance from the interface between the semiconductor substrate 1S and the gate insulation film 8 to the upper portion of the polysilicon film 40 is the same distance as "a", and the distance from the upper portion of polysilicon film 40 to the upper portion of the interlayer insulation film on which the wire 43 and the wire 44 (refer to FIG. 30) are formed is the same distance as "b". For this reason, also in the resistance element formation region, the condition of a>b is established.

However, in the fourth embodiment, among the wire 43 and the wire 44 formed on the polysilicon film 40 to become the resistance element, the wire 44 to which an electric potential different from that of the polysilicon film 40 is applied is arranged not to be overlapped with polysilicon film 40 planarly, and therefore, even if the interlayer insulation film is thin, it is possible to realize an remarkable effect to secure the voltage resistance between an polysilicon film 40 and the wire 44.

(Fifth Embodiment)

In the first embodiment, the process has been explained where after the low voltage resistant MISFET and the high voltage resistant MISFET are formed, the interlayer insulation film is formed so as to cover the low voltage resistant MISFET and the high voltage resistant MISFET, thereafter, wires are formed on the interlayer insulation film. In a fifth embodiment, the formation process of the interlayer insulation film will be explained in more details.

Figure 38:
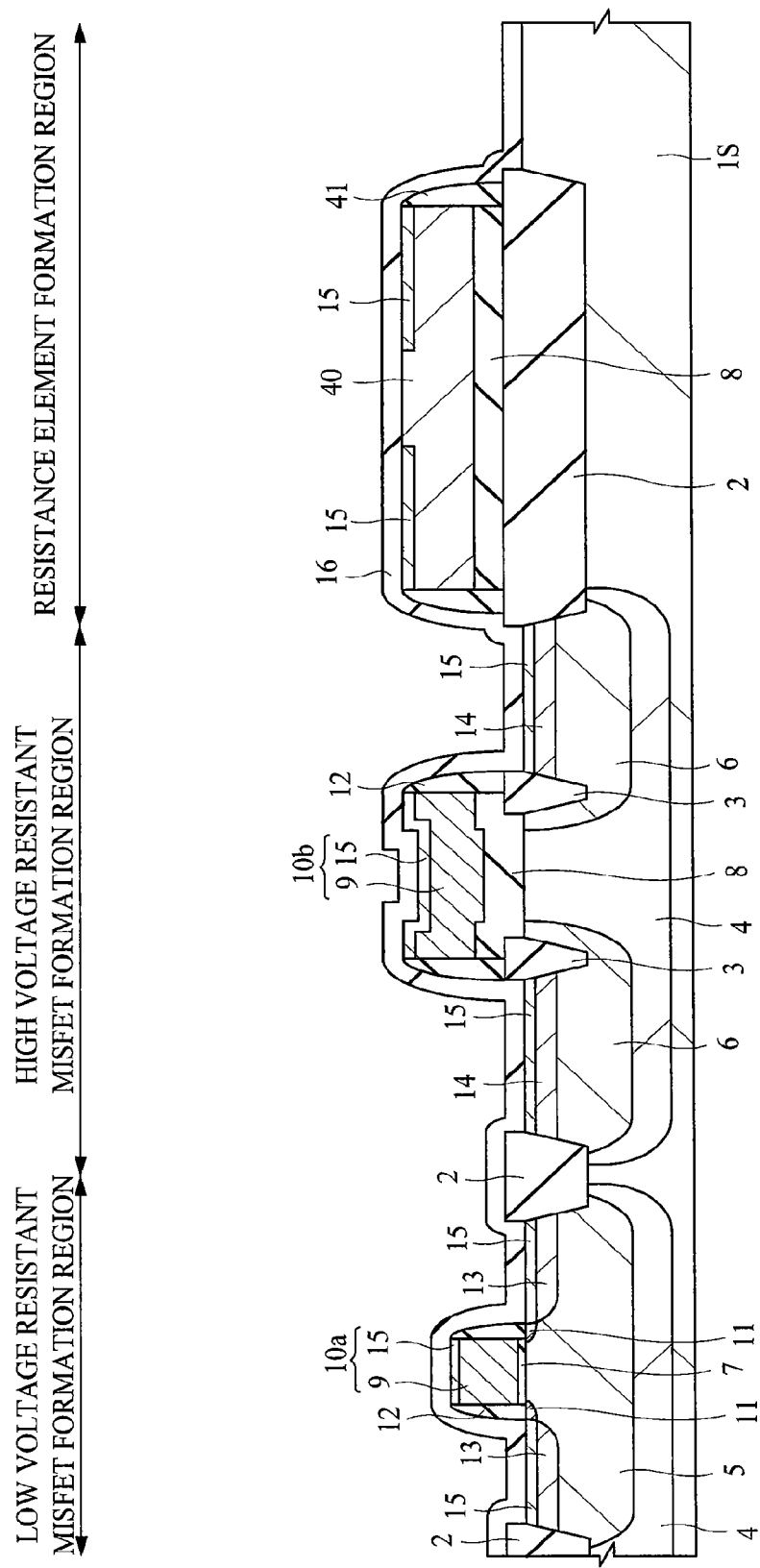
FIG. 38 is a cross sectional view showing a step of manufacturing a semiconductor device according to a fifth embodiment.

FIG. 38 is a cross sectional view showing a state where the low voltage resistant MISFET, the high voltage resistant MISFET, and the resistance element are formed over the semiconductor substrate 1S. In other words, in FIG. 38, in addition to the low voltage resistant MISFET and the high voltage resistant MISFET, the resistance element is formed. This resistance element is formed by use of the process of forming the high voltage resistant MISFET. As shown in FIG. 38, a silicon nitride film 16 is formed so as to cover the low voltage resistant MISFET, the high voltage resistant MISFET, and the resistance element. The silicon nitride film 16 may be formed by, for example, the CVD method.

Figure 39:
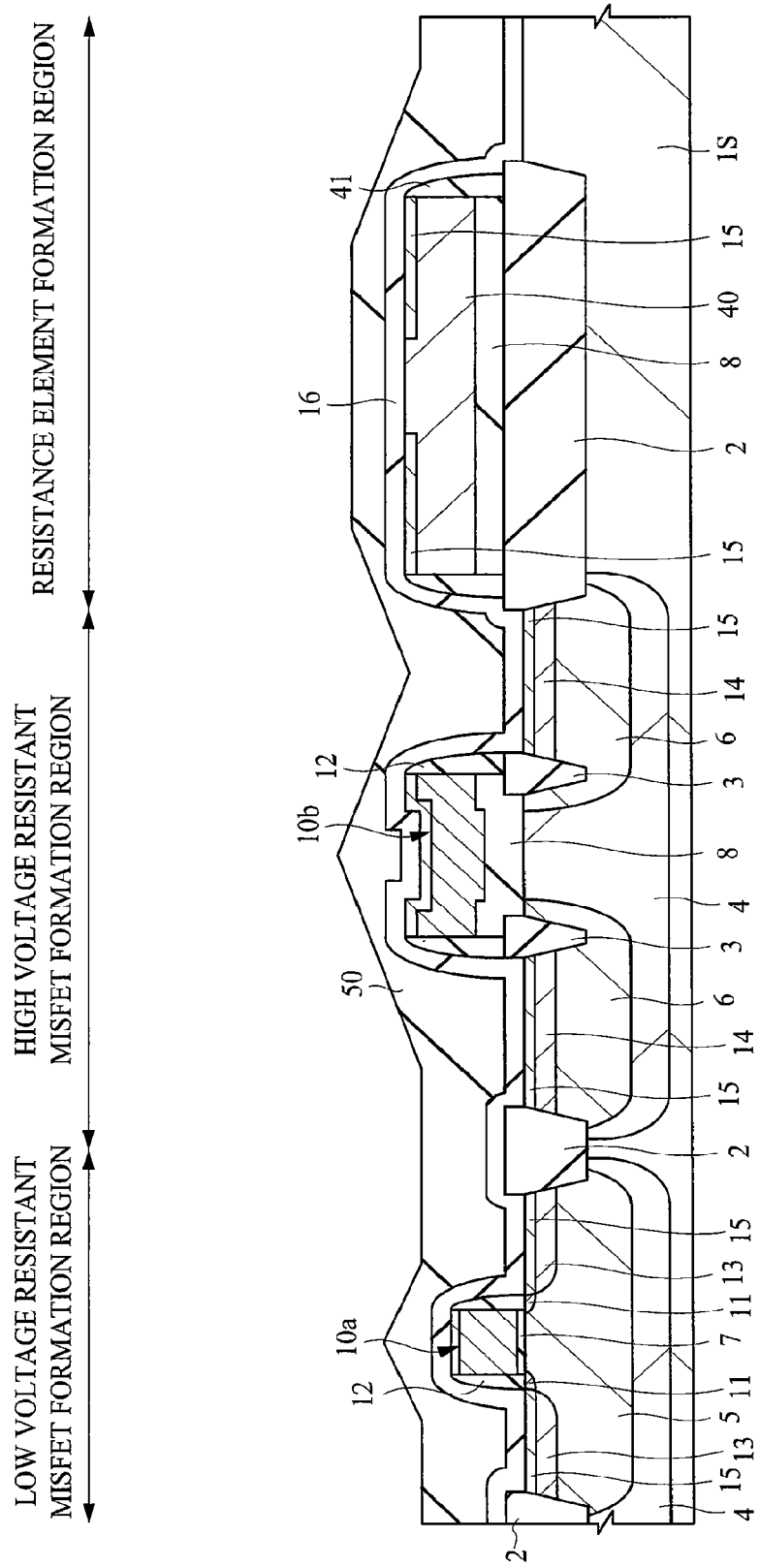
FIG. 39 is a cross sectional view showing a step of manufacturing the semiconductor device continued from FIG. 38.

Subsequently, as shown in FIG. 39, a silicon oxide film 50 is formed on the silicon nitride film 16 formed over the semiconductor substrate 1S. This silicon oxide film 50 may be formed, for example, by the high density plasma CVD method using high density plasma. The high density plasma is what gas is made into a plasma state at a high density by use of a high frequency electric field and a magnetic field. The high density plasma CVD method is a method in which gas introduced into a chamber is made into a high density plasma state, and the high density plasma is chemically reacted, and whereby a film is deposited on the semiconductor substrate 15. As the method of generating the high density plasma, there are, for example, the induction coupled plasma (ICP) and the electron cyclotron resonance (ECR) method and the like.

The induction coupled plasma is one kind of the high density plasmas used in the chemical vapor deposition method, and is plasma generated by activating gas introduced into a chamber by high frequency coils. On the other hand, the electronic cyclotron resonance is a following phenomenon. That is, when an electron receives the Lorentz force in a magnetic field, the electrons performs a cyclotron movement in which it goes around on a plane perpendicular to the magnetic field. At this moment, on the movement plane of the electron, an electric field matching the go-around frequency is given, an energy resonance between the cyclotron movement and the electric field occurs, and the electric field energy is absorbed into the electron, so that a large energy is supplied to the electron. By use of this phenomenon, it is possible to make various gases into high density plasma state.

The silicon oxide film 50 formed by the high density plasma CVD method as above-mentioned is advantageous in that its embedding characteristic is excellent. Therefore, even in an element such as a memory cell of an Static Random Access Memory (SRAM) in which an interval between the gate electrodes is made narrow with a microminiaturized structure, it is possible to make the embedding characteristic of the silicon oxide film to the gate electrodes preferable by forming the silicon oxide film 50 on the silicon nitride film 16 by the high density plasma CVD method. In other words, in the semiconductor device to become the LCD driver, the SRAM is also mounted, and as for this SRAM, the distance between the gate electrodes become extremely narrow with the microminiaturized structure. For this reason, when the silicon oxide film is filled in between the gate electrodes by the CVD method by use of normal density plasma, a space between the gate electrodes cannot be filled sufficiently, and "void space" is generated in the space between the gate electrodes. When the "void space" is generated between the gate electrodes, a conductive film used to form plugs in a process mentioned later enters into the inside of the "void space", and a failure in which adjacent plugs cause a shortcircuit via the conductive film entering in the inside of the "void space". Therefore, in the fifth embodiment, the silicon oxide film 50 is formed on the silicon nitride film 16 by use of the high density plasma CVD method having preferable embedding characteristic. By depositing the silicon oxide film 50 by use of the high density plasma CVD method in this manner, in elements of the microminiaturized structure such as the SRAM, it is possible to improve the embedding characteristic into the space between the gate electrodes. As a result, it is possible to restrain an occurrence of the "void space" and prevent the shortcircuit among adjacent plugs.

Figure 40:
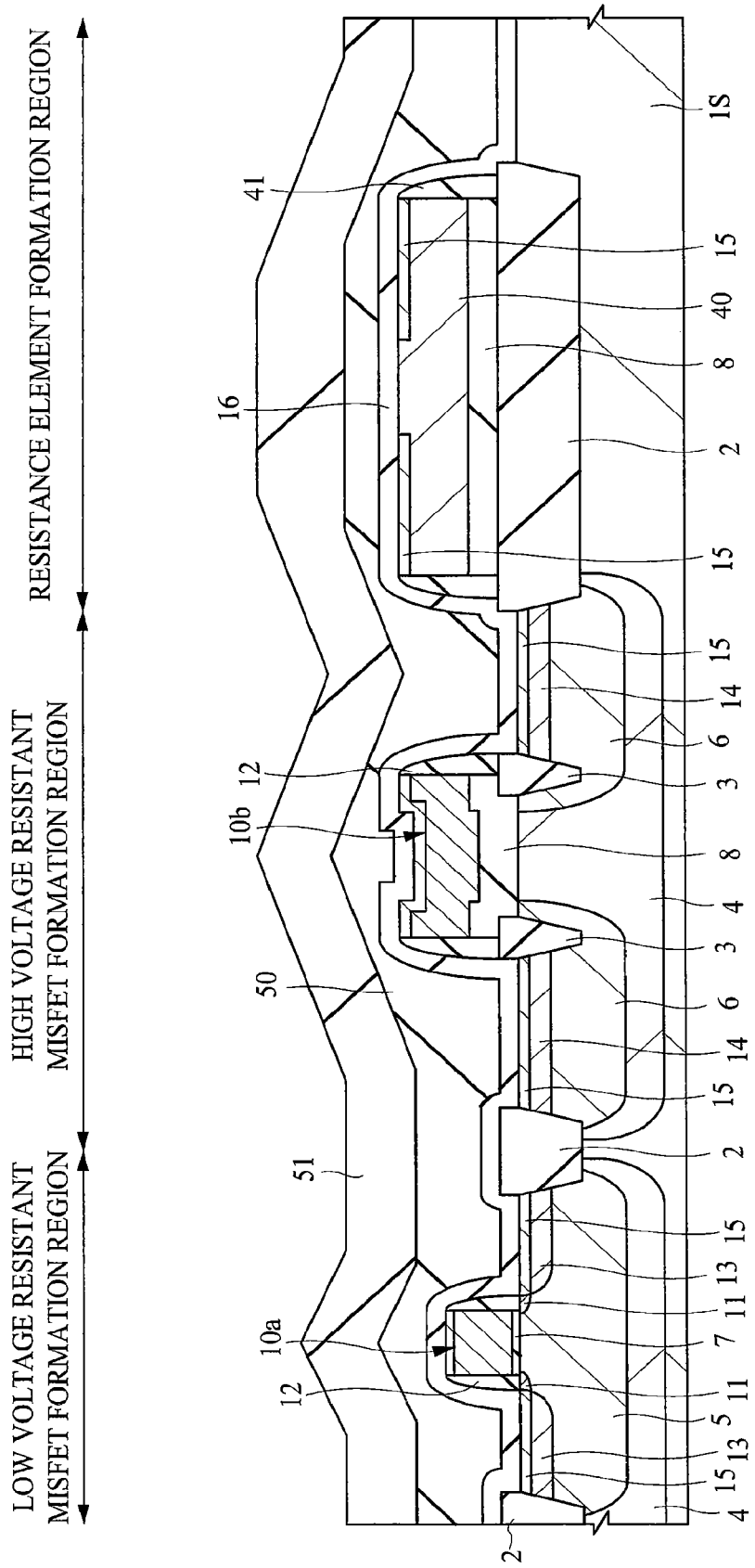
FIG. 40 is a cross sectional view showing a step of manufacturing the semiconductor device continued from FIG. 39.

Next, as shown in FIG. 40, a silicon oxide film 51 is formed on the silicon oxide film 50. The silicon oxide film 51 may be made, for example, by use of the plasma CVD method in which tetra ethyl ortho silicate (TEOS) is used as raw material. In the plasma CVD method using the TEOS as the raw material, the normal density plasma lower than the density of the high density plasma CVD method mentioned-above is used. In the normal plasma CVD method using the TEOS as the raw material, film thickness control characteristics of the silicon oxide film 51 is preferable, and the silicon oxide film 51 is formed to increase the film thickness of the interlayer insulation film.

Figure 41:
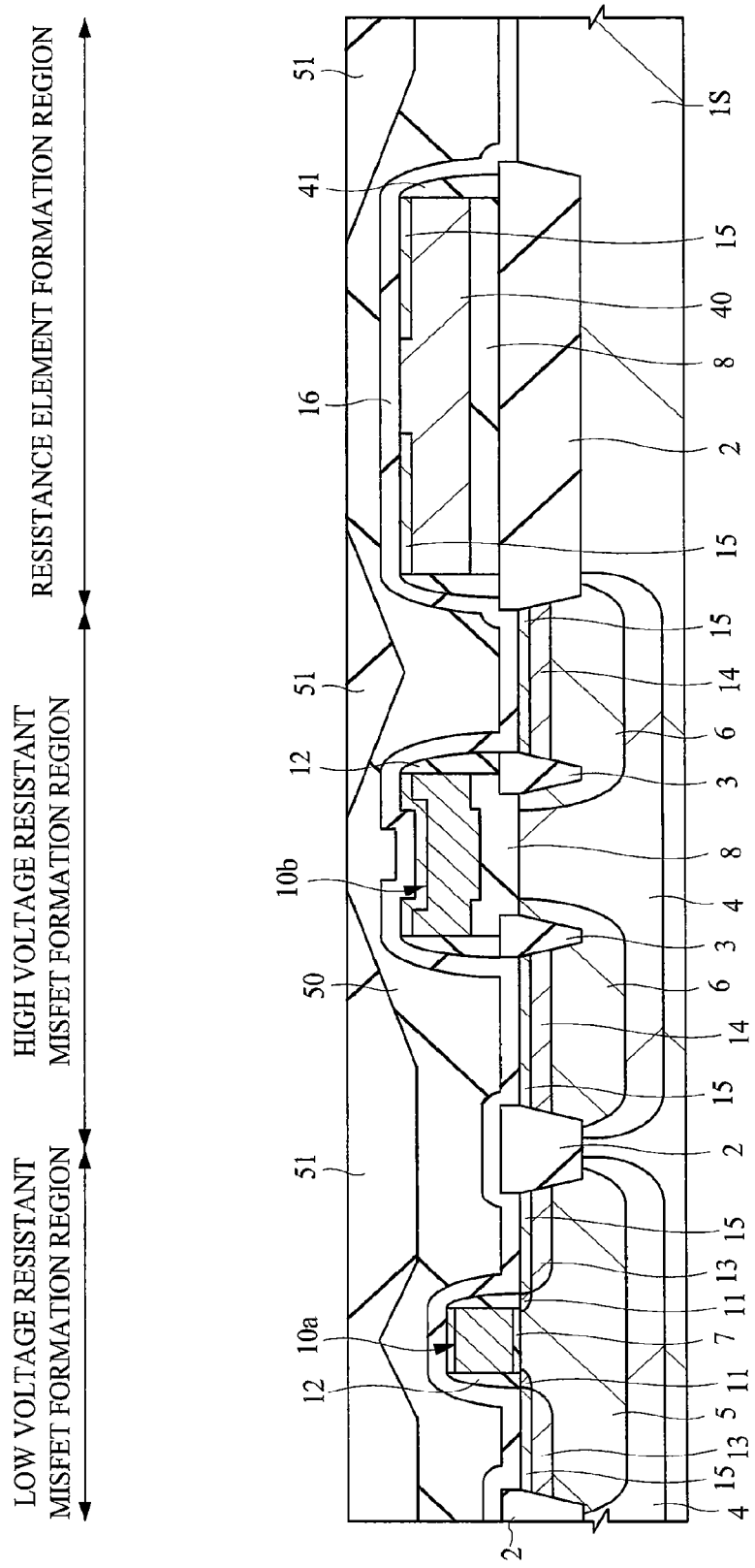
FIG. 41 is a cross sectional view showing a step of manufacturing the semiconductor device continued from FIG. 40.

Subsequently, as shown in FIG. 41, the surface of the silicon oxide film 51 is planarized. In order to planarize the surface of the silicon oxide film 51, for example, the surface of the silicon oxide film 51 is polished by the chemical mechanical polishing (CMP). In this process, there is a possibility that the film thickness of the silicon oxide film 51 is made thin due to unevenness of a polishing amount by the CMP and the like, and whereby the upper portion of the high voltage resistant MISFET and the upper portion of the resistance element may be exposed.

Figure 42:
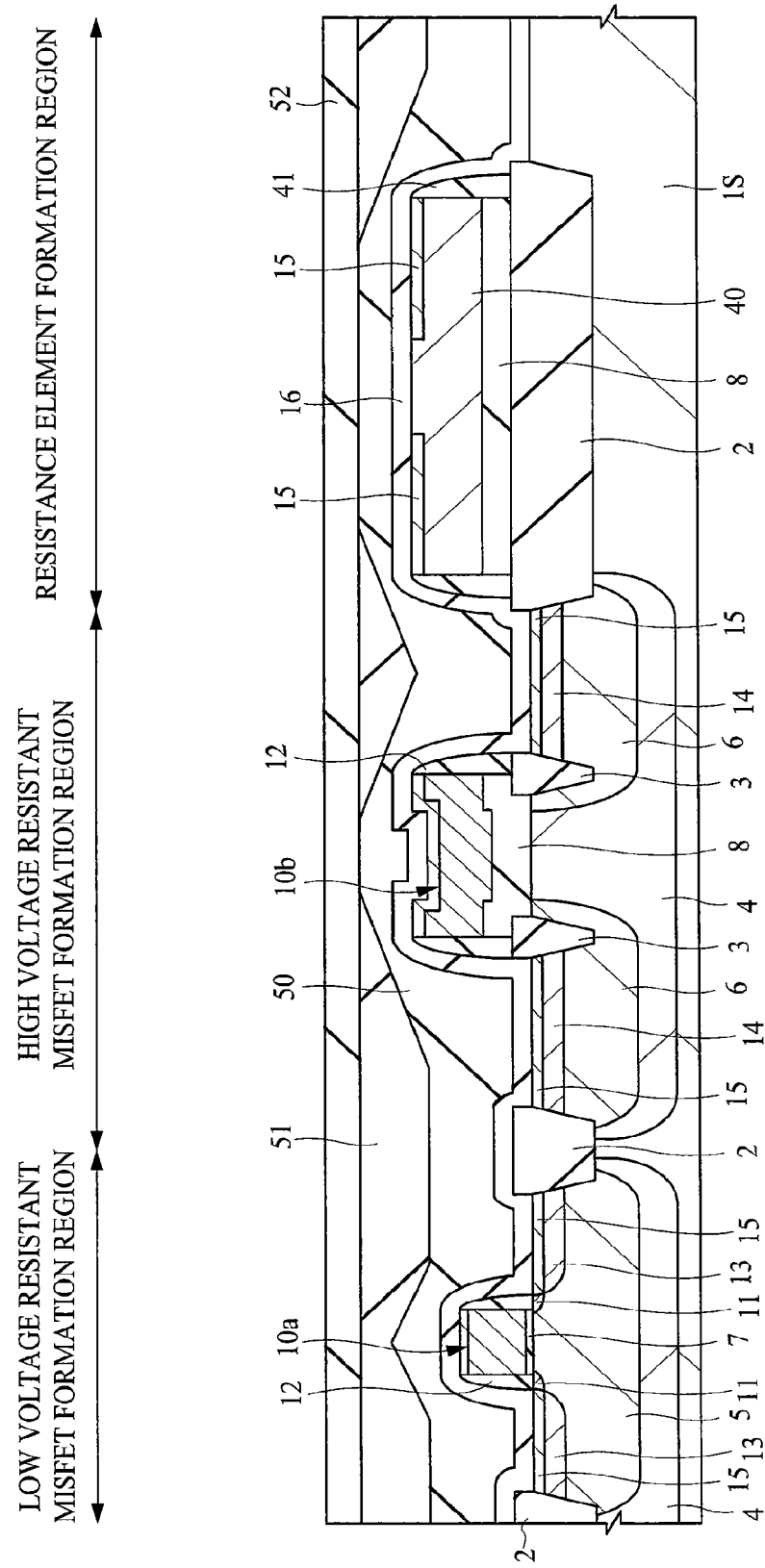
FIG. 42 is a cross sectional view showing a step of manufacturing the semiconductor device continued from FIG. 41.

Therefore, as shown in FIG. 42, a silicon oxide film (cap insulation film) 52 is formed on the planarized silicon oxide film 51. This silicon oxide film 52 may be formed in the same manner as for the silicon oxide film 51, by use of the normal plasma CVD method using TEOS as raw material.

Figure 43:
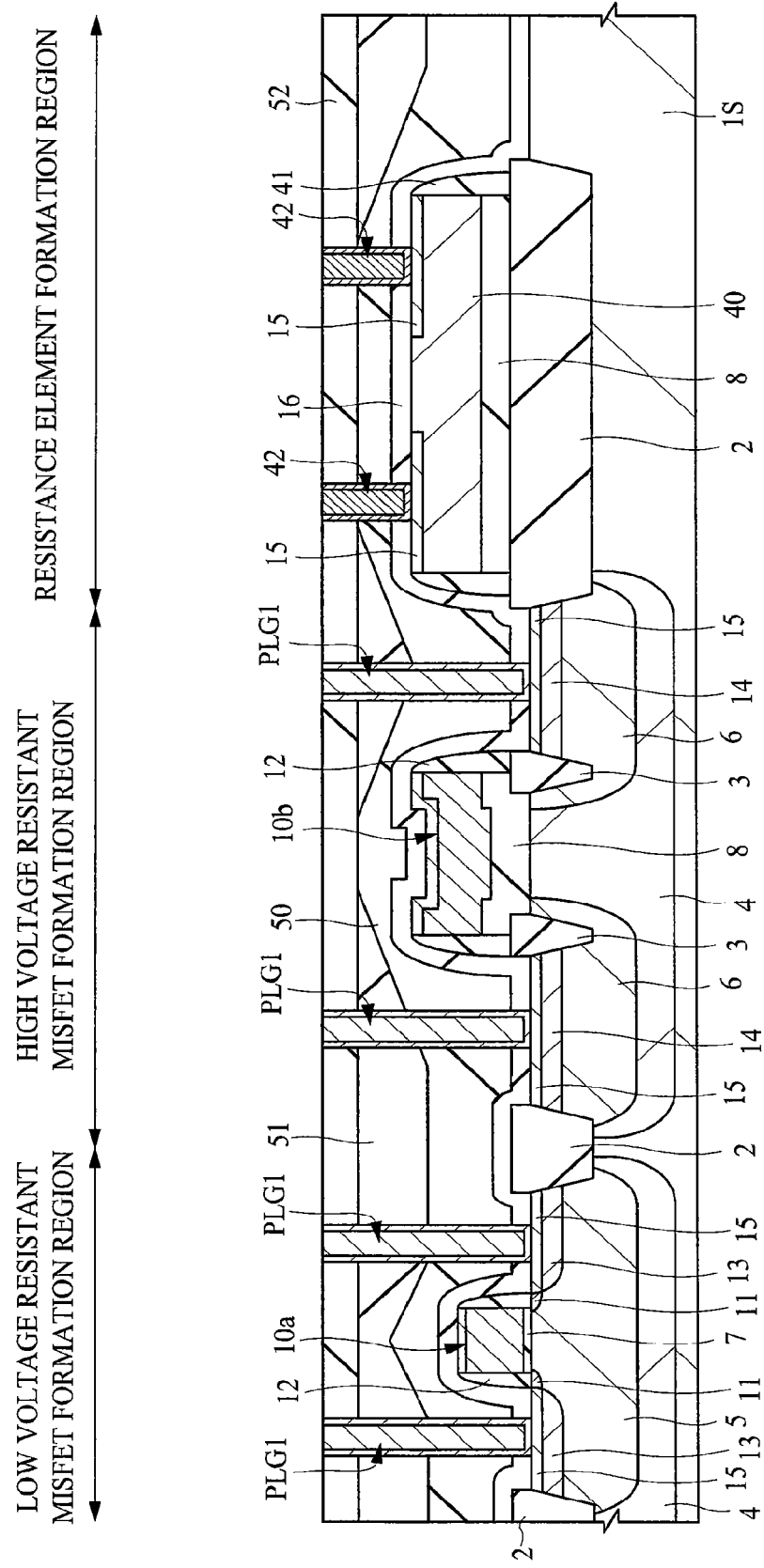
FIG. 43 is a cross sectional view showing a step of manufacturing the semiconductor device continued from FIG. 42.

Subsequently, as shown in FIG. 43, by use of the photolithography technique and the etching technique, contact holes are formed in the interlayer insulation films (silicon oxide film 52, silicon oxide film 51, silicon oxide film 50 and silicon nitride film 16). The contact holes penetrate the interlayer insulation films and reach the semiconductor substrate 1S.

A titanium/titanium nitride film is formed on the interlayer insulation film including the bottom surface and the inside wall of the contact hole. The titanium/titanium nitride film is configured with a stacked film of the titanium film and the titanium nitride film, and may be formed, for example, by use of the sputtering method. Thereafter, a tungsten film is formed over an entire surface of the main surface of the semiconductor substrate 1S to fill up the contact holes. This tungsten film may be formed, for example, by use of the CVD method.

Next, an unnecessary titanium/titanium nitride film and tungsten film formed on the interlayer insulation film are removed, for example, by the CMP method, so that the titanium/titanium nitride film and the tungsten film are left only in the contact holes, and whereby plugs PLG1 and plugs 42 can be formed.

Figure 44:
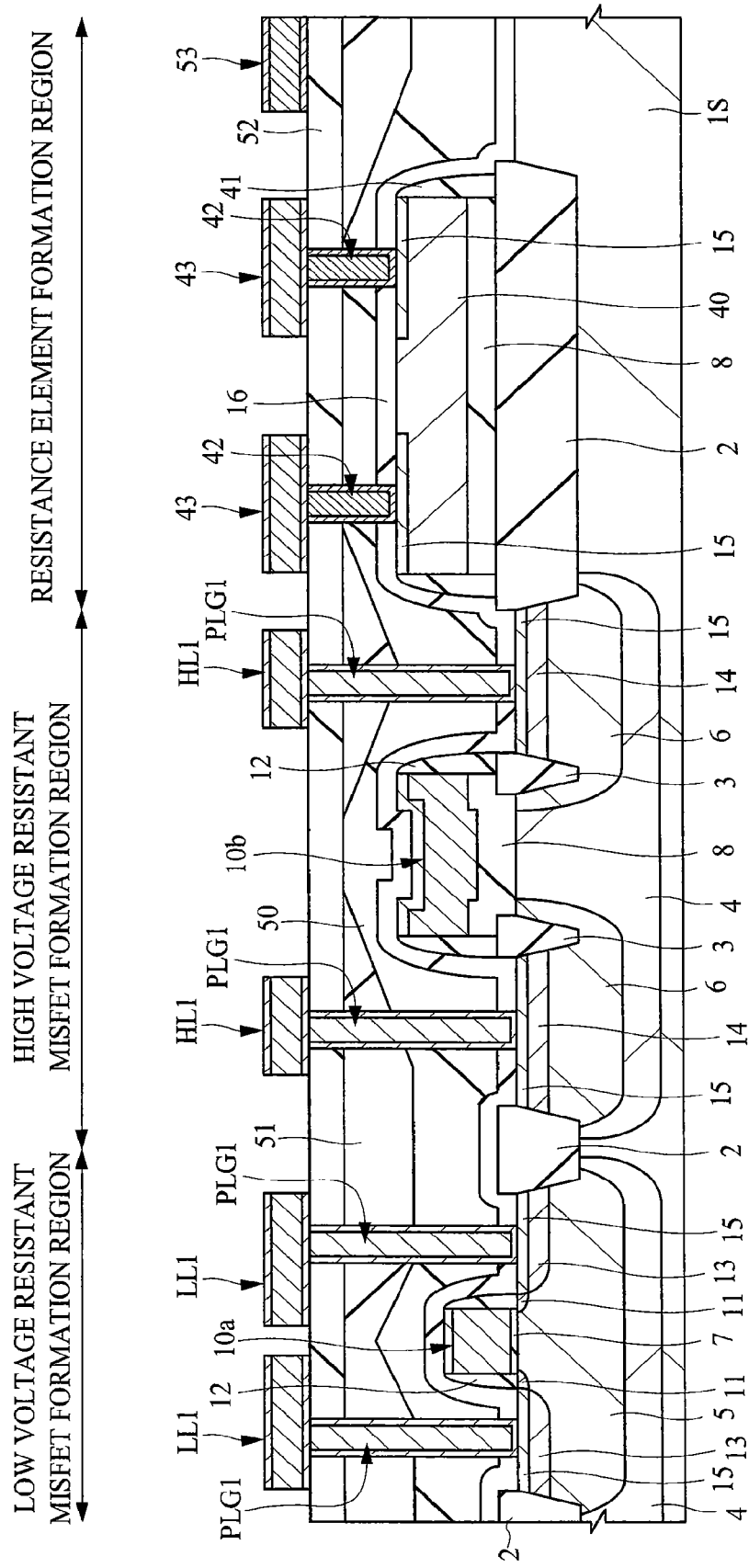
FIG. 44 is a cross sectional view showing a step of manufacturing the semiconductor device continued from FIG. 43.

Next, as shown in FIG. 44, a titanium/titanium nitride film, an aluminum film containing copper, a titanium/titanium nitride film are formed sequentially on the silicon oxide film 52 and the plugs PLG1. These films may be formed, for example, by use of the sputtering method. Subsequently, these films are patterned by use of the photolithography technique and the etching technique, and whereby wires HL1, wires LL1, wires 43 and wires 53 are formed. In this manner, it is possible to form the wires HL1, the wires LL1, the wires 43 and the wires 53 on the interlayer insulation film of the first layer.

Also in the fifth embodiment, as with the first embodiment, the wires HL1 formed on the interlayer insulation film of the first layer and the gate electrode 10b are arranged not to be overlapped planarly. With this structure, since the wires HL1 are not formed immediately over the gate electrode 10b of the high voltage resistant MISFET, it is possible to keep the distance between the wires HL1 and the gate electrode 10b away even if the interlayer insulation film of the first layer is made thin. For this reason, it is possible to secure the voltage resistance between the gate electrode 10b of the high voltage resistant MISFET and the wires HL1 to become the source wire or the drain wire.

On the other hand, in the resistance element formation area, the wire 43 electrically connected directly to the polysilicon film 40 to become the resistance element via the plug 42 is formed so as to be overlapped with the polysilicon film 40 planarly. However, among the wire 43 and the wire 53 formed over the polysilicon film 40 to become the resistance element, the wire 53, which is not connected directly to the polysilicon film 40 via the plug 42 and to which an electric potential different from that of the polysilicon film 40 is applied, is arranged not to be overlapped with the polysilicon film 40 planarly, so that it is possible to secure the voltage resistance between the polysilicon film 40 and the wire 53 even if the interlayer insulation film is made thin.

In the foregoing, the invention made by the inventors of the present invention has been concretely described based on the embodiments. However, it is needless to say that the present invention is not limited to the foregoing embodiments and various modifications and alterations can be made within the scope of the present invention.

In the above-mentioned embodiments, the example in which an n-channel type MISFET is used as the low voltage resistance MISFET and the high voltage resistant MISFET formed on the LCD driver, however, the technological ideas of the present embodiments may be also applied to a case when a p-channel type MISFET is used as the low voltage resistant MISFET and the high voltage resistant MISFET.

The present invention may be applied widely to the manufacturing industry to manufacture semiconductor devices.

What is claimed is:

1. A method for manufacturing a semiconductor device, comprising steps of:
   (a) forming a gate insulation film over a semiconductor substrate;
   (b) forming a gate electrode over the gate insulation film;
   (c) forming a source region and a drain region in the semiconductor substrate so as to align with the gate electrode;
   (d) forming a first insulation film over the gate electrode, the source region and the drain region;
   (e) forming a first plug and a second plug in the first insulating film, wherein the first plug is electrically connected to the source region and the second plug is electrically connected to the drain region;
   (f) forming a first wire and a second wire over the first insulation film, wherein the first wire is electrically connected to the first plug and the second wire is electrically connected to the second plug;
   (g) forming a second insulation film over the first insulating film, the first wire and the second wire;
   (h) forming a third plug and a fourth plug in the second insulation film, wherein the third plug is electrically connected to the first wire and the fourth plug is electrically connected to the second wire; and
   (i) forming a third wire and a fourth wire over the second insulation film, wherein the third wire is electrically connected to the third plug and the third fourth is electrically connected to the fourth plug,
   wherein the gate electrode and the first wire are arranged so as to not be overlapped with each other in a planar view,
   wherein the gate electrode and the second wire are arranged not to be overlapped with each other in a planar view,
   wherein the gate electrode and an edge of the third wire are arranged to be overlapped with each other in a planar view, and
   wherein the gate electrode and an edge of the fourth wire are arranged to be overlapped with each other in a planar view.

2. The method for manufacturing a semiconductor device according to the claim 1,
wherein a width of the first wire is smaller than that of the third wire and a width of the second wire is smaller than that of the fourth wire, in a gate length direction.

3. The method for manufacturing a semiconductor device according to the claim 1,
wherein electric field relaxing insulation regions are formed in the source region and the drain region.

4. The method for manufacturing a semiconductor device according to the claim 3,
wherein both end portions of the gate electrode extend onto the electric field relaxing insulation regions in a planar view.

5. The method for manufacturing a semiconductor device according to the claim 4,
wherein the electric field relaxing insulation regions protrude from the semiconductor substrate.

6. The method for manufacturing a semiconductor device according to the claim 5,
wherein each of the electric field relaxing insulation regions is formed by embedding an insulation material into a trench formed in the semiconductor substrate.

7. The method for manufacturing a semiconductor device according to the claim 5,
wherein each of the electric field relaxing insulation regions is formed by a selective oxidation method.

8. The method for manufacturing a semiconductor device according to the claim 1,
wherein a fifth wire electrically connected to the gate electrode is formed at the same layer as the first wire and the second wire.

9. The method for manufacturing a semiconductor device according to the claim 8,
wherein the fifth wire has a region overlapped with the gate electrode in a planar view.

10. The method for manufacturing a semiconductor device according to the claim 1,
wherein the first wire and the second wire are formed at the lowest wire layer.

11. A method for manufacturing a semiconductor device, comprising steps of:
(a) forming a gate insulation film over a semiconductor substrate;
(b) forming a gate electrode over the gate insulation film;
(c) forming an impurity diffusion region in the semiconductor substrate so as to align with the gate electrode;
(d) forming a first insulation film over the gate electrode and the impurity diffusion region;
(e) forming a first plug in the first insulating film, wherein the first plug is electrically connected to the impurity diffusion region;
(f) forming a first wire over the first insulation film, wherein the first wire is electrically connected to the first plug;
(g) forming a second insulation film over the first insulating film and the first wire;
(h) forming a second plug in the second insulation film, wherein the second plug is electrically connected to the first wire; and
(i) forming a second wire over the second insulation film, wherein the second wire is electrically connected to the third plug,
wherein the gate electrode and the first wire are arranged so as to not be overlapped with each other in a planar view,
wherein the gate electrode and an edge of the second wire are arranged to be overlapped with each other in a planar view,
wherein an electric field relaxing insulation region is formed in the impurity diffusion region, and
wherein an end portion of the gate electrode extends onto the electric field relaxing insulation region.

12. The method for manufacturing a semiconductor device according to the claim 11,
wherein a width of the first wire is smaller than that of the second wire in a gate length direction.

13. The method for manufacturing a semiconductor device according to the claim 11,
wherein the electric field relaxing insulation region protrudes from the semiconductor substrate.

14. The method for manufacturing a semiconductor device according to the claim 13,
wherein the electric field relaxing insulation region is formed by embedding an insulation material into a trench formed in the semiconductor substrate.

15. The method for manufacturing a semiconductor device according to the claim 13,
wherein the electric field relaxing insulation region is formed by a selective oxidation method.

16. The method for manufacturing a semiconductor device according to the claim 11,
wherein the first wire is formed at the lowest wire layer.

* * * * *